(12) United States Patent
Yoo et al.

(10) Patent No.: US 9,076,879 B2
(45) Date of Patent: Jul. 7, 2015

(54) THREE-DIMENSIONAL SEMICONDUCTOR MEMORY DEVICE AND METHOD FOR FABRICATING THE SAME

(71) Applicant: Samsung Electronics Co., Ltd., Suwon-si, Gyeonggi-do (KR)

(72) Inventors: Dongchul Yoo, Seongnam-si (KR); Phil Ouk Nam, Seongnam-si (KR); Junkyu Yang, Seoul (KR); Woong Lee, Seoul (KR); Woosung Lee, Yongin-si (KR); JinGyun Kim, Suwon-si (KR); Daehong Eom, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/974,122

(22) Filed: Aug. 23, 2013

(65) Prior Publication Data

US 2014/0070302 A1  Mar. 13, 2014

(30) Foreign Application Priority Data

Sep. 11, 2012 (KR) .......................... 10-2012-0100516
Feb. 6, 2013 (KR) .......................... 10-2013-0013509
Feb. 6, 2013 (KR) .......................... 10-2013-0013510

(51) Int. Cl.
*H01L 29/792* (2006.01)
*H01L 27/115* (2006.01)

(52) U.S. Cl.
CPC ........ *H01L 29/7926* (2013.01); *H01L 27/1157* (2013.01); *H01L 27/11582* (2013.01)

(58) Field of Classification Search
CPC ............ H01L 27/1157; H01L 27/1158; H01L 27/11582
USPC .......................................................... 257/326
See application file for complete search history.

(56) References Cited

U.S. PATENT DOCUMENTS

| 5,308,778 | A  | * | 5/1994 | Fitch et al. .................... 438/128 |
| 7,592,262 | B2 |   | 9/2009 | Huang et al. |
| 7,956,408 | B2 |   | 6/2011 | Enda et al. |
| 8,030,700 | B2 |   | 10/2011 | Sakamoto |
| 8,072,024 | B2 |   | 12/2011 | Ishikawa et al. |
| 8,084,805 | B2 |   | 12/2011 | Shim et al. |
| 8,415,242 | B2 |   | 4/2013 | Mizushima et al. |
| 8,426,976 | B2 |   | 4/2013 | Ishiduki et al. |
| 2011/0090737 | A1 | | 4/2011 | Yoo et al. |
| 2011/0298037 | A1 | | 12/2011 | Choe et al. |

(Continued)

FOREIGN PATENT DOCUMENTS

KR  10 2010-0024096 A  3/2010
KR  10 2010-0028827 A  3/2010

(Continued)

*Primary Examiner* — Daniel Shook
(74) *Attorney, Agent, or Firm* — Lee & Morse, P.C.

(57) ABSTRACT

A three-dimensional (3D) semiconductor memory device and a method for fabricating the same, the device including insulating layers stacked on a substrate; horizontal structures between the insulating layers, the horizontal structures including gate electrodes, respectively; vertical structures penetrating the insulating layers and the horizontal structures, the vertical structures including semiconductor pillars, respectively; and epitaxial patterns, each of the epitaxial patterns being between the substrate and each of the vertical structures, wherein a minimum width of the epitaxial pattern is less than a width of a corresponding one of the vertical structures.

25 Claims, 51 Drawing Sheets

(56) References Cited

U.S. PATENT DOCUMENTS

| | | |
|---|---|---|
| 2012/0052674 A1 | 3/2012 | Lee et al. |
| 2012/0098051 A1 | 4/2012 | Son et al. |
| 2012/0098139 A1 | 4/2012 | Chae et al. |
| 2012/0120728 A1 | 5/2012 | Kim et al. |
| 2012/0140562 A1 | 6/2012 | Choe et al. |
| 2012/0161094 A1 | 6/2012 | Huo et al. |
| 2013/0134493 A1* | 5/2013 | Eom et al. ............ 257/314 |

FOREIGN PATENT DOCUMENTS

| | | |
|---|---|---|
| KR | 10 2010-0034612 A | 4/2010 |
| KR | 10 2010-0133212 A | 12/2010 |
| KR | 10 2011-0108770 A | 10/2011 |
| KR | 10 2011-0120654 A | 11/2011 |
| KR | 10-2011-0121938 A | 11/2011 |

* cited by examiner

THREE-DIMENSIONAL SEMICONDUCTOR MEMORY DEVICE AND METHOD FOR FABRICATING THE SAME

CROSS-REFERENCE TO RELATED APPLICATION

Korean Patent Application No. 10-2012-0100516, filed on Sep. 11, 2012, in the Korean Intellectual Property Office, and entitled: "Three-Dimensional Semiconductor Memory Device and Method For Fabricating the Same," Korean Patent Application No. 10-2013-0013509, filed on Feb. 6, 2013, in the Korean Intellectual Property Office, and entitled: "Three-Dimensional Semiconductor Memory Device and Method For Fabricating the Same," and Korean Patent Application No. 10-2013-0013510, filed on Feb. 6, 2013, in the Korean Intellectual Property Office, and entitled: "Three-Dimensional Semiconductor Memory Device and Method For Fabricating the Same," are incorporated by reference herein in their entirety.

BACKGROUND

1. Field

Embodiments relate to three-dimensional semiconductor memory devices including vertically stacked memory cells and methods for fabricating the same.

2. Description of the Related Art

Semiconductor devices may become more highly integrated to meet the requirements (e.g., high performance and low costs) of customers. An integration density of the semiconductor memory devices may directly affect the costs of the semiconductor memory devices. Thus, highly integrated semiconductor memory devices may be desirable. The integration density of conventional two-dimensional (2D) or planar semiconductor memory devices may be mostly influenced by a planar area in which a unit memory cell occupies. Thus, the integration density may be influenced by a level of fine pattern forming technology. However, pattern fineness may be limited due to high cost equipment and/or difficulties in semiconductor fabrication processes.

SUMMARY

Embodiments are directed to three-dimensional semiconductor memory devices including vertically stacked memory cells and methods for fabricating the same.

The embodiments may also be realized by providing a three-dimensional (3D) semiconductor memory device including insulating layers stacked on a substrate; horizontal structures between the insulating layers, the horizontal structures including gate electrodes, respectively; vertical structures penetrating the insulating layers and the horizontal structures, the vertical structures including semiconductor pillars, respectively; and epitaxial patterns, each of the epitaxial patterns being between the substrate and each of the vertical structures, wherein a minimum width of the epitaxial pattern is less than a width of a corresponding one of the vertical structures.

A lowermost one of the horizontal structures is in contact with the epitaxial patterns; each of the epitaxial patterns has a recessed sidewall; and the lowermost horizontal structure has a convex portion along the recessed sidewall of each of the epitaxial patterns.

Each of the epitaxial patterns has a laterally recessed sidewall.

A lowermost one of the horizontal structures is thicker than others of the horizontal structures; and top surfaces of the epitaxial patterns are higher than a top surface of the lowermost horizontal structure.

Thicknesses of the horizontal structures are substantially equal to each other; and the epitaxial patterns are in contact with at least two vertically adjacent horizontal structures that are closest to the substrate.

Each of the horizontal structures further includes first and second blocking insulating layers between each of the gate electrode and the semiconductor pillars; and the first and second blocking insulating layers each include at least one of a silicon oxide layer and an aluminum oxide layer.

Each of the vertical structures further includes a protecting layer, a charge storage layer, and a tunnel insulating layer; and horizontal structures adjacent to the vertical structures are in contact with each charge storage layers of the vertical structures.

The embodiments may be realized by providing a method for fabricating a three-dimensional (3D) semiconductor memory device, the method including forming a mold stack structure including insulating layers and sacrificial layers alternately and repeatedly stacked on a substrate; forming through-holes penetrating the mold stack structure, the through-holes exposing the substrate; forming an epitaxial layer in each of the through-holes; forming a vertical structure in each of the through-holes such that the vertical structure includes a semiconductor pillar; patterning the mold stack structure to form a trench; removing the sacrificial layers exposed by the trench to form recess regions; etching the epitaxial layer exposed by at least a lowermost one of the recess regions to form an epitaxial pattern having a recessed sidewall; and forming horizontal structures in the recess regions, respectively, such that each of the horizontal structures includes a gate electrode, wherein at least one of the horizontal structures is in contact with the epitaxial pattern.

Forming the epitaxial layer includes performing a selective epitaxial growth process using the substrate exposed by the through-holes as a seed; and wherein a top surface of the epitaxial layer is higher than a top surface of a lowermost one of the horizontal structures.

Forming the vertical structure includes sequentially forming a protecting layer, a charge storage layer, and a tunnel insulating layer in each of the through-holes; and forming the semiconductor pillar on the tunnel insulating layer in each of the through-holes.

The method may further include selectively removing the protecting layer exposed by the recess regions to expose the charge storage layer after forming the recess regions.

Selectively removing the protecting layer and etching the epitaxial layer are performed by a same etching process at a same time.

One of the sacrificial layers that contacts the epitaxial layer is formed of a material having an etch selectivity with respect to others of the sacrificial layers; and removing the sacrificial layers, selectively removing the protecting layer, and etching the epitaxial layer are performed by a same etching process.

A distance between portions of the gate electrode respectively adjacent to both recessed sidewalls of the epitaxial pattern is less than a width of the vertical structure.

Each vertical structure further includes a charge storage layer and a tunnel insulating layer; and each of the horizontal structures further includes a blocking insulating layer.

The embodiments may also be realized by providing a three-dimensional (3D) semiconductor memory device including a lower structure including a lower gate pattern and a lower semiconductor pattern penetrating the lower gate pattern, the lower semiconductor pattern being connected to a substrate; and an upper structure including upper gate patterns stacked on the lower structure, an upper semiconductor pattern penetrating the upper gate patterns, and a vertical insulator between the upper semiconductor pattern and the upper gate patterns, the upper semiconductor pattern being connected to the lower semiconductor pattern, wherein the lower semiconductor pattern has a recessed region adjacent to the lower gate pattern; and the recessed region of the lower semiconductor pattern is defined by incline-surfaces inclined with respect to a top surface of the substrate.

A minimum width of the lower semiconductor pattern is less than a lower width of the upper semiconductor pattern.

A maximum width of the lower semiconductor pattern is greater than a maximum width of the upper semiconductor pattern.

A vertical thickness of the lower gate pattern is less than a maximum width of the lower semiconductor pattern.

The lower structure includes a plurality of lower gate patterns stacked on the substrate and an insulating layer between the lower gate patterns; a horizontal section of the lower semiconductor pattern adjacent to the insulating layer has a substantially circular shape; and a horizontal section of the lower semiconductor pattern at the recessed region has a substantially quadrilateral shape.

A minimum width of the lower semiconductor pattern is about equal to a difference between a maximum width of the lower semiconductor pattern and a vertical thickness of the lower gate pattern.

The lower semiconductor pattern is formed of silicon; and the incline-surfaces are {111} crystal planes of the silicon.

A horizontal width of the lower gate pattern is greater than a horizontal width of each of the upper gate patterns.

The 3D semiconductor memory device may further include a horizontal insulator between the lower gate pattern and the lower semiconductor pattern and between the vertical insulator and each of the upper gate patterns, wherein the horizontal insulator between the lower gate pattern and the lower semiconductor pattern extends onto a top surface and a bottom surface of the lower gate pattern; and the horizontal insulator between the vertical insulator and each of the upper gate patterns extends onto a top surface and a bottom surface of each of the upper gate patterns.

The embodiments may also be realized by providing a method for fabricating a three-dimensional (3D) semiconductor memory device, the method including forming a multi-layered structure including sacrificial layers and insulating layers alternately and repeatedly stacked on a substrate; forming an opening penetrating the multi-layered structure such that the opening exposes the substrate; forming a lower semiconductor layer filling a lower region of the opening; forming a vertical insulator and an upper semiconductor pattern in the opening having the lower semiconductor layer; patterning the multi-layered structure to form trenches exposing the substrate such that the trenches are spaced apart from the opening; removing the sacrificial layers exposed by the trenches to form gate regions; selectively etching the lower semiconductor layer exposed by at least a lowermost one of the gate regions to form a lower semiconductor pattern having a recessed region defined by incline-surfaces inclined with respect to a top surface of the substrate; and forming gate patterns in the gate regions, respectively.

Forming the lower semiconductor layer includes performing a selective epitaxial growth process using the substrate exposed by the opening as a seed.

Selectively etching the lower semiconductor layer includes performing a gas phase etching process or a chemical dry etching process using a reaction gas containing a halogen element.

A maximum width of the lower semiconductor pattern is greater than a maximum width of the upper semiconductor pattern.

A minimum width of the lower semiconductor pattern is less than a lower width of the upper semiconductor pattern.

The embodiments may also be realized by providing a three-dimensional (3D) semiconductor memory device including a stack structure including insulating layers vertically stacked on a substrate, and a lower gate pattern between the insulating layers; and a lower semiconductor pattern penetrating the lower gate pattern and being connected to the substrate, the lower semiconductor pattern having a recessed region defined by incline-surfaces inclined with respect to a top surface of the substrate, and the recessed region being adjacent to the lower gate pattern, wherein a maximum width of the recessed region in a direction vertical to the top surface of the substrate is less than a vertical distance between adjacent insulating layers.

The vertical distance between the adjacent insulating layers is less than a maximum width of the lower semiconductor pattern.

A horizontal section of the lower semiconductor pattern adjacent to each of the insulating layers has a substantially circular shape; and a horizontal section of the lower semiconductor pattern at the recessed region has a substantially quadrilateral shape.

The lower semiconductor pattern is formed of silicon; and the incline-surfaces are {111} crystal planes of the silicon.

The 3D semiconductor memory device may further include a horizontal insulator between the lower gate pattern and the lower semiconductor pattern, the horizontal insulator extending onto a top surface and a bottom surface of the lower gate pattern.

The 3D semiconductor memory device may further include upper gate patterns stacked on the lower gate pattern; an upper semiconductor pattern penetrating the upper gate patterns and being connected to the lower semiconductor pattern; and a vertical insulator between the upper semiconductor pattern and the upper gate patterns.

A minimum width of the lower semiconductor pattern is less than a lower width of the upper semiconductor pattern.

A maximum width of the lower semiconductor pattern is greater than a maximum width of the upper semiconductor pattern.

A horizontal width of the lower gate pattern is greater than a horizontal width of each of the upper gate patterns.

The embodiments may also be realized by providing a method for fabricating a three-dimensional (3D) semiconductor memory device, the method including forming a lower structure including a lower semiconductor layer connected to a substrate and insulating layers stacked on the substrate such that the insulating layers define a lower gate region that expose a portion of a sidewall of the lower semiconductor layer; selectively etching the lower semiconductor layer exposed by the lower gate region to form a lower semiconductor pattern having a recessed region defined by incline-surfaces inclined with respect to a top surface of the substrate; isotropically etching the insulating layers exposed by the lower gate region to form an enlarged lower gate region exposing a portion of a sidewall of the lower semiconductor pattern that is vertical to the top surface of the substrate; and forming a gate pattern in the enlarged lower gate region.

A vertical height of the enlarged lower gate region is less than a maximum width of the lower semiconductor pattern.

Selectively etching the lower semiconductor layer exposed by the lower gate region includes performing a gas phase etching process or a chemical dry etching process using a reaction gas containing a halogen element.

The method may further include forming an upper structure on the lower structure before the lower semiconductor pattern is formed, wherein the upper structure includes an upper semiconductor pattern vertically connected to the lower semiconductor pattern; a vertical insulator surrounding an outer sidewall of the upper semiconductor pattern; and upper insulating layers vertically stacked on the lower structure and defining upper gate regions that expose portions of a sidewall of the vertical insulator.

A maximum width of the lower semiconductor pattern is greater than a maximum width of the upper semiconductor pattern.

A minimum width of the lower semiconductor pattern is less than a lower width of the upper semiconductor pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
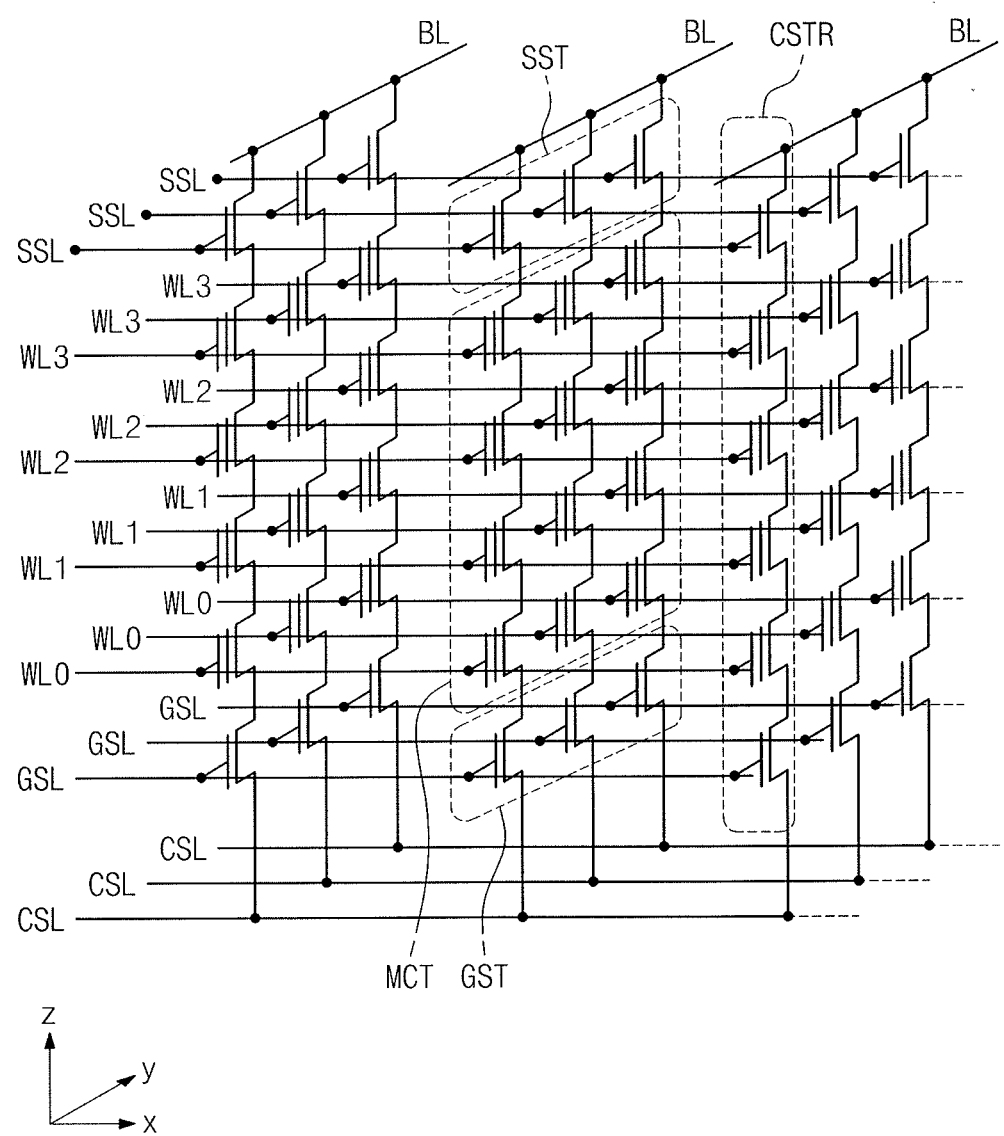
FIG. 1 illustrates a schematic circuit diagram of a cell array of a three-dimensional (3D) semiconductor memory device according to an embodiment.

The embodiments will now be described more fully hereinafter with reference to the accompanying drawings, in which exemplary embodiments are shown. The advantages and features of the embodiments and methods of achieving them will be apparent from the following exemplary embodiments that will be described in more detail with reference to the accompanying drawings. It should be noted, however, that the embodiments are not limited to the following exemplary embodiments, and may be implemented in various forms. Accordingly, the exemplary embodiments are provided only to disclose the embodiments and let those skilled in the art know the category of the embodiments. In the drawings, embodiments are not limited to the specific examples provided herein and may be exaggerated for clarity.

The terminology used herein is for the purpose of describing particular embodiments only and is not intended to limit the scope. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region, or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the embodiments.

It will be also understood that although the terms first, second, third, etc. may be used herein to describe various elements, these elements should not be limited by these terms. These terms are only used to distinguish one element from another element. Thus, a first element in some embodiments could be termed a second element in other embodiments without departing from the teachings of the embodiments. Exemplary embodiments explained and illustrated herein may include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle may, typically, have rounded or curved features. Thus, the regions illustrated in the figures are schematic in nature and their shapes are not intended to illustrate the actual shape of a region of a device and are not intended to limit the scope of example embodiments.

A three-dimensional (3D) semiconductor memory device according to an embodiment may include, e.g., a cell array region, a peripheral circuit region, and a connection region. Memory cells, bit lines, and word lines may be disposed in the cell array region. The bit lines and the word lines may be provided for electrical connection of the memory cells. Peripheral circuits for driving the memory cells and for sensing data in the memory cells may be provided in the peripheral circuit region. For example, a word line driver, a sense amplifier, a row decoder, a column decoder, and control circuits may be disposed in the peripheral circuit region. The connection region may be disposed between the cell array region and the peripheral circuit region. An interconnection structure electrically connecting the bit and word lines to the peripheral circuits may be disposed in the connection region.

FIG. 1 illustrates a schematic circuit diagram of a cell array of a three-dimensional (3D) semiconductor memory device according to an embodiment.

Referring to FIG. 1, a cell array of a 3D semiconductor memory device according to an embodiment may include a common source line CSL, a bit line BL, and a plurality of cell strings CSTR between the common source line CSL and the bit line BL.

The bit lines BL may be two-dimensionally arranged. A plurality of the cell strings CSTR may be connected in parallel to each of the bit lines BL. The cell strings CSTR may be connected in common to the common source line CSL. For example, a plurality of cell strings CSTR may be between the common source line CSL and the bit lines BL. In an embodiment, a plurality of the common source lines CSL may be two-dimensionally arranged. A constant voltage may be applied to the plurality of common source lines CSL. Alternatively, the plurality of common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT between the ground and string selection transistors GST and SST. The ground selection transistor GST, the plurality of memory cell transistors MCT, and the string selection transistor SST may be connected in series to each other in each of the cell strings CSTR.

The common source line CSL may be connected in common to sources of the ground selection transistors GST. A ground selection line GSL, a plurality of word lines WL0 to WL3, and a string selection line SSL (which are disposed between the common source line CSL and the bit line BL) may be used as gate electrodes of the ground selection transistor GST, the memory cell transistors MCT, and the string selection transistor SST, respectively. Each of the memory cell transistors MCT may include a memory element.

Figure 2:
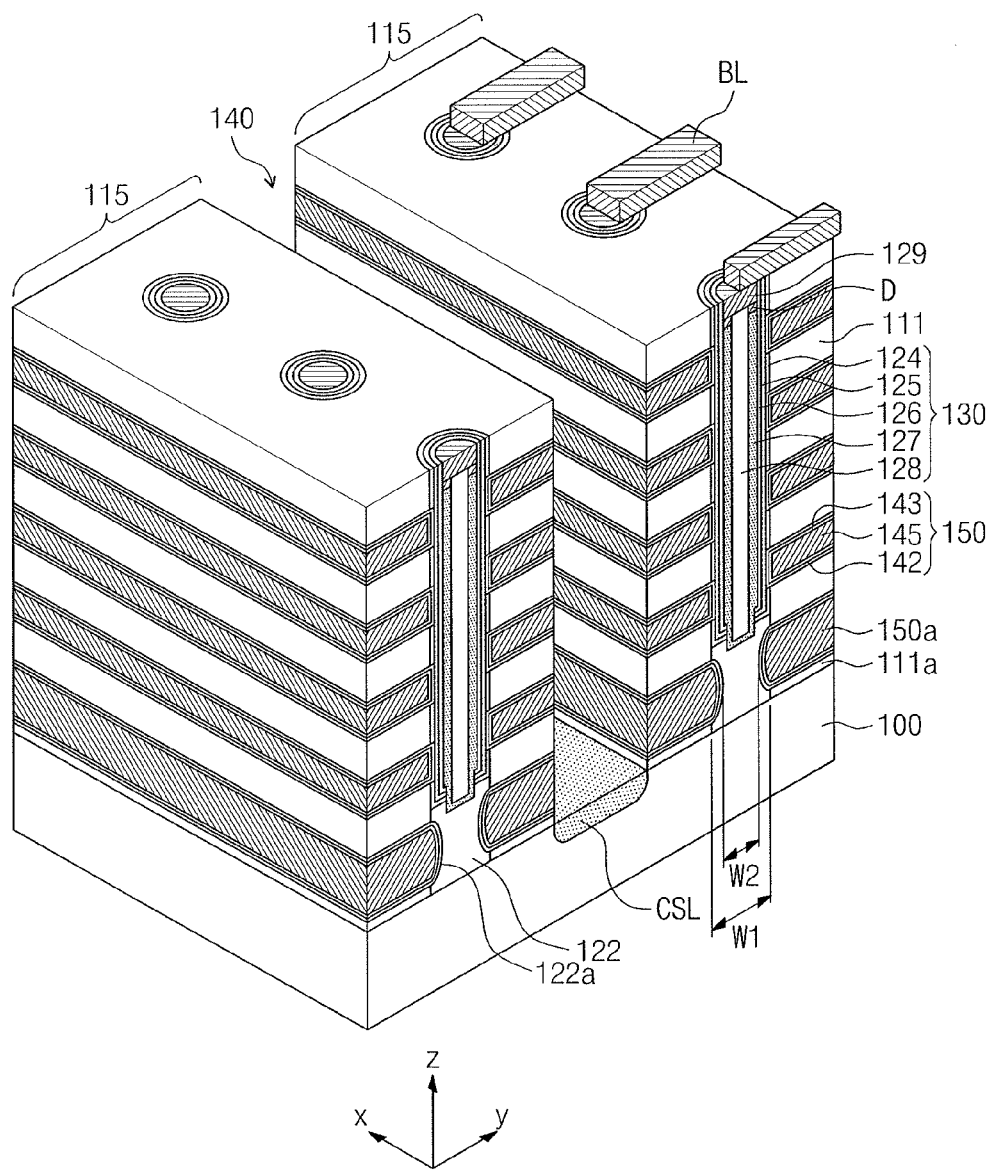
FIG. 2 illustrates a perspective view illustrating a 3D semiconductor memory device according to an embodiment.

FIG. 2 illustrates a perspective view of a 3D semiconductor memory device according to an embodiment.

Referring to FIG. 2, an electrode structure 115 may be disposed on a substrate 100. The electrode structure 115 may include insulating layers 111a and 111 and horizontal structures 150a and 150 that are alternately and repeatedly stacked on the substrate 100. The insulating layers 111a and 111 and the horizontal structures 150a and 150 may extend in a first direction. The insulating layers 111a and 111 may be, e.g., silicon oxide layers. A lowermost one 111a of the insulating layers 111a and 111 may be thinner than others 111 of the insulating layers 111a and 111. Each of the horizontal structures 150a and 150 may include first and second blocking insulating layers 142 and 143 and a gate electrode 145. The electrode structure 115 may include a plurality of electrode structures 115 that face each other in a second direction crossing the first direction. The first and second directions may correspond to an x-axis direction and a y-axis direction of FIG. 2, respectively. A trench 140 may be defined between the adjacent electrode structures 115. The trench 140 may extend in the first direction. A common source line CSL may be disposed in the substrate 100 exposed by the trench 140. The common source lines CSL may be a dopant region that is heavily doped with dopants. Even though not illustrated in FIG. 2, an isolation insulating layer may fill the trench 140.

Vertical structures 130 may penetrate the electrode structures 115. In an embodiment, the vertical structures 130 may be arranged in matrix form along the first and second directions in a plan view. For example, the vertical structures 130 penetrating each of the electrode structures 115 may be arranged in a line along the first direction when viewed from a plan view. In another embodiment, the vertical structures penetrating each of the electrode structures 115 may be arranged in a zigzag form along the first direction when viewed from a plan view. Each of the vertical structures 130 may include a protecting layer 124, a charge storage layer 125, a tunnel insulating layer 126, and a semiconductor pillar 127. In an embodiment, the semiconductor pillar 127 may have a hollow tube-shape. In this case, a filling layer 128 may fill a hollow region of the semiconductor pillar 127. A drain region D may be disposed in an upper portion of the semiconductor pillar 127, and a conductive pattern 129 may be disposed on the drain region D. The conductive pattern 129 may be connected to a bit line BL. The bit line BL may extend in a direction crossing the horizontal structures 150a and 150, e.g., in the second direction. In an embodiment, the vertical structures 130 arranged in the second direction may be connected to one bit line BL.

The first and second blocking insulating layers 142 and 143 (in each of the horizontal structures 150a and 150) and the charge storage layer 125 and the tunnel insulating layer 126 (in each of the vertical structures 130) may be defined as a data storage element. For example, a portion of the data storage element may be included in the vertical structure 130, and a remaining portion of the data storage element may be included in the horizontal structure 150a or 150. According to an embodiment, the charge storage layer 125 and the tunnel insulating layer 126 of the data storage element may be included in the vertical structure 130, and the first and second blocking insulating layers 142 and 143 of the data storage element may be included in the horizontal structure 150a or 150.

An epitaxial pattern 122 may be disposed between the substrate 100 and each of the vertical structures 130. The epitaxial patterns 122 may connect the vertical structures 130 to the substrate 100. The epitaxial patterns 122 may be in contact with at least one floor or level of the horizontal structures. In other words, as will be apparent to a person of ordinary skill in the art from the foregoing description and from the drawings, as illustrated in FIG. 2, the epitaxial patterns 122 may be in contact with at least one of the horizontal structures 150 and 150a, e.g., a lowermost horizontal structure 150a. In another embodiment, the epitaxial patterns 122 may be in contact with a plurality of, e.g., two floors or levels of horizontal structures. In other words, as will be apparent to a person of ordinary skill in the art from the foregoing description and from the drawings, the epitaxial patterns 122 may be in contact with at least two of the horizontal structures 150 and 150a. This will be described with reference to FIG. 16 in more detail below. Meanwhile, if the epitaxial pattern 122 is in contact with the lowermost horizontal structure 150a, as illustrated in FIG. 2, the lowermost structure 150a may be thicker than the other horizontal structures 150. The lowermost horizontal structure 150a (contacting the epitaxial pattern 122) may correspond to the ground selection line GSL of the cell array in the 3D semiconductor memory device described with reference to FIG. 1. The horizontal structures 150 (contacting the vertical structure 130) may include the plurality of word lines WL0 to WL3 in FIG. 1.

Each of the epitaxial patterns 122 may have a recessed sidewall 122a. Thus, the lowermost horizontal structure 150a (contacting the epitaxial pattern 122) may be disposed along a profile of the recessed sidewall 122a of the epitaxial pattern 122. For example, the lowermost horizontal structure 150a may have a convex portion toward the recessed sidewall 122a of the epitaxial pattern 122. For example, the convex portion of the lowermost horizontal structure 150a may fill a recessed region defined by the recessed sidewall 122a of the epitaxial pattern 122. A minimum width W2 of the epitaxial pattern 122 may be less than a width W1 of the vertical structure 130. According to an embodiment, the epitaxial pattern 122 may have the laterally recessed sidewall 122a. Thus, a process margin may be secured in a process of forming the lowermost horizontal structure 150a that contacts the epitaxial pattern 122. As a result, the 3D semiconductor memory device with improved reliability may be realized.

Hereinafter, the 3D semiconductor memory devices and method for fabricating the same according to an embodiment will be described in more detail with reference to the drawings.

FIGS. 3 to 14 illustrate cross-sectional views of stages in a method for fabricating a 3D semiconductor memory device according to an embodiment.

Figure 3:
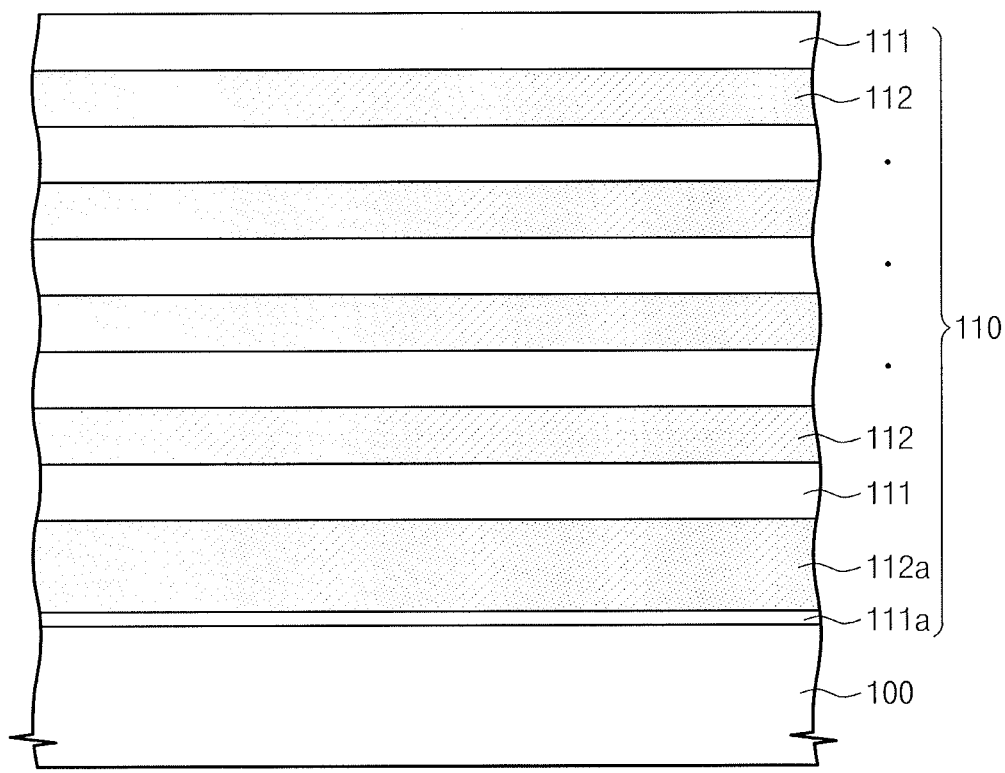
FIGS. 3 to 14 illustrate cross-sectional views of stages in a method for fabricating a 3D semiconductor memory device according to an embodiment.

Referring to FIG. 3, a mold stack structure 110 may be formed on a substrate 100. The substrate 100 may include at least one of materials having semiconductor properties, insulating materials, and a semiconductor or conductor covered by an insulating material. For example, the substrate 100 may be a silicon wafer. In an embodiment, dopants of a first conductivity type may be injected into the substrate 100 to form a well region (not shown).

The mold stack structure 110 may include a plurality of insulating layers 111a and 111 and a plurality of sacrificial layers 112a and 112. The insulating layers 111a and 111 and the sacrificial layers 112a and 112 may be alternately and repeatedly stacked on the substrate 100. The sacrificial layers 112a and 112 may be formed of a material having an etch selectivity with respect to the insulating layers 111a and 111. For example, when the sacrificial layers 112a and 112 are etched using a predetermined etch recipe, an each rate of the sacrificial layers 112a and 112 may be far greater than that of the insulating layers 111a and 111. Thus, etching of the insulating layers 111a and 111 may be minimized during the etching process of the sacrificial layers 112a and 112. Each of the insulating layers 111a and 111 may include at least one of a silicon oxide layer and a silicon nitride layer. Each of the sacrificial layers 112a and 112 may include at least one of a silicon layer, a silicon oxide layer, a silicon carbide layer, and a silicon nitride layer, and is different from the insulating layers 111a and 111. Hereinafter, the insulating layers 111a and 111 of silicon oxide layers and the sacrificial layers 112a and 111 of silicon nitride layers will be described as an example for the purpose of ease and convenience in explanation.

In an embodiment, at least one of the sacrificial layers 112a and 112 may have a thickness different from others of the sacrificial layers 112a and 112. For example, a lowermost one 112a of the sacrificial layers 112a and 112 may be thicker than the others 112 of the sacrificial layers 112a and 112. The lowermost sacrificial layer 112a may define a region in which the ground selection line GSL in FIG. 1 will be formed. At least one of the insulating layers 111a and 111 may have a thickness different from others of the insulating layers 111a and 111. For example, a lowermost one 111a of the insulating layers 111a and 111 may be thinner than the other insulating layers 111. However, the embodiments are not limited thereto. The thicknesses of the insulating layers 111a and 111 and the sacrificial layers 112a and 112 may be variously modified. Additionally, a number of the layers constituting the mold stack structure 110 may be variously modified. The insulating layers 111a and 111 and the sacrificial layers 112a and 112 may be formed by, e.g., a chemical vapor deposition (CVD) method. In another embodiment, the lowermost insulating layer 111a may be formed by a thermal oxidation process.

Figure 4:
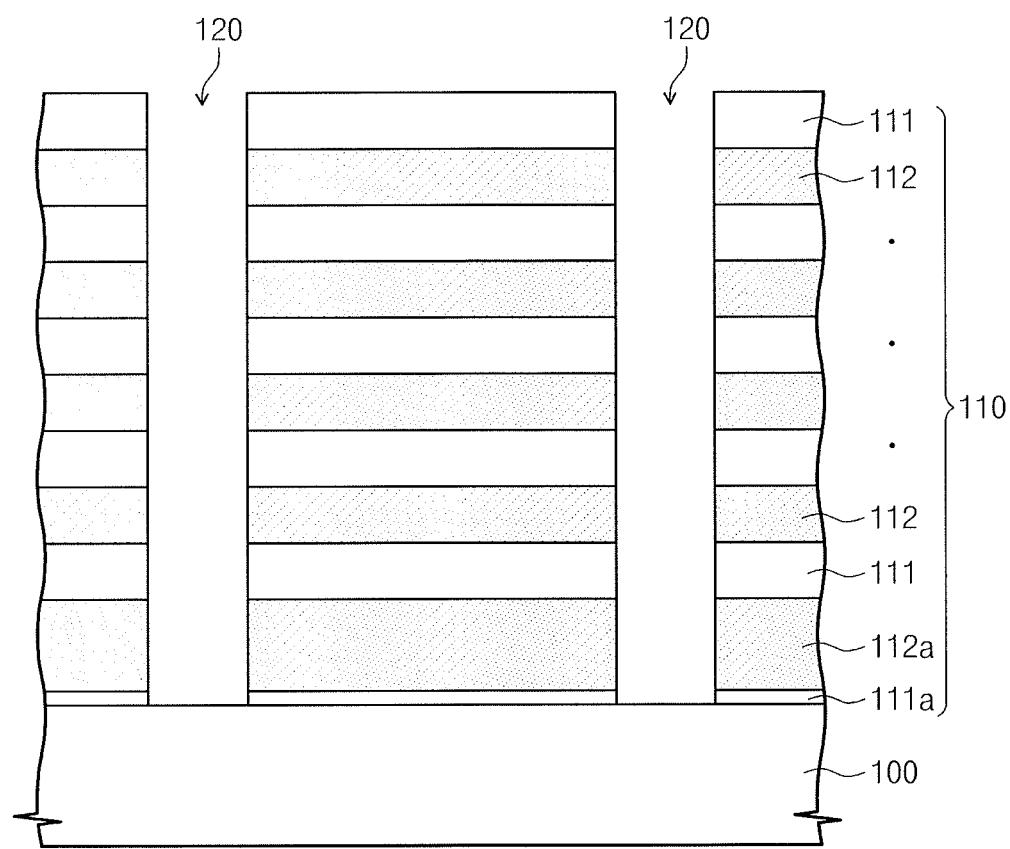

Referring to FIG. 4, through-holes 120 may be formed to penetrate the mold stack structure 110. The through-holes 120 may expose the substrate 100. For example, the insulating layers 111a and 111 and the sacrificial layers 112a and 112 may be anisotropically etched until a top surface of the substrate 100 is exposed, thereby forming the through-holes 120. Subsequently, the epitaxial patterns 122 and the vertical structures 130 of FIG. 2 may be formed in the through-holes 120. The through holes 120 may be arranged in matrix form along a first direction and a second direction in a plan view, like the vertical structures 130 of FIG. 2. Alternatively, the through-holes 120 may be arranged in a zigzag form along the first direction in a plan view. The first and second directions may correspond to the x-axis direction and the y axis direction of FIG. 2, respectively.

Figure 5:
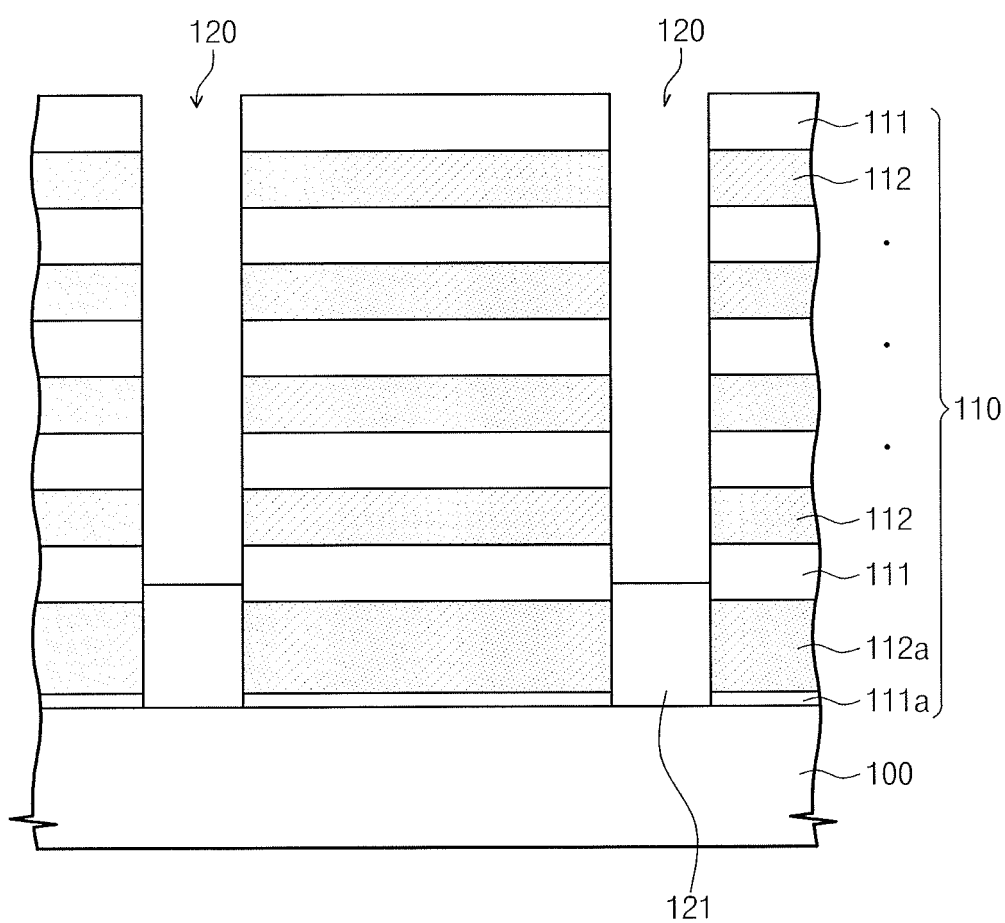

Referring to FIG. 5, an epitaxial layer 121 may be formed to partially fill each of the through-holes 120. The epitaxial layer 121 may be formed by a selective epitaxial growth (SEG) process using the substrate 100 (exposed by the through-hole 121) as a seed. Thus, if the substrate 100 is formed of single-crystalline silicon, the epitaxial layer 121 may also be formed of single-crystalline silicon. The epitaxial layer 121 may be formed to cover a sidewall of the lowermost sacrificial layer 112a, which is exposed by the through-hole 120. For example, a top surface of the epitaxial layer 121 may be disposed at a level substantially equal to or higher than a level of a top surface of the lowermost sacrificial layer 112a. In an embodiment, the top surface of the epitaxial layer 121 may be higher than the top surface of the lowermost sacrificial layer 112a and lower than a top surface of the insulating layer 111 disposed directly on the lowermost sacrificial layer 112a, e.g., relative to a surface of the substrate 100.

Figure 6:
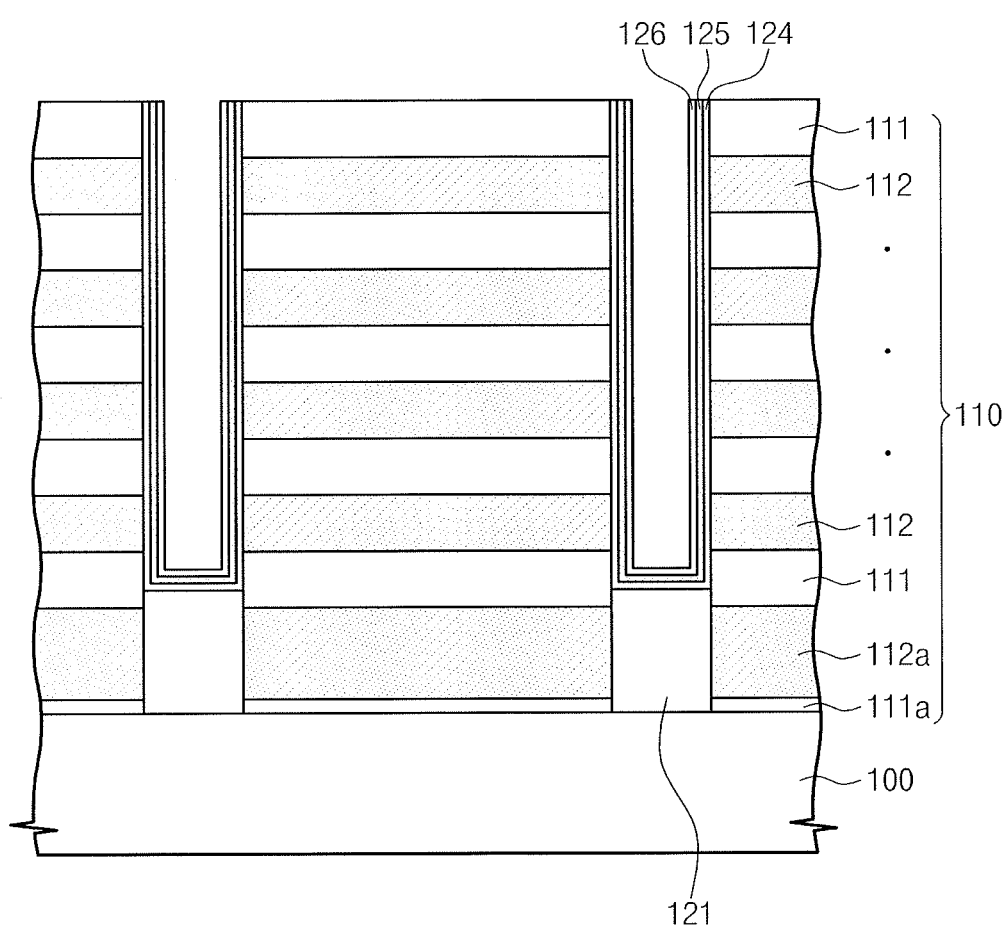

Referring to FIG. 6, a protecting layer 124 may be formed on the epitaxial layer 121. The protecting layer 124 may include, e.g., a silicon oxide layer. The protecting layer 124 may be conformally formed in the through-hole 120 having the epitaxial layer 121 therein. The protecting layer 124 may protect a charge storage layer 125 formed in a subsequent process. For example, the protecting layer 124 may be formed by an atomic layer deposition (ALD) process. The charge storage layer 125 may be formed on the protecting layer 124. The charge storage layer 125 may include a charge trapping layer and/or an insulating layer including conductive nano-particles. The charge trapping layer may include, e.g., a silicon nitride layer. Next, a tunnel insulating layer 126 may be formed on the charge storage layer 125. The tunnel insulating layer 126 may be a single-layer or a multi-layer including a plurality of thin layers. The tunnel insulating layer 126 may include, e.g., a silicon oxide layer. The charge storage layer 125 and the tunnel insulating layer 126 may be formed by, e.g., an ALD method.

According to an embodiment, the charge storage layer 125 and the tunnel insulating layer 126 may be formed in the through-hole 120. Thus, a vertical scale of the 3D semiconductor memory device may be reduced.

Figure 7:
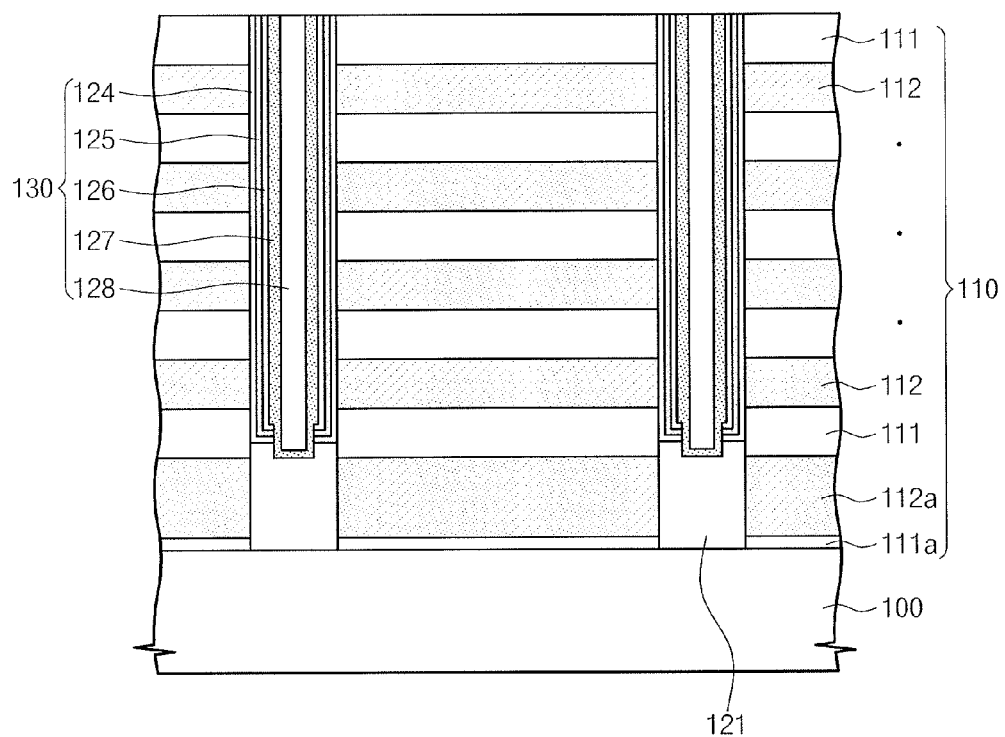

Referring to FIG. 7, a semiconductor pillar 127 may be formed on the tunnel insulating layer 126 in each through-hole 120. The semiconductor pillar 127 may be single-layered or multi-layered. In an implementation, forming the semiconductor pillar 127 may include forming a first semiconductor layer on the tunnel insulating layer 126; and anisotropically etching the first semiconductor layer to expose the epitaxial layer 121. At this time, portions of the first semiconductor layer may remain on a sidewall of the tunnel insulating layer 126 disposed on the sidewall of the through-hole 120. Subsequently, a second semiconductor layer may be formed on the first semiconductor layer in the through-hole 120. Thus, the semiconductor pillar 127 may be formed in the through-hole 120. The second semiconductor layer may be in contact with the first semiconductor layer and the exposed portion of the epitaxial layer 121. The top surface of the epitaxial layer 121 may have a first portion contacting the semiconductor pillar 127 and a second portion not contacting the semiconductor pillar 127. In an embodiment, the first portion of the top surface of the epitaxial layer 121 may be substantially coplanar with the second portion of the top surface of the epitaxial layer 121. In another embodiment, as illustrated in FIG. 7, the first portion of the top surface of the epitaxial layer 121 may be lower than the second portion of the top surface of the epitaxial layer 121, e.g., relative to a surface of the substrate 100. For example, a bottom surface of the semiconductor pillar 127 may be lower than the second portion of the top surface of the epitaxial layer 121. The layers constituting the semiconductor pillar 127 may be formed by an ALD process. In an embodiment, the semiconductor pillar 127 may include amorphous silicon. In this case, a thermal treatment process may be performed to convert the amorphous silicon of the semiconductor pillar 127 into polycrystalline silicon or single-crystalline silicon. In an embodiment, the second semiconductor layer for the semiconductor pillar 127 may partially fill the through-hole 120, and then a filling layer 128 may be formed on the second semiconductor layer to fill the through-hole 120. Subsequently, the filling layer 128 and the second semiconductor layer may be planarized until the uppermost insulating layer 111 is exposed. In another embodiment, the semiconductor pillar 127 may fully fill the through-hole 120. In this case, the filling layer 128 may be omitted.

As a result, a vertical structure 130 may be formed in each of the through-holes 120. The vertical structure 130 may include the protecting layer 124, the charge storage layer 125, the tunnel insulating layer 126, and the semiconductor pillar 127, and the filling layer 128, which are sequentially formed in the through-hole 120. The vertical structure 130 may be connected to the substrate 100 through the epitaxial layer 121.

Figure 8:
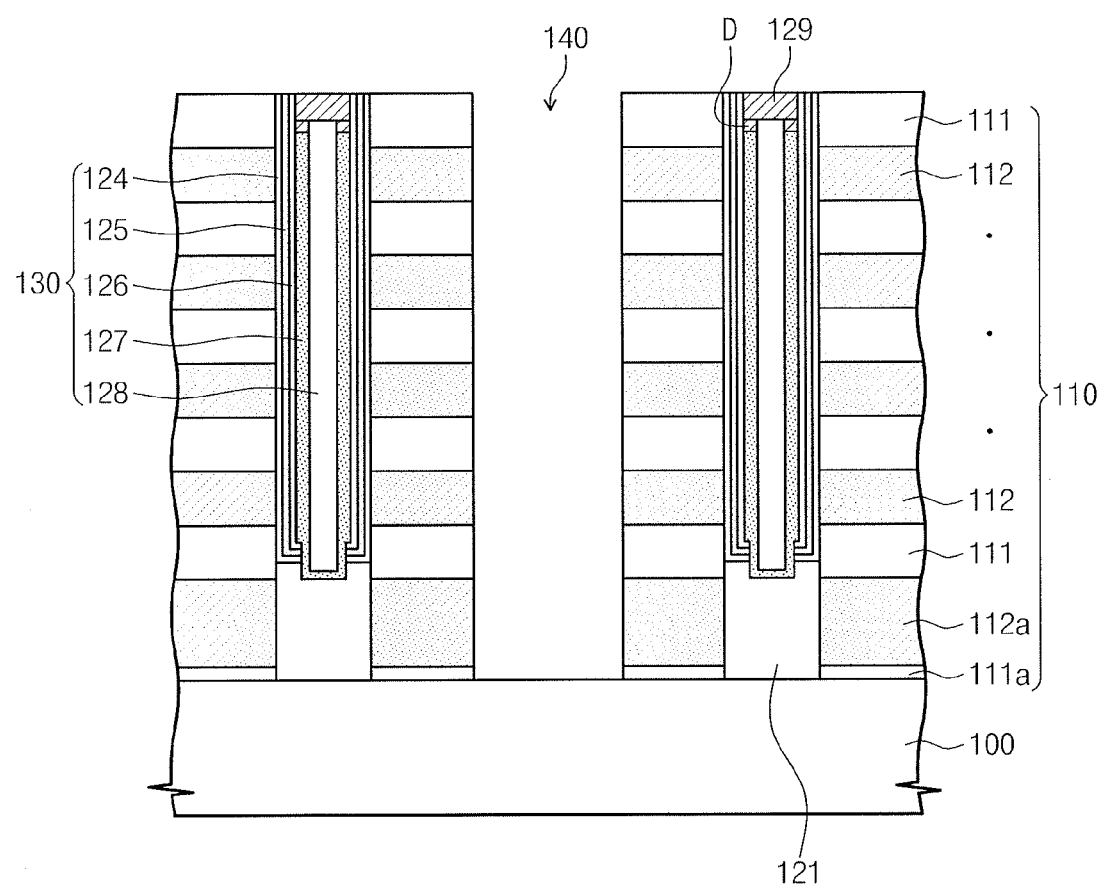

Referring to FIG. 8, top surfaces of the semiconductor pillar 127 and the filling layer 128 may be recessed to be lower than a top surface of the uppermost insulating layer 111. A conductive pattern 129 may be formed on the recessed top surfaces of the semiconductor pillar 127 and the filling layer 128 in each of the through-holes 120. The conductive pattern 129 may include a doped polysilicon and/or a metal. Dopant ions may be implanted into the conductive pattern 129 and/or an upper portion of the semiconductor pillar 127 to form a drain region D. The drain region D may be doped with N-type dopants.

A trench 140 may be formed to divide the mold stack structure 110 into a plurality of mold stack patterns. The trench 140 may be formed between the vertical structures 130. The insulating layers 111a and 111 and the sacrificial layers 112a and 112 may be successively patterned to form the trench 140 that exposes the substrate 100. The trench 140 may extend in the first direction (i.e., the x-axis direction of FIG. 2) to divide the mold stack structure 110 into the plurality of mold stack patterns. The mold stack patterns 110 may be spaced apart from each other in the second direction (i.e., the y-axis direction of FIG. 2).

Figure 9:
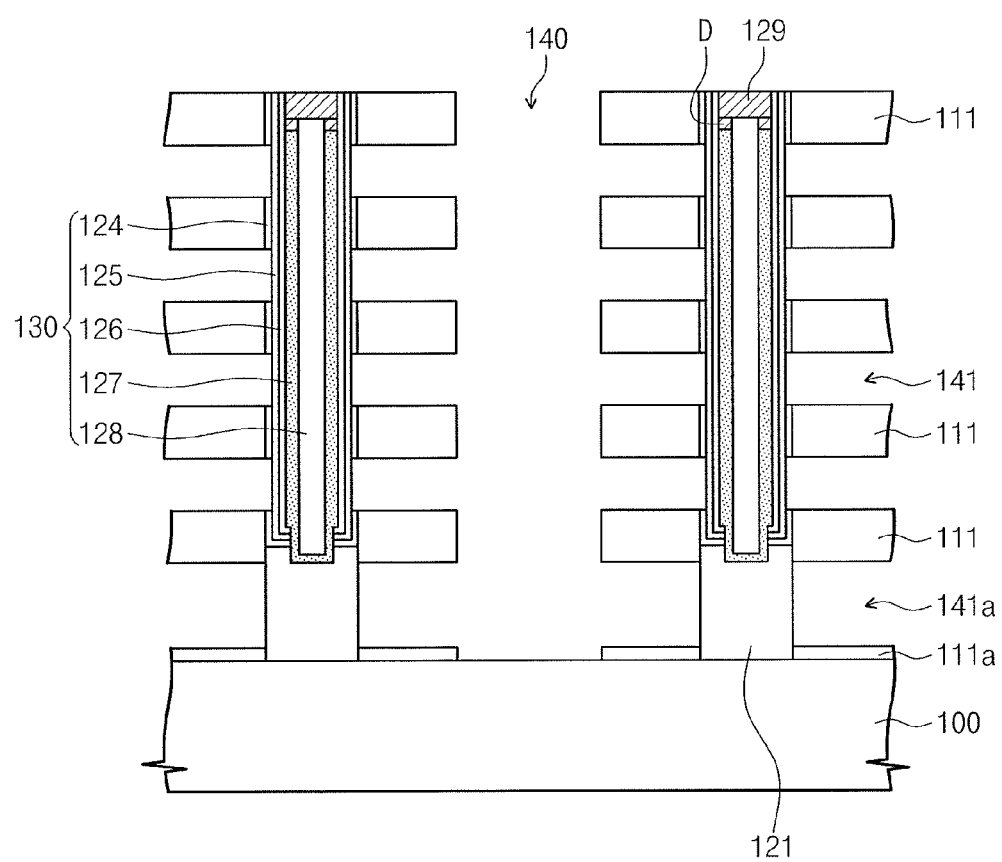

Referring to FIG. 9, the sacrificial layers 112a and 112 of FIG. 8 (exposed by the trench 140) may be removed, e.g., selectively or completely removed, to form recess regions 141a and 141. The recess regions 141a and 141 may correspond to regions from which the sacrificial layers 112a and 112 are removed. The recess regions 141a and 141 may be defined by the vertical structures 130 and the insulating layers 111a and 111. A lowermost one 141a of the recess regions 141a and 141 may be formed by removing the lowermost sacrificial layer 112a. The lowermost recess region 141a may expose the epitaxial layer 121. In an embodiment, if the sacrificial layers 112a and 112 are formed of silicon nitride layers or silicon oxynitride layers, the sacrificial layers 112a and 112 may be removed using an etching solution including phosphoric acid. Other ones of the recess regions 141 may expose the protecting layer 124. For example, the protecting layer 124 may protect the charge storage layer 125 from the etching solution used for the removal of the sacrificial layers 112a and 112.

Next, the protecting layer 124, e.g., portions of the protecting layer 124 exposed by the recess regions 141, may be selectively removed to expose portions of the charge storage layer 125. The protecting layer 124 may be selectively etched using an etch-recipe or etchant having an etch selectivity with respect to the charge storage layer 125. In an embodiment, the epitaxial layer 121 exposed by the lowermost recess region 141a may not be etched during the selective removal of the protecting layer 124. For example, if the protecting layer 124 is formed of a silicon oxide layer and the epitaxial layer 121 is formed of silicon, the protecting layer 124 may be removed using an etch-recipe or etchant that selectively etches the silicon oxide layer. For example, the protecting layer 124 may be removed by an etching solution including hydrofluoric acid.

Figure 10:
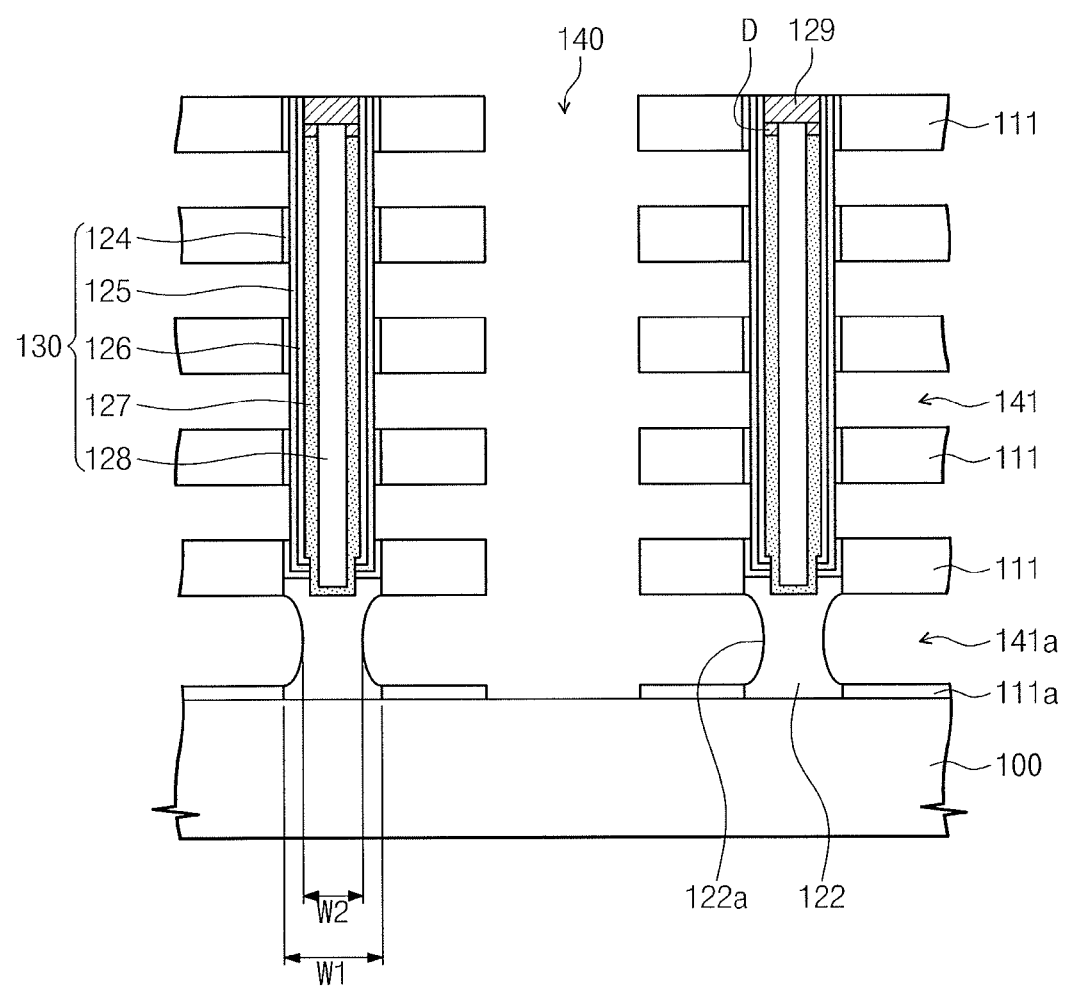

Referring to FIG. 10, the exposed epitaxial layer 121 of FIG. 9 may be selectively etched to form an epitaxial pattern 122 having a recessed sidewall 122a. A sidewall of the epitaxial layer 121 (which is exposed by the lowermost recess region 141a) may be partially etched to form the epitaxial pattern 122. The epitaxial layer 121 may be etched by an etching process having an etch selectivity with respect to the charge storage layer 125, such that the exposed charge storage layer 125 may not be etched during the formation of the epitaxial pattern 122. The etching process performed on the epitaxial layer 121 may include a wet etching process or a dry etching process. In an embodiment, if the epitaxial layer 121 is isotropically etched using the wet etching process, the recessed sidewall 122a of the epitaxial pattern 122 may have a rounded shape. Thus, the minimum width W2 of the epitaxial pattern 122 may be less than a width W1 of the vertical structure 130 or through-hole 120.

In another embodiment, removing the protecting layer 124 of FIG. 9 and forming the epitaxial pattern 122 may be performed by a single etching process at a same time. For example, if the protecting layer 124 is a silicon oxide layer and the epitaxial layer 121 is formed of silicon, the single etching process may be performed using an etch-recipe or etchant that simultaneously etches the silicon oxide layer and the silicon. Thus, the epitaxial pattern 122 having the recessed sidewall 122a may be formed during or at the same time as the selective removal of the protecting layer 124. In this case, the etch-recipe or etchant of the single etching process may have an etch selectivity with respect to the charge storage layer 125, such that the charge storage layer 125 may not be etched. For example, the epitaxial layer 121 may be etched by a wet etching process using $O_3HF$, a standard cleaning 1 (SC1) solution, or ammonia or by a dry etching process using a gas.

In still another embodiment, forming the recess regions 141a and 141 and forming the epitaxial pattern 122 may be performed by a same etching process at a same time. In this case, the lowermost sacrificial layer 112a may be formed of a material having an etch selectivity with respect to the other sacrificial layers 112. In other words, the sacrificial layer 112a contacting the epitaxial layer 121 may be formed of a material having an etch rate different from those of the other sacrificial layers 112 contacting the vertical structure 130. For example, the sacrificial layers 112a and 112 may include silicon nitride, and a nitrogen concentration of the lowermost sacrificial layer 112a may be higher than those of the other sacrificial layers 112. For example, the lowermost sacrificial layer 112a may include nitrogen-rich silicon nitride, and the other sacrificial layers 112 may include silicon nitride. Thus, when the recess regions 141a and 141 formed by removing the sacrificial layers 112a and 112, the etch rate of the lowermost sacrificial layer 112a may be greater than those of the other sacrificial layers 112, such that the sidewall of the epitaxial layer 121 may also be etched to form the epitaxial pattern 122. The etching process for the removal of the sacrificial layers 112a and 112 may use an etching solution including phosphoric acid. In this case, the protecting layer 124 exposed by the recess regions 141 may be also etched. As a result, forming the recess regions 141a and 141, selectively removing the protecting layer 124, and forming the epitaxial pattern 122 may be performed by the same etching process at the same time.

Figure 11:
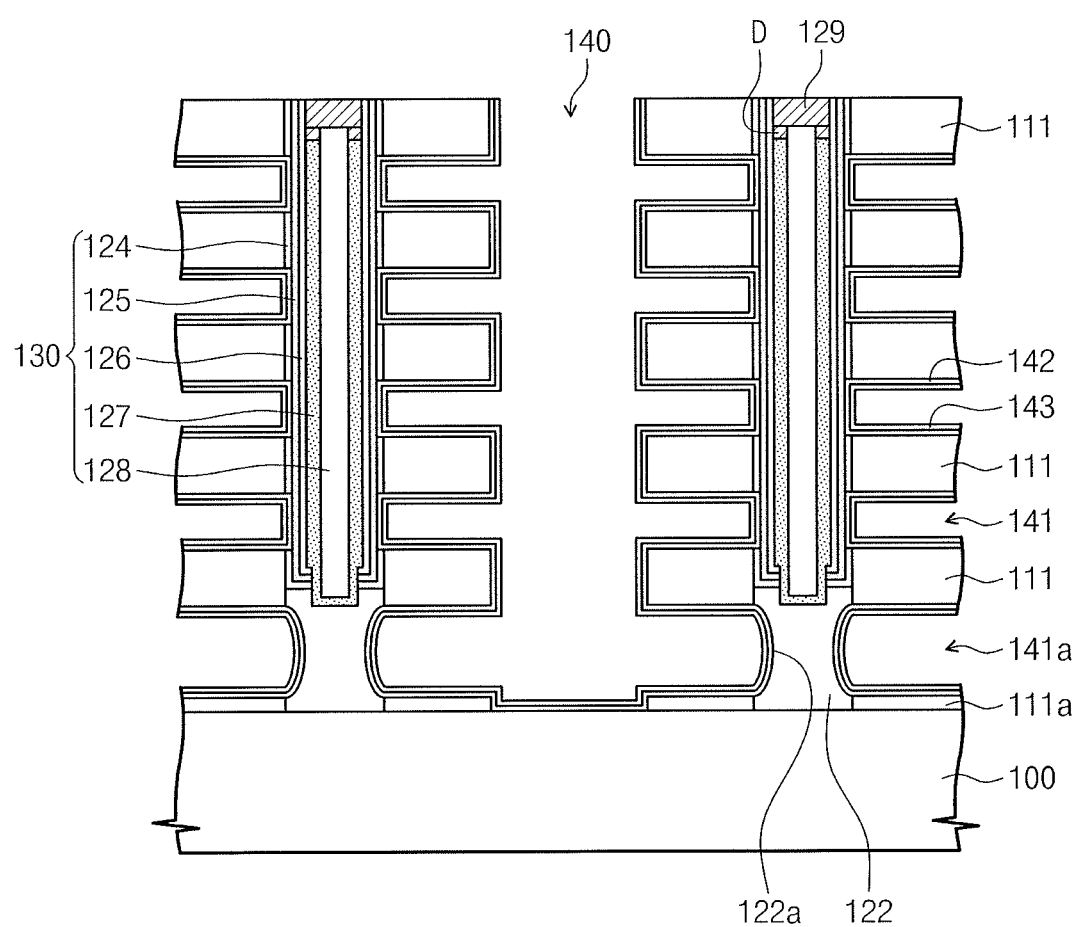

Referring to FIG. 11, a first blocking insulating layer 142 and a second blocking insulating layer 143 may be sequentially formed on inner surfaces of the recess regions 141a and 141. The first and second blocking insulating layers 142 and 143 may be conformally deposited along exposed inner surfaces of the recess regions 141a and 141 and the trench 140. For example, the first blocking insulating layer 142 may include a silicon oxide layer, and the second blocking insulating layer 143 may include an aluminum oxide layer. However, the embodiments are not limited thereto. A stacking order of the first and second blocking insulating layers 142 and 143 may be variously modified. Each of the first and second blocking insulating layers 142 and 143 may be formed by an ALD method. In an implementation, the first and second blocking insulating layers 142 and 143 in the lowermost recess region 141a may be conformally deposited on the recessed sidewall 122a of the epitaxial pattern 122. As a result, the first and second blocking insulating layers 142 and 143 contacting the epitaxial pattern 122 may have a convex shape toward the epitaxial pattern 122.

Figure 12:
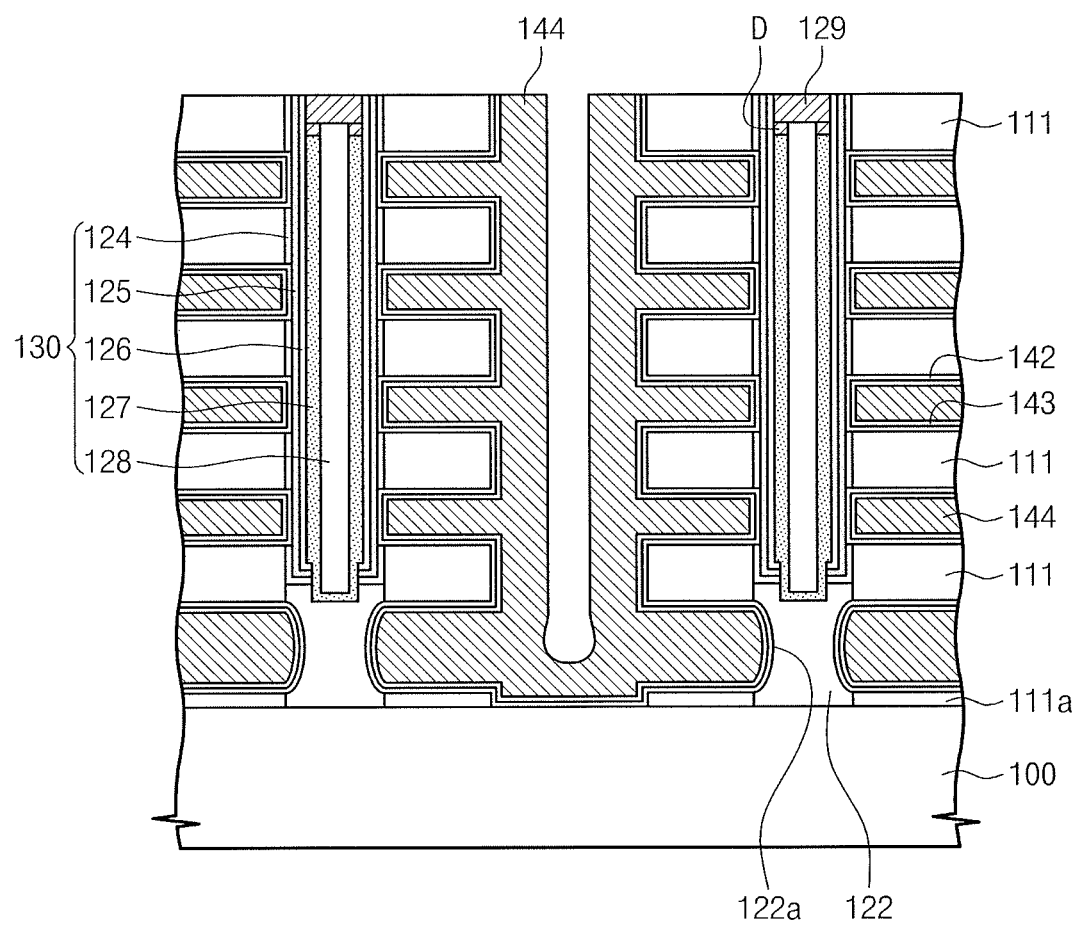

Referring to FIG. 12, an electrode layer 144 may be formed on the second blocking insulating layer 143. The electrode layer 144 may be formed in the recess regions 141a and 141 of FIG. 11 and the trench 140 of FIG. 11. The electrode layer 144 may completely fill the recess regions 141a and 141 and may partially fill the trench 140. The electrode layer 144 may be conformally deposited on the inner surface of the trench 140. The electrode layer 144 may include at least one of a doped polycrystalline silicon layer, a metal layer (e.g., a tungsten layer), and/or a metal nitride layer. In an embodiment, the electrode layer 144 may include a barrier metal layer and a bulk metal layer that are sequentially stacked. The barrier metal layer may include a transition metal (e.g., titanium or tantalum) and/or a metal nitride (e.g., titanium nitride, tantalum nitride, or tungsten nitride), and the bulk metal layer may include tungsten.

Figure 13:
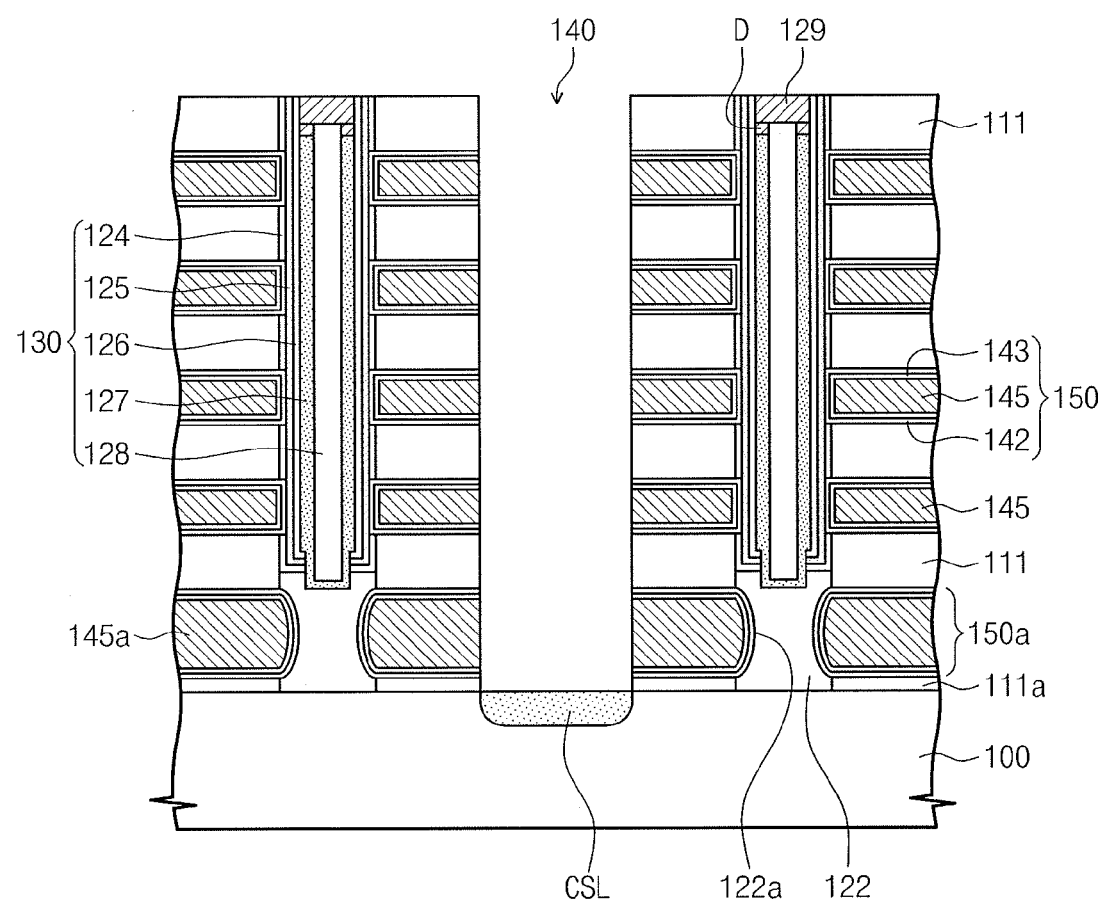

Referring to FIG. 13, the electrode layer 144 of FIG. 12 (outside the recess regions 141a and 141 of FIG. 11) may be removed. Thus, the electrode layer 144 in the trench 140 may be removed. For example, the electrode layer 144 outside of the recess regions 141a and 141 may be removed by an isotropic etching process. As a result, gate electrodes 145a and 145 may be confinedly formed in the recess regions 141a and 141, respectively. If the electrode layer 144 includes the barrier metal layer and the bulk metal layer, the bulk metal layer and the barrier metal layer in the trench 140 may be removed to form the gate electrodes 145a and 145. In this case, each of the gate electrodes 145a and 145 may include a barrier metal pattern and a bulk metal pattern confinedly disposed in each of the recess regions 141a and 141. The gate electrodes 145a and 145 are formed, such that horizontal structures 150a and 150 are formed in the recess regions 141a and 141. Each of the horizontal structures 150a and 150 may include the first and second blocking insulating layers 142 and 143 and each of the gate electrodes 145a and 145. The lowermost horizontal structure 150a in the lowermost recess region 141a of FIG. 11 may be formed along the recessed sidewall 122a of the epitaxial pattern 122, so as to have a laterally convex shape.

Subsequently, a high dose of dopant ions may be implanted into the substrate 100 exposed by the trench 140 to form a dopant region in the substrate 100. The dopant region corresponds to a common source line CSL.

Figure 14:
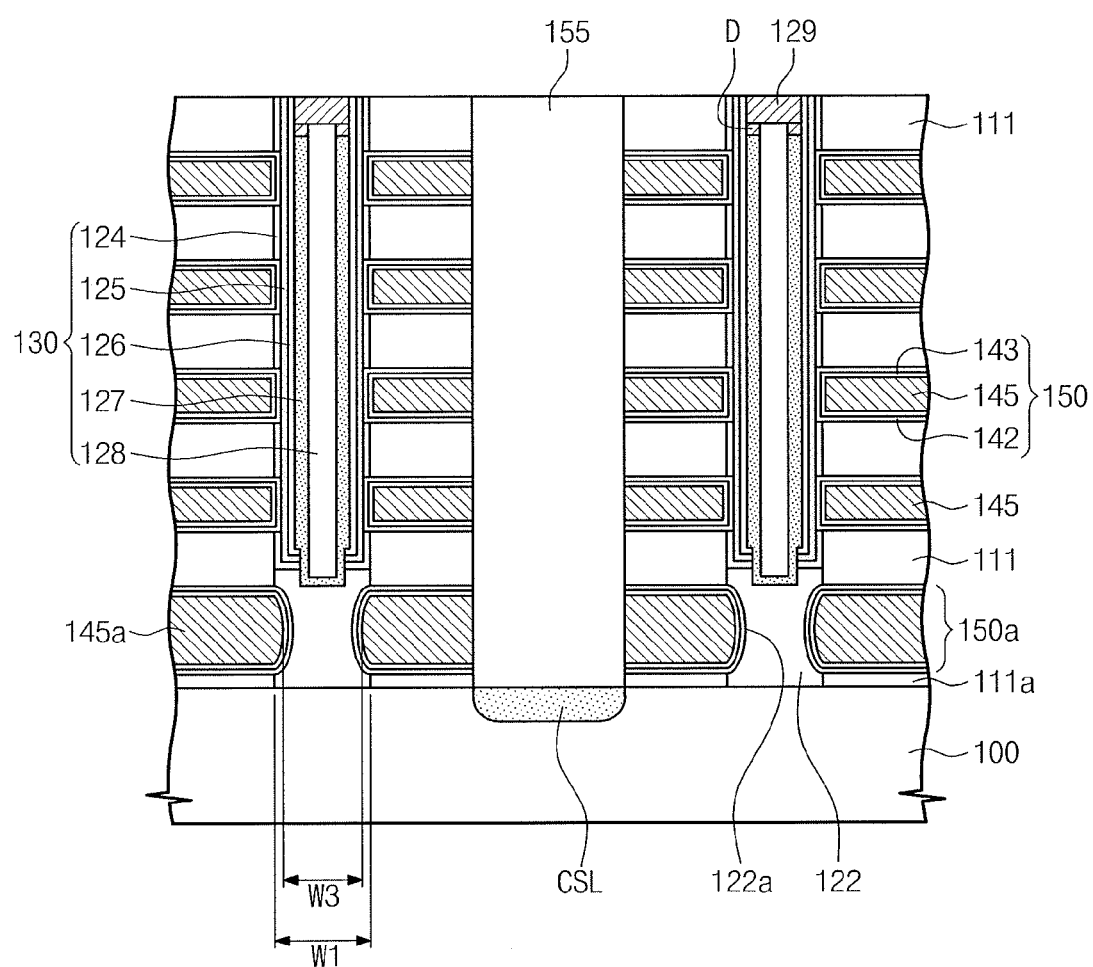

Referring to FIG. 14, an isolation insulating layer 155 may be formed to fill the trench 140 of FIG. 13. The isolation insulating layer 155 may extend in the first direction along the trench 140 in a plan view. Subsequently, as illustrated in FIG.

2, bit lines BL may be formed. The vertical structures 130 arranged in the second direction may be connected in common to one bit line BL.

The 3D semiconductor memory device according to the present embodiment may include the epitaxial pattern 122 between the substrate 100 and each of the vertical structures 130. The epitaxial pattern 122 may have the recessed sidewall 122a. The minimum width W2 of the epitaxial pattern 122 may be less than the width W1 of the vertical structure 130. Thus, the lowermost horizontal structure 150a that contacts the epitaxial pattern 122 may have the convex shape that is complementary to the recessed sidewall 122a of the epitaxial pattern 122. As a result, a horizontal distance between a center of the epitaxial pattern 122 and the lowermost gate electrode 145a of the lowermost horizontal structure 150a may be substantially equal to or less than a horizontal distance between a center of the vertical structure 130 and each of the other gate electrodes 145. For example, a distance W3 between portions of the lowermost gate electrode 145a that are respectively disposed at both sides of the epitaxial pattern 122 may be substantially equal to or less than the width W1 of the vertical structure 130. The lowermost gate electrode 145a may have an electrode-hole through which the epitaxial pattern 122 passes. The first and second blocking insulating layers 142 and 143 of the lowermost horizontal structure 150a may be disposed between an inner sidewall of the electrode-hole of the lowermost gate electrode 145a and the recessed sidewall 122a of the epitaxial pattern 122. The distance W3 of the lowermost gate electrode 145a may correspond to the minimum width of the electrode-hole defined in the lowermost gate electrode 145a. This will be described as compared with a comparative embodiment.

Figure 15:
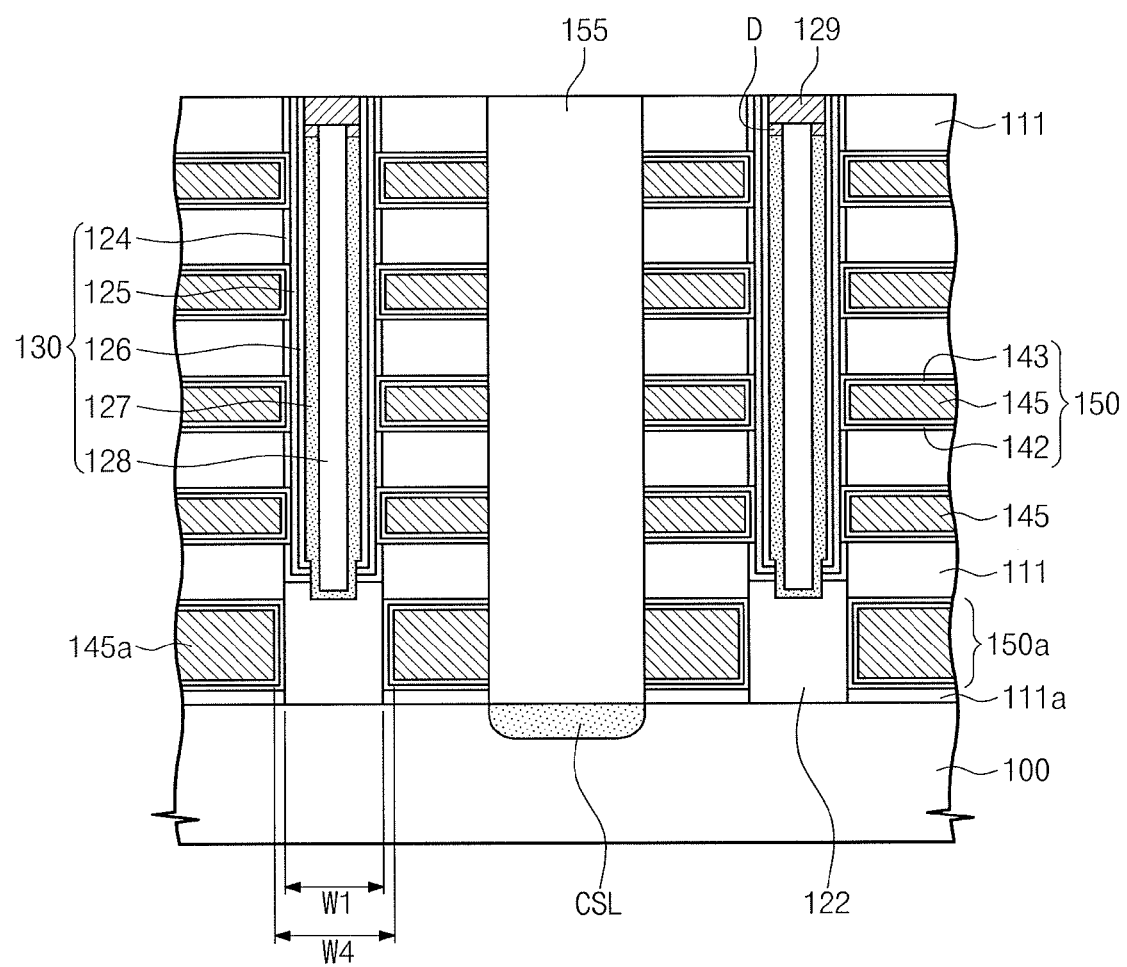
FIG. 15 illustrates a cross-sectional view of a 3D semiconductor memory device according to a comparative embodiment.

FIG. 15 illustrates a cross-sectional view of a 3D semiconductor memory device according to a comparative embodiment.

Referring to FIG. 15, according to the comparative embodiment, a distance W4 between portions of a lowermost gate electrode 145a that are respectively disposed at both sides of an epitaxial pattern 122g may be greater than the width W1 of the vertical structure 130. The epitaxial pattern 122g may be formed of a different material from the protecting layer 124. Thus, the epitaxial pattern 122g may not be etched in the process in which the protecting layer 124 is selectively removed to expose the charge storage layer 125. Therefore, the distance W4 of the lowermost gate electrode 145a may be greater than the width W1 of the vertical structure 130. As a result, an occupied space of the lowermost gate electrode 145a may be less than those of the other gate electrodes 145, such that a process error may occur in a deposition process for the lowermost gate electrode 145a. However, the epitaxial pattern 122 according to the embodiments may be formed to have the recessed sidewall 122a as illustrated in FIG. 14. Thus, the 3D semiconductor memory device according to an embodiment may exhibit improved reliability.

Figure 16:
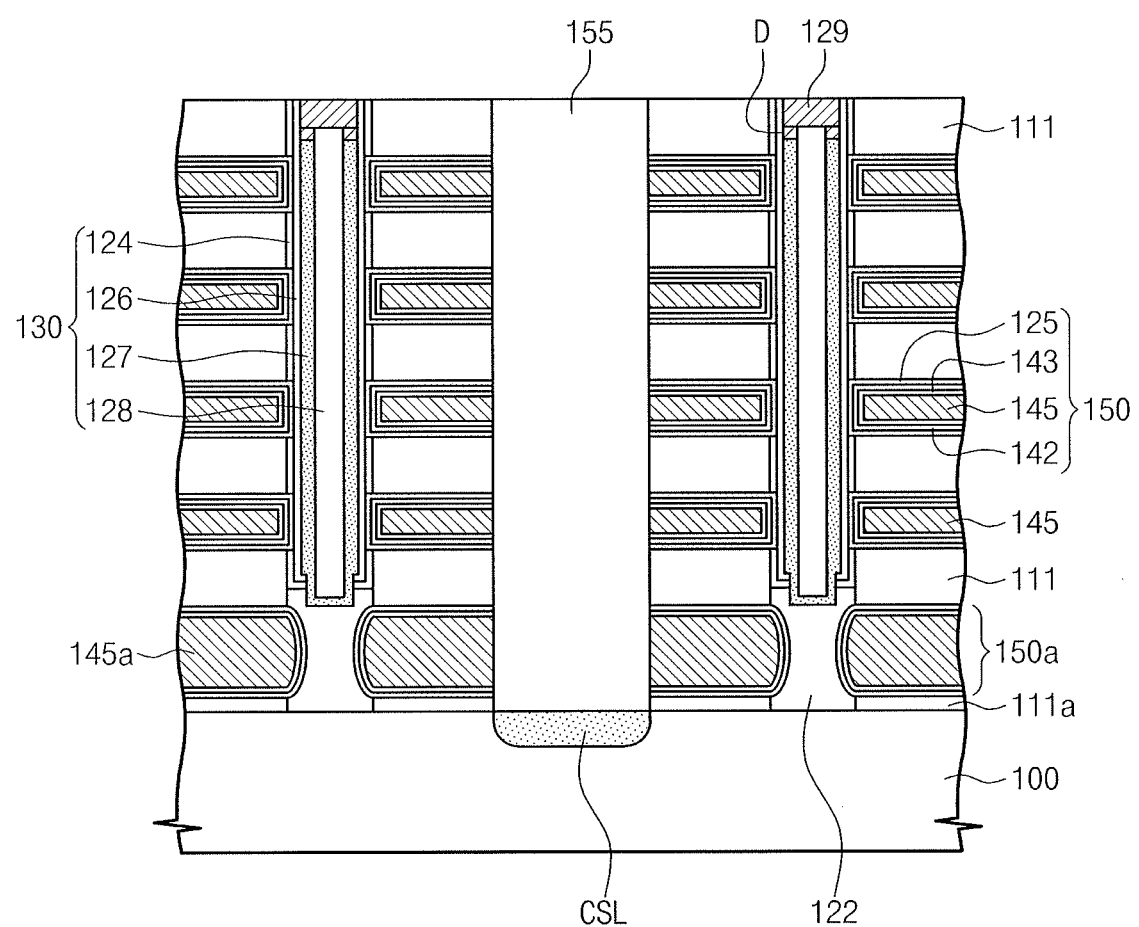
FIG. 16 illustrates a cross-sectional view of a modified example of a method for fabricating a 3D semiconductor memory device according to an embodiment.

FIG. 16 illustrates a cross-sectional view illustrating a modified example of a method for fabricating a 3D semiconductor memory device according to an embodiment. In the present modified example, the same elements as described with reference to FIGS. 1 to 14 will be indicated by the same reference numerals or the same reference designators, and the descriptions to the same elements may be omitted or mentioned briefly.

Referring to FIG. 16, the first and second blocking insulating layers 142 and 143, the charge storage layer 125, and the tunnel insulating layer 126 may be defined as the data storage element of the 3D semiconductor memory device, as described with reference to FIG. 2. A portion of the data storage element may be included in the vertical structure 130, and remaining portions of the data storage element may be included in the horizontal structure 150. In the present modified example, the tunnel insulating layer 126 may be included in the vertical structure 130, and the charge storage layer 125 and the first and second blocking insulating layers 142 and 143 may be included in the horizontal structure 150.

To achieve this, the protecting layer 125 and the tunnel insulating layer 126 may be formed in the through-hole in the process of FIG. 6, and the charge storage layer 125 and the first and second blocking insulating layers 142 and 143 may be sequentially formed in the recess region in the process of FIG. 11. Other processes for fabricating the 3D semiconductor memory device according to the present modified example may be substantially the same as corresponding processes described above.

Figure 17:
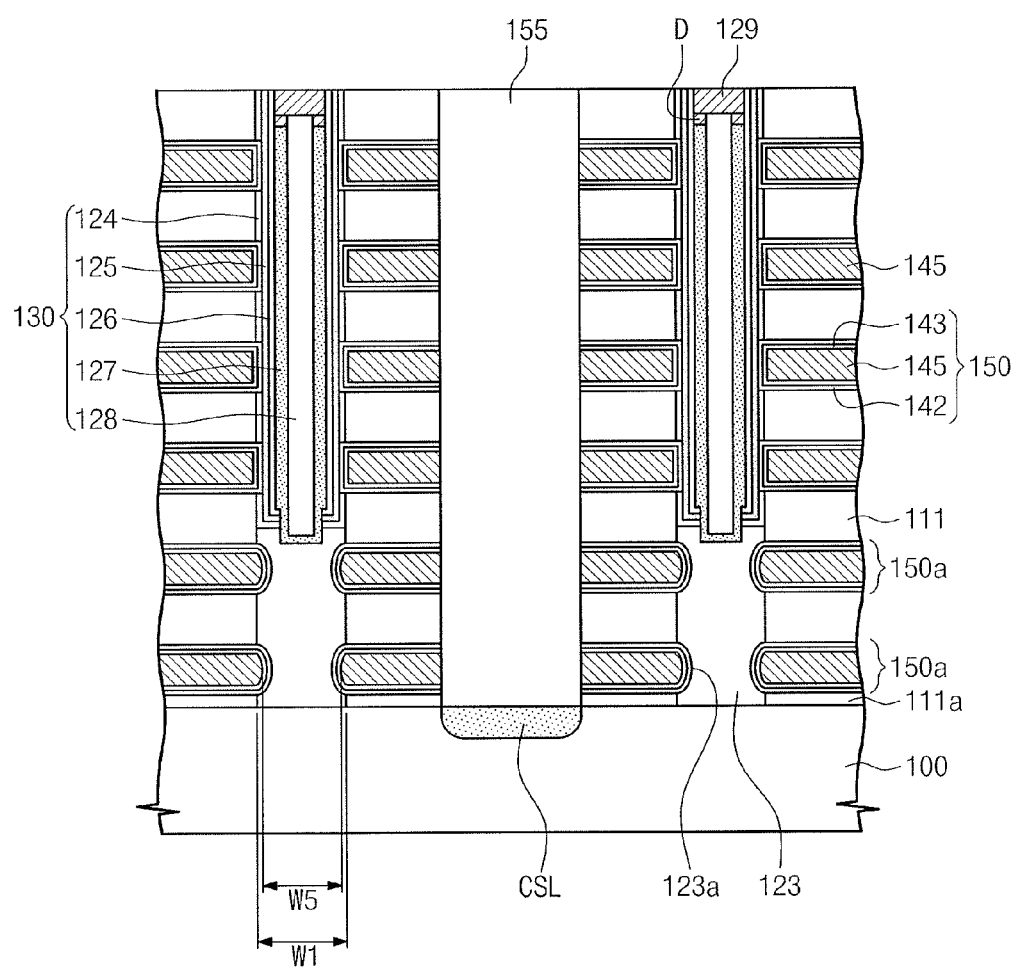
FIG. 17 illustrates a cross-sectional view of another modified example of a method for fabricating a 3D semiconductor memory device according to an embodiment.

FIG. 17 illustrates a cross-sectional view of another modified example of a method for fabricating a 3D semiconductor memory device according to an embodiment. In the present modified example, the same elements as described with reference to FIGS. 1 to 14 and 16 will be indicated by the same reference numerals or the same reference designators, and the descriptions to the same elements may be omitted or mentioned briefly.

Referring to FIG. 17, an epitaxial pattern 123 according to the present modified example may be in contact with two floors or levels of horizontal structures, e.g., the lowermost and a second-lowermost of the horizontal structures 150a. For example, the epitaxial pattern 123 may be in contact with two adjacent ones of the horizontal structures that are closest to the substrate 100. Unlike the 3D semiconductor memory device illustrated in FIGS. 2 and 14, thicknesses of the horizontal structures 150 and 150a may be substantially equal to each other in the present modified example. As described in the embodiments of FIGS. 2, 14 and 16, the epitaxial pattern 123 may have a recessed sidewall 123a. Thus, a distance W5 between portions of the gate electrode 145a (which are respectively in contact with both recessed sidewalls 123a of the epitaxial pattern 123) may be substantially equal to or less than the width W1 of the vertical structure 130. In the present modified example, the lowermost and second-lowermost horizontal structures 150a may correspond to the ground selection line GSL of FIG. 1. The fabricating method of the 3D semiconductor memory device according to the present modified example may be substantially the same as those of the aforementioned embodiments.

Figure 18:
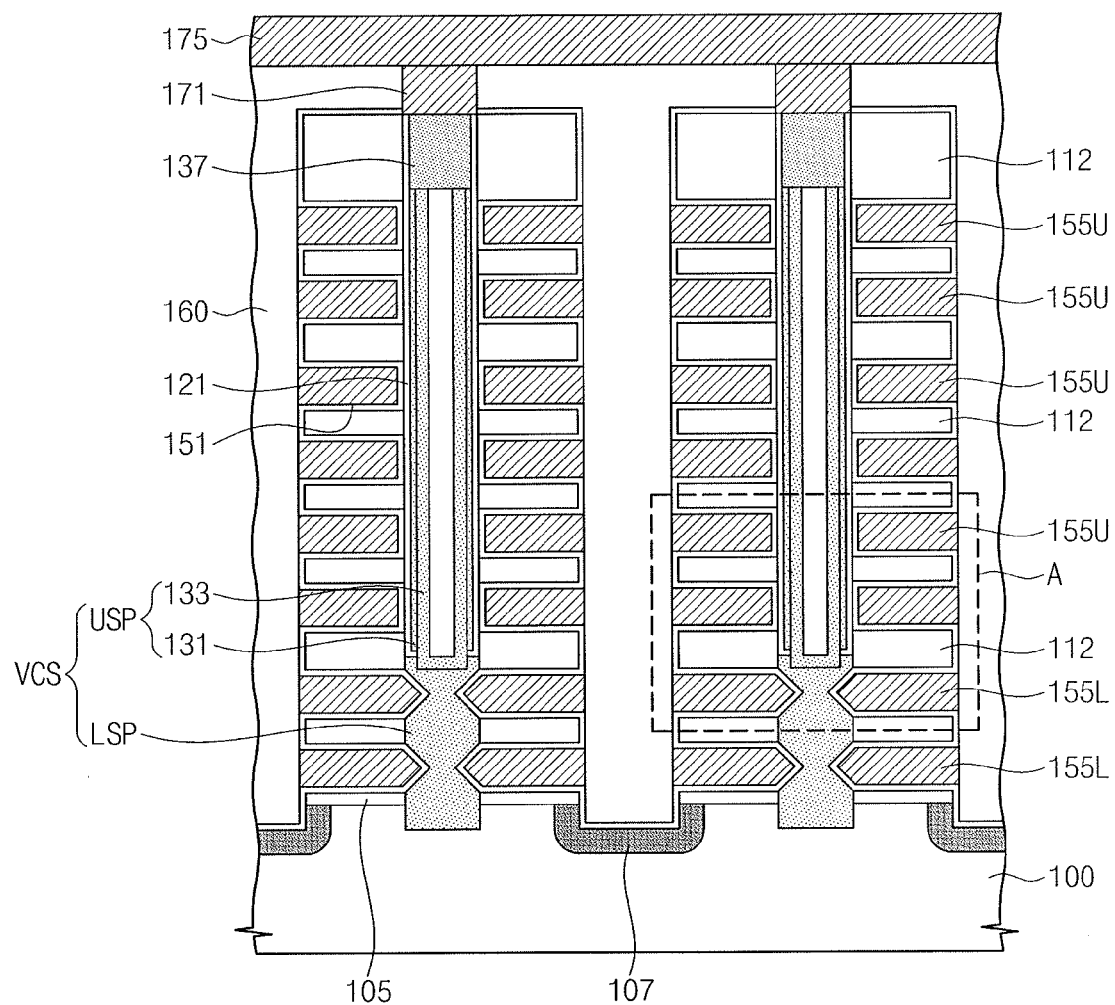
FIG. 18 illustrates a cross-sectional view of a 3D semiconductor memory device according to an embodiment.
Figure 19:
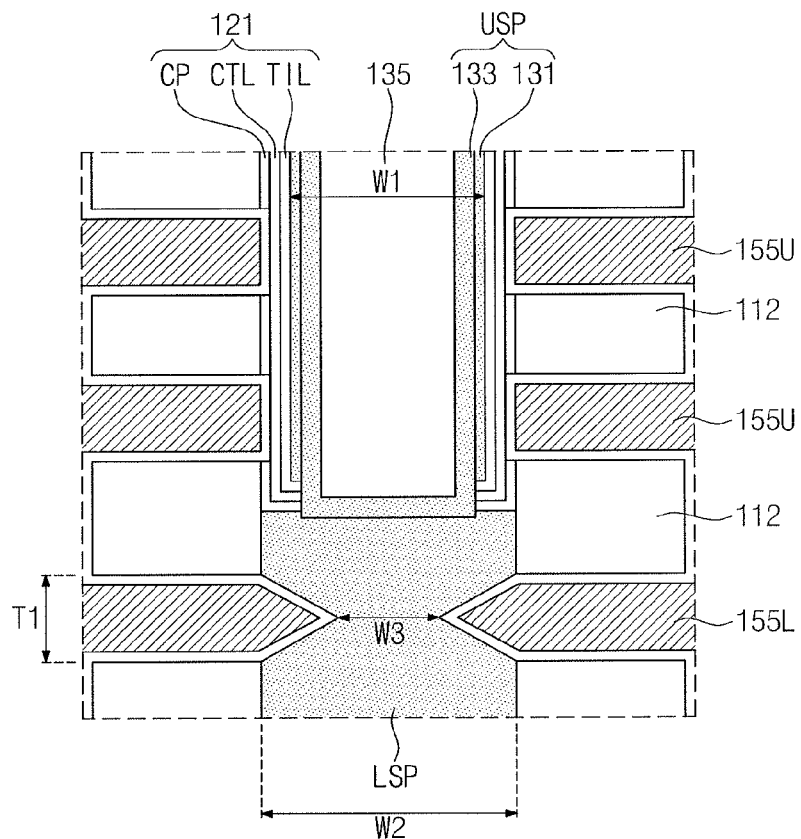
FIG. 19 illustrates an enlarged view of a portion 'A' of FIG. 18.
Figure 20:
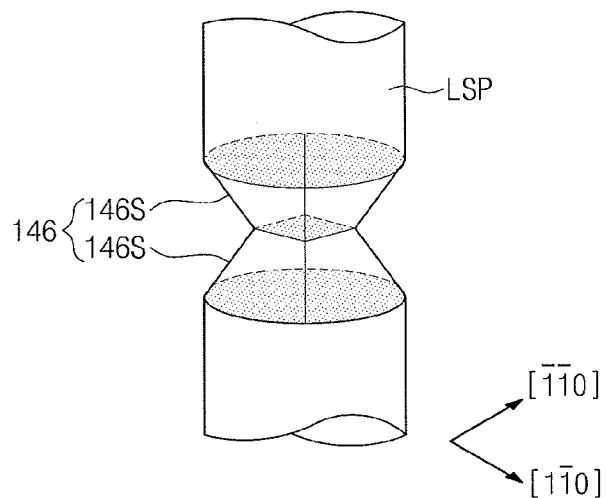
FIG. 20 illustrates a perspective view of a lower semiconductor pattern of a 3D semiconductor memory device according to an embodiment.

FIG. 18 illustrates a cross-sectional view illustrating a 3D semiconductor memory device according to an embodiment. FIG. 19 illustrates an enlarged view of a portion 'A' of FIG. 18. FIG. 20 illustrates a perspective view of a lower semiconductor pattern of a 3D semiconductor memory device according to an embodiment.

Referring to FIG. 18, a stack structure may be disposed on a substrate 100. The stack structure may include lower and upper gate patterns 155L and 155U with insulating layers 112 therebetween.

The substrate 100 may be formed of a semiconductor material. For example, the substrate 100 may be a silicon substrate, a germanium substrate, or a silicon-germanium substrate. The substrate 100 may include a common source region 107 doped with dopants. A lower insulating layer 105 may be formed between the substrate 100 and the stack structure. For example, the lower insulating layer 105 may be a silicon oxide layer formed by a thermal oxidation process. Alternatively, the lower insulating layer 105 may be a silicon oxide layer formed by a deposition technique. The lower insulating layer 105 may be thinner than the insulating layers 112 thereon.

Figure 21:
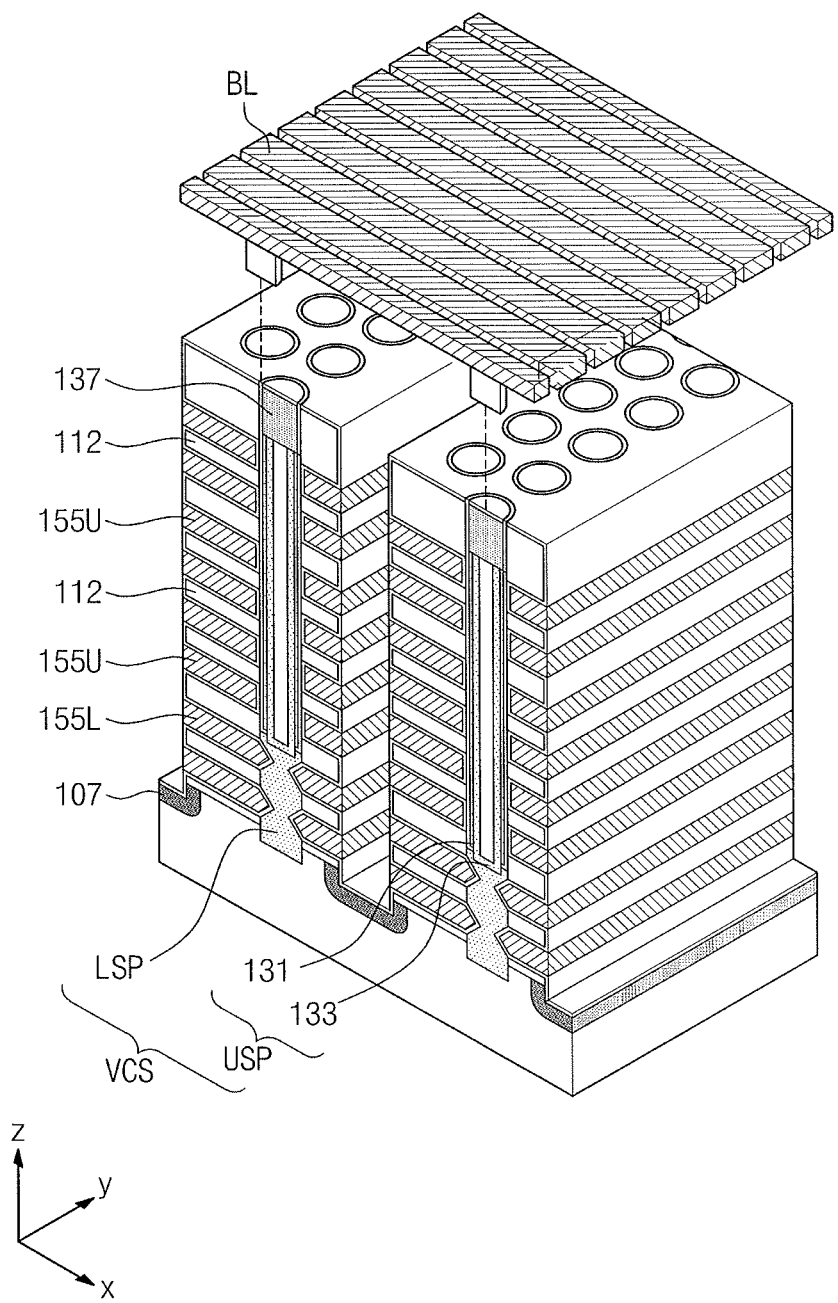
FIG. 21 illustrates a perspective view of a modified example of a 3D semiconductor memory device according to an embodiment.

In a plan view, the stack structure may have a linear shape extending in one direction. A plurality of channel structures VCS may penetrate the stack structure and may be electrically connected to the substrate 100. The channel structures VCS penetrating the stack structure may be arranged in a line in the one direction. Alternatively, the channel structures VCS may be arranged in a zigzag form along the one direction in a plan view, as illustrated in FIG. 21.

According to an embodiment, the stack structure may include the lower gate patterns 155L adjacent to a lower semiconductor pattern LSP, and the upper gate patterns 155U adjacent to an upper semiconductor pattern USP. In an embodiment, the lower gate patterns 155L may be used as gate electrodes of the ground selection transistors GST described with reference to FIG. 1. For example, in the 3D semiconductor memory device (e.g., a 3D NAND flash memory device), the lower gate patterns 155L may be used as gate electrodes of the ground selection transistors GST controlling electrical connection between the lower semiconductor pattern LSP and a dopant region (i.e., the common source region 107) formed in the substrate 100. Some of the upper gate patterns 155U may be used as the gate electrodes of the memory cell transistors MCT described with reference to FIG. 1. Additionally, the upper gate pattern 155U disposed at an uppermost floor or level of the stack structure may be used as the gate electrode of the string selection transistor SST described with reference to FIG. 1. For example, the upper gate pattern 155U disposed at the uppermost level of the stack structure may be used as the gate electrode of the string selection transistor SST controlling electrical connection between a bit line 175 and the channel structure VCS in the 3D flash memory device.

According to an embodiment, a horizontal width of each lower gate pattern 155L may be greater than a horizontal width of each upper gate pattern 155U. A vertical thickness of each lower gate pattern 155L may be substantially equal to a vertical thickness of each upper gate pattern 155U. Alternatively, the vertical thickness of each lower gate pattern 155L may be greater than the vertical thickness of each upper gate pattern 155U.

According to an embodiment, each of the channel structures VCS penetrating the stack structure may include the lower semiconductor pattern LSP penetrating a lower portion of the stack structure and the upper semiconductor pattern USP penetrating an upper portion of the stack structure. The upper semiconductor pattern USP may be electrically connected to the lower semiconductor pattern LSP, and the lower semiconductor pattern may be electrically connected to the substrate 100.

According to an embodiment, the upper semiconductor pattern USP may have a hollow pipe-shape or a hollow macaroni-shape. In this case, a bottom end of the upper semiconductor pattern USP may be in a closed state, and an inner space of the upper semiconductor pattern USP may be filled with a filling insulation pattern 135. A bottom surface of the upper semiconductor pattern USP may be lower than a top surface of the lower semiconductor pattern LSP, e.g., relative to a surface of the substrate 100. For example, a bottom end portion of the upper semiconductor pattern USP may be inserted in the lower semiconductor pattern LSP. In an implementation, the top surface of the lower semiconductor pattern LSP may have a first portion contacting the bottom surface of the upper semiconductor pattern USP and a second portion not contacting the bottom surface of the upper semiconductor pattern USP. The first portion of the top surface of the lower semiconductor pattern LSP (i.e., the bottom surface of the upper semiconductor pattern USP) may be lower than the second portion of the top surface of the lower semiconductor pattern LSP, e.g., relative to the surface of the substrate 100.

The upper semiconductor pattern USP may be formed of a semiconductor material. For example, the upper semiconductor pattern USP may include silicon, germanium, or any combination thereof. The upper semiconductor pattern USP may be doped with dopants or may be in an undoped state (i.e., an intrinsic state). The upper semiconductor pattern USP may have a crystal structure of a single-crystalline structure, an amorphous structure, and/or a polycrystalline structure. A conductive pad 137 may be disposed on the upper semiconductor pattern USP. The conductive pad 137 may be a dopant region doped with dopants or may be formed of a conductive material.

For example, the upper semiconductor pattern USP may include a first semiconductor pattern 131 and a second semiconductor pattern 133. The first semiconductor pattern 131 may cover an inner sidewall of the stack structure. The first semiconductor pattern 131 may have a pipe-shape (or a macaroni-shape) of which a top end and a bottom end are opened. The first semiconductor pattern 131 may be spaced apart from the lower semiconductor pattern LSP. For example, the first semiconductor pattern 131 may not be in contact with the lower semiconductor pattern LSP. A bottom end of the second semiconductor pattern 133 may have a pipe-shape (or a macaroni-shape) of which a bottom end is closed. An inner space of the second semiconductor pattern 133 may be filled with the filling insulation pattern 135. The second semiconductor pattern 133 may be in contact with an inner sidewall of the first semiconductor pattern 131 and the top surface of the lower semiconductor pattern LSP. For example, the second semiconductor pattern 133 may electrically connect the first semiconductor pattern 131 to the lower semiconductor pattern LSP.

The first and second semiconductor patterns 131 and 133 may be in an undoped state or may be doped with dopants of a same conductivity type as the substrate 100. The first and second semiconductor patterns 131 and 133 may be in a polycrystalline state or a single-crystalline state.

The lower semiconductor pattern LSP may be used as a channel region of the ground selection transistor GST described with reference to FIG. 1. The lower semiconductor pattern LSP may be formed of a semiconductor material having the same conductivity type as the substrate 100. In an embodiment, the lower semiconductor pattern LSP may be an epitaxial pattern formed by one of an epitaxial technique and a laser crystallization technique which use the substrate 100 of a semiconductor material as a seed. In this case, the lower semiconductor pattern LSP may have a single-crystalline structure, or a polycrystalline structure having a grain size greater than that of a semiconductor material formed by a chemical vapor deposition (CVD) technique. In another embodiment, the lower semiconductor pattern LSP may be formed of a semiconductor material having a polycrystalline structure, e.g., polycrystalline silicon.

According to an embodiment, a bottom surface of the lower semiconductor pattern LSP may be lower than a top surface of the substrate 100. Thus, a bottom end portion of the lower semiconductor pattern LSP may be inserted in the substrate 100. The insulating layer 112 adjacent to the lower semiconductor pattern LSP may be in direct contact with a sidewall of the lower semiconductor pattern LSP. The sidewall of the lower semiconductor pattern LSP may have a recessed region 146. The recessed region 146 may be adjacent to the lower gate pattern 155L. The recessed region 146 may be defined by incline-surfaces 146S inclined with respect to the top surface of the substrate 100.

For example, referring to FIGS. 19 and 20, the maximum width W2 of the lower semiconductor pattern LSP may be greater than the maximum width (i.e., an upper width) W1 of the upper semiconductor pattern USP. A distance T1 between vertically adjacent insulating layers 112 may be less than the maximum width W2 of the lower semiconductor pattern LSP. Here, the minimum width (i.e., a width at the recessed region 146) W3 of the lower semiconductor pattern LSP may be less than the upper width W1 of the upper semiconductor pattern USP. The minimum width W3 of the lower semiconductor pattern LSP may be determined depending on the distance T1 between the vertically adjacent insulating layers 112 and the maximum width W2 of the lower semiconductor pattern LSP. Thus, the distance T1 between the insulating layers 112 may be reduced and/or the maximum width W2 of the lower semiconductor pattern LSP may increase in order to ensure that the minimum width W3 of the lower semiconductor pattern LSP is secured. In an embodiment, the minimum width W3 of the lower semiconductor pattern LSP may correspond to or be about equal to a difference between the maximum width W2 of the lower semiconductor pattern LSP and the distance T1 between the vertically adjacent layers 112 (W3=W2−T1).

According to an embodiment, the recessed region 146 of the lower semiconductor pattern LSP may have a tapered wedge-shape by the incline-surfaces 146S adjacent to each other. In an embodiment, if the lower semiconductor pattern LSP is formed of silicon, the incline-surfaces 146S defining the recessed region 146 may be {111} crystal planes of silicon. A horizontal section of the lower semiconductor pattern LSP adjacent to the insulating layer 112 may have a circular shape, and a horizontal section of the lower semiconductor pattern LSP at which the recessed region 146 is formed may have a quadrilateral shape whose sides are parallel to <110> directions crossing each other.

Referring again to FIG. 18, a vertical insulator 121 may be disposed between the stack structure and the upper semiconductor pattern USP. The vertical insulator 121 may have a pipe-shape (or a macaroni-shape) of which a top end and a bottom end are opened. In an embodiment, the vertical insulator 121 may be in contact with the top surface of the lower semiconductor pattern LSP.

According to an embodiment, the vertical insulator 121 may include a memory element of a flash memory device. For example, the vertical insulator 121 may include a charge storage layer of the flash memory device. For example, the charge storage layer may include a trap insulating layer, or an insulating layer including conductive nano dots. Data stored in the vertical insulator 121 may be changed using Fowler-Nordheim (FN) tunneling caused by a voltage difference between the upper semiconductor pattern USP and the gate pattern. Alternatively, the vertical insulator 121 may include a thin layer capable of storing data by another operation principle. For example, the vertical insulator 121 may include a thin layer for a phase change memory element or a thin layer for a variable resistance memory element.

Figure 39:
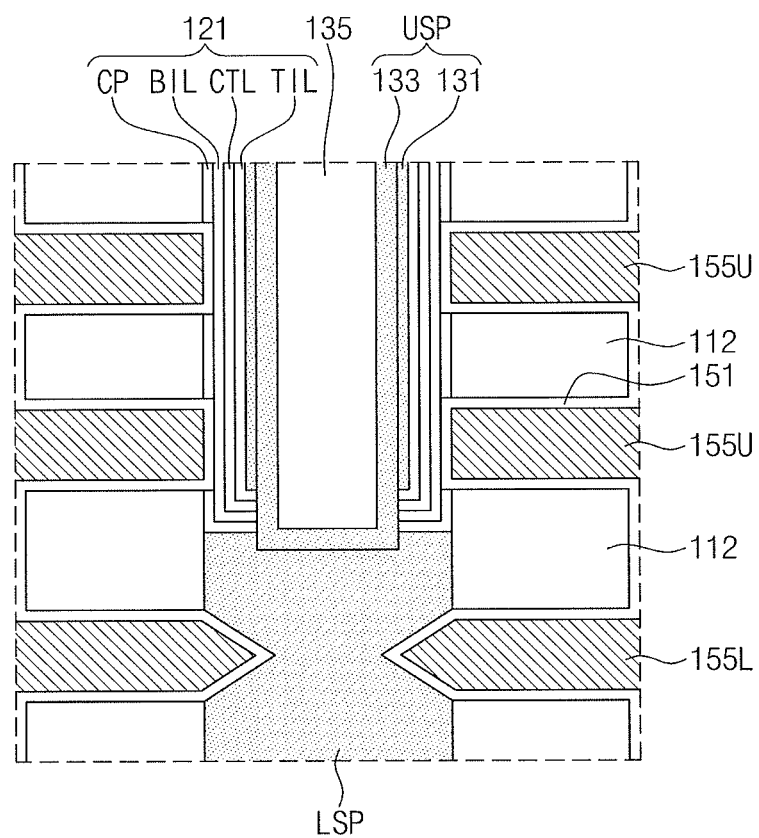
FIGS. 39 to 42 illustrate partial cross-sectional views of 3D semiconductor memory devices according to an embodiment.

According to an embodiment, the vertical insulator 121 may include the charge storage layer CTL and a tunnel insulating layer TIL, which are sequentially stacked. The tunnel insulating layer TIL may be in direct contact with the channel structure VCS (e.g., the upper semiconductor pattern USP), and the charge storage layer CTL may be disposed between the upper gate pattern 155U and the tunnel insulating layer TIL. According to another embodiment, the vertical insulator 121 may include a blocking insulating layer BIL, a charge storage layer CTL, and a tunnel insulating layer, which are sequentially stacked, as illustrated in FIG. 39. The tunnel insulating layer TIL may be in direct contact with the channel structure VCS (e.g., the upper semiconductor pattern USP), and the charge storage layer CTL may be disposed between the tunnel insulating layer TIL and the blocking insulating layer BIL.

The charge storage layer CTL may include a trap insulating layer, and/or an insulating layer including conductive nano dots. For example, the charge storage layer CTL may include at least one of a silicon nitride layer, a silicon oxynitride layer, a silicon-rich nitride layer, a nano-crystalline silicon layer, and a laminated trap layer. The tunnel insulating layer TIL may include at least one material having energy band gaps greater than that of the charge storage layer CTL. For example, the tunnel insulating layer TIL may include a silicon oxide layer. The blocking insulating layer BIL may include at least one material having energy band gaps greater than that of the charge storage layer CTL. For example, the blocking insulating layer BIL may include a silicon oxide layer.

Figure 35:
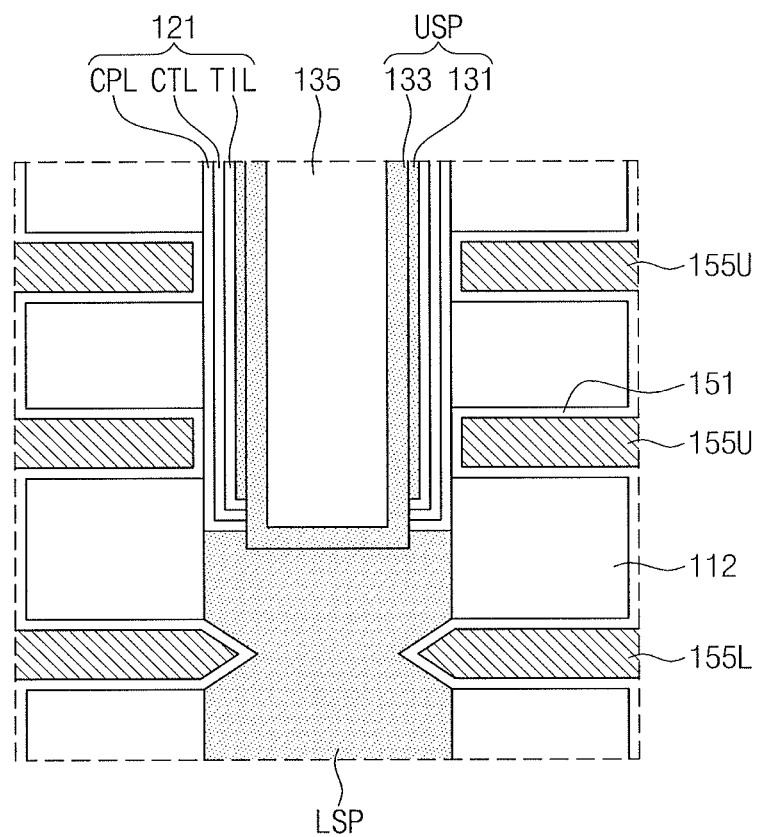

Meanwhile, the vertical insulator 121 may further include a capping layer pattern CP disposed between the upper semiconductor pattern USP and each of the insulating layers 112, as illustrated in FIGS. 19 and 39. The capping layer patterns CP may be in direct contact with the insulating layers 112 and may be vertically separated from each other by the upper gate patterns 155U. In another embodiment, a capping layer CPL may vertically extend to be disposed between the upper semiconductor pattern USP and the upper gate pattern 155U, as illustrated in FIG. 35. The capping layer pattern CP (or the capping layer CPL) may include an insulating material which has an etch selectivity with respect to the charge storage layer CTL and is different from the insulating layer 112. In an embodiment, the capping layer pattern CP (or the capping layer CPL) may include at least one of a silicon layer, a silicon oxide layer, a polysilicon layer, a silicon carbide layer, and a silicon nitride layer and is different from the insulating layer 112. In another embodiment, the capping layer pattern CP (or the capping layer CPL) may include a high-k dielectric material such as tantalum oxide ($Ta_2O_5$), titanium oxide ($TiO_2$), hafnium oxide ($HfO_2$), and/or zirconium oxide ($ZrO_2$).

Figure 38:
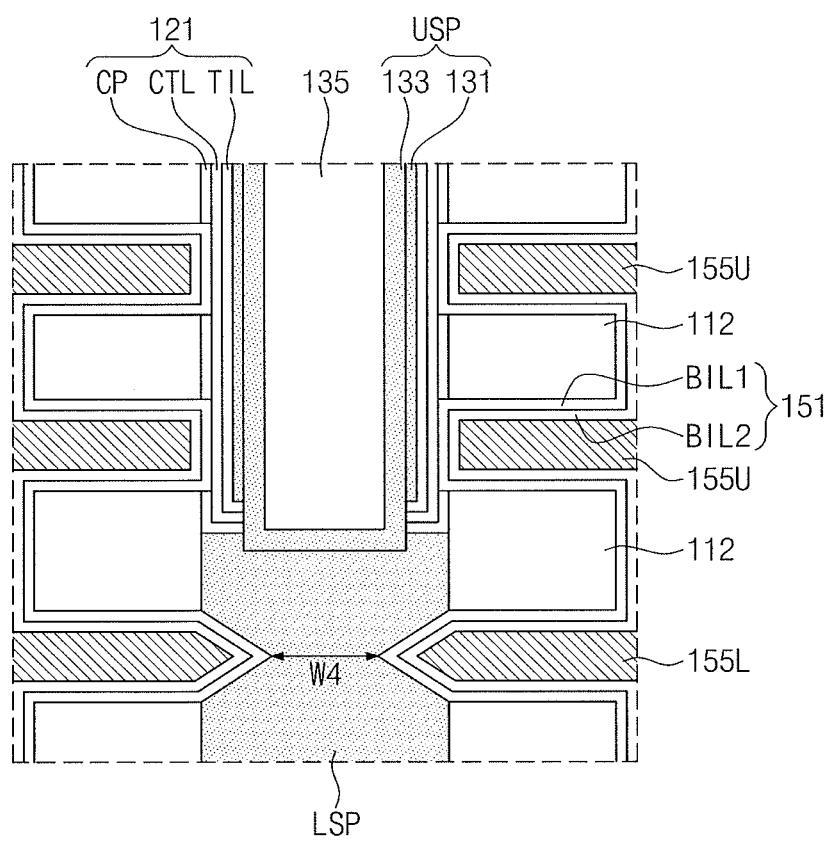
Figure 41:
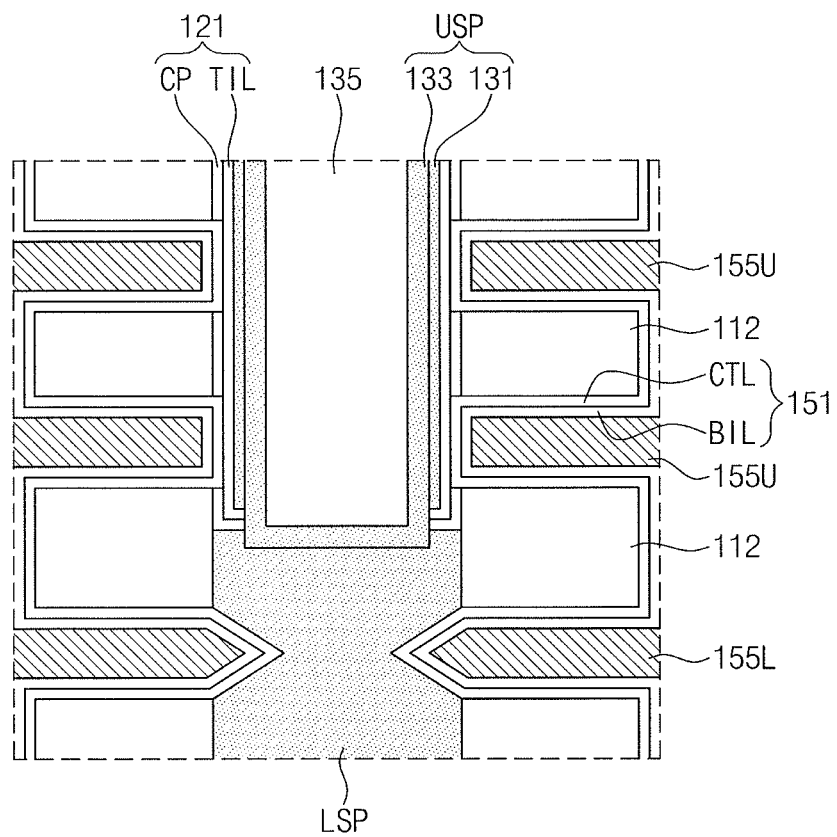

Referring to FIGS. 18 and 19, a horizontal insulator 151 may conformally cover top surfaces and bottom surfaces of the lower and upper gate patterns 155L and 155U. A portion of the horizontal insulator 151 may extend between the vertical insulator 121 and each of the upper gate patterns 155U. Another portion of the horizontal insulator 151 may extend between the lower semiconductor pattern LSP and each of the lower gate patterns 155L. The horizontal insulator 151 may include a single thin layer or a plurality of thin layers. In an embodiment, the horizontal insulator 151 may include a blocking insulating layer of a charge trap type flash memory element, as illustrated in FIG. 19. In another embodiment, the horizontal insulator 151 may include a plurality of blocking insulating layers BIL1 and BIL2, as illustrated in FIG. 38. In still another embodiment, the horizontal insulator 151 may include the charge storage layer CTL and the blocking insulating layer BIL of the charge trap type flash memory element, as illustrated in FIG. 41.

An electrode isolation pattern 160 may fill a space between the stack structures. For example, the electrode isolation pattern 160 may be disposed between the lower gate patterns 155L horizontally adjacent to each other and between the upper gate patterns 155U horizontally adjacent to each other. The electrode isolation pattern 160 may be formed of an insulating material and may cover the common source region 107. Additionally, the bit lines 175 may cross over the stack structure. The bit lines 175 may be connected to the conductive pads 137 disposed on the upper semiconductor patterns USP through contact plugs 171.

FIGS. 22 to 30 illustrate cross-sectional views of stages in a method for fabricating a 3D semiconductor memory device according to an embodiment. FIGS. 31 to 35 illustrate partial cross-sectional views of stages in a method for fabricating a 3D semiconductor memory device according to an embodiment.

Figure 22:
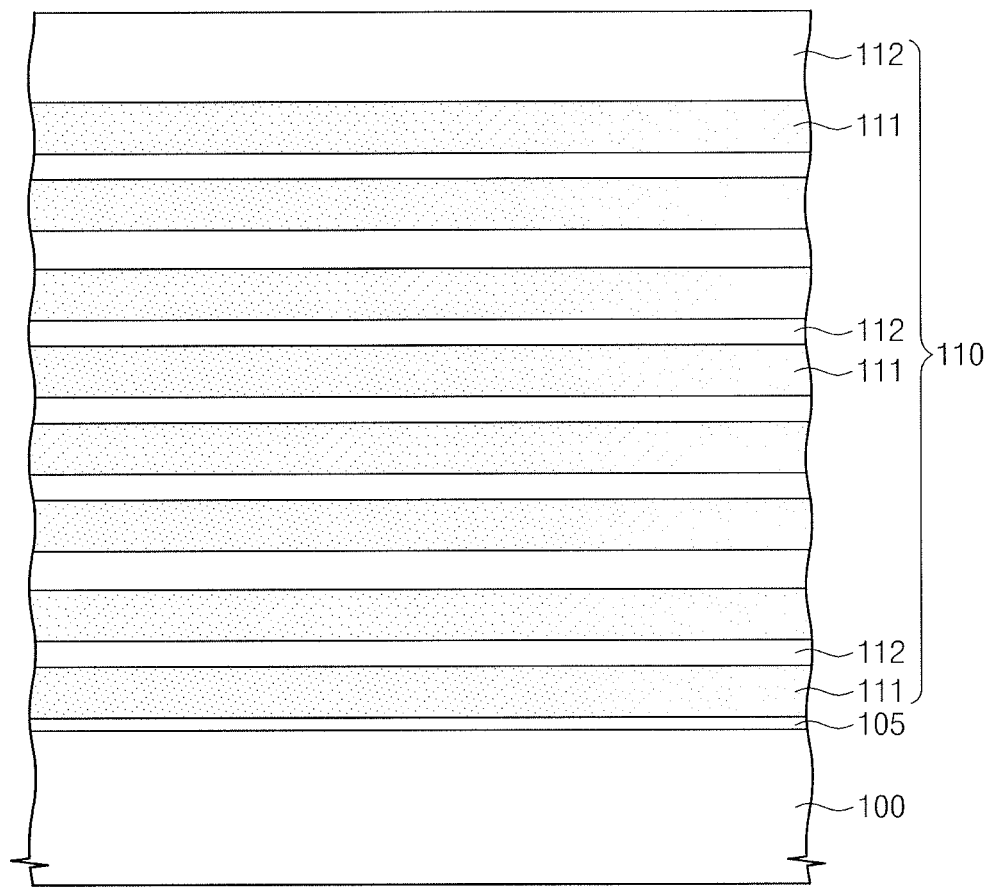
FIGS. 22 to 30 illustrate cross-sectional views of stages in a method for fabricating a 3D semiconductor memory device according to an embodiment.

Referring to FIG. 22, sacrificial layers 111 and insulating layers 112 may be alternately and repeatedly stacked on a substrate 100 to form a multi-layered structure 110.

The substrate 100 may include at least one of materials having semiconductor properties, insulating materials, and a semiconductor or conductor covered by an insulating material. For example, the substrate 100 may be a silicon substrate, a germanium substrate, or a silicon-germanium substrate.

The sacrificial layers 111 may be formed of a material having an etch selectivity with respect to the insulating layers 112. In an embodiment, the sacrificial layers 111 and the insulating layers 112 may have a high etch selectivity with respect to each other in a wet etching process using a chemical solution, but may have a low etch selectivity with respect to each other in a dry etching process using an etching gas.

In an embodiment, thicknesses of the sacrificial layers 111 may have substantially equal to each other. In another embodiment, a lowermost one and an uppermost one of the sacrificial layers 111 may be thicker than other one of the sacrificial layers 111 therebetween. Thicknesses of the insulating layer 112 may be substantially equal to each other. Alternatively, at least one of the insulating layers 112 may have a thickness different from those of other ones of the insulating layers 112.

The sacrificial layers 111 and the insulating layers 112 may be deposited using a thermal chemical vapor deposition (thermal CVD) technique, a plasma enhanced-CVD (PE-CVD) technique, a physical CVD technique, and/or an atomic layer deposition (ALD) technique.

In an embodiment, the sacrificial layers 111 and the insulating layers 112 may be formed of insulating materials, and the sacrificial layers 111 may have an etch selectivity with respect to the insulating layers 112. For example, each of the sacrificial layers 111 may include at least one of a silicon layer, a silicon oxide layer, a silicon carbide layer, a silicon nitride layer, and a silicon oxynitride layer. The insulating layers 112 may include at least one of a silicon layer, a silicon oxide layer, a silicon carbide layer, a silicon nitride layer, and a silicon oxynitride layer. For example, the insulating layers 112 may include a material different from the sacrificial layers 111. In an embodiment, the sacrificial layers 111 may be formed of silicon nitride layers, and the insulating layers 112 may be formed of silicon oxide layers. In another embodiment, the sacrificial layers 111 may be formed of a conductive material, and the insulating layers 112 may be formed of an insulating material.

A lower insulating layer 105 may be formed between the substrate 100 and the multi-layered structure 110. For example, the lower insulating layer 105 may be a silicon oxide layer formed by a thermal oxidation process. Alternatively, the lower insulating layer 105 may be a silicon oxide layer formed by a deposition technique. The lower insulating layer 105 may be thinner than the sacrificial layers 111 and the insulating layers 112 formed thereon.

Figure 23:
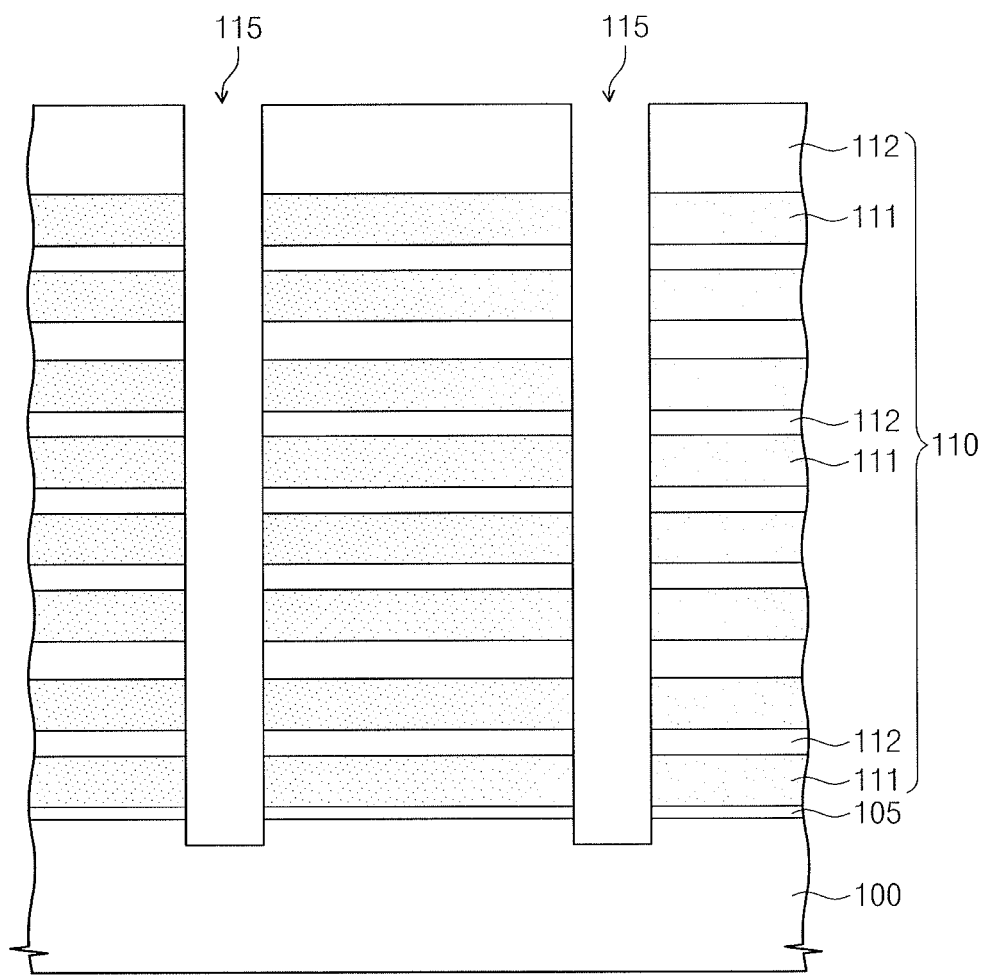

Referring to FIG. 23, openings 115 may be formed to penetrate the multi-layered structure 110. The openings 115 may expose the substrate 100.

According to the present embodiment, the openings 115 may be formed to have hole-shapes. A depth of the opening 115 may be five or more times greater than a width of the opening 115. Additionally, the openings 115 may be two-dimensionally arranged on a top surface of the substrate 100 (i.e., an x-y plane) in a plan view. For example, the openings 115 may be arranged along an x-direction and a y-direction in a plan view and may be spaced apart from each other. In another embodiment, as illustrated in FIG. 21, the openings 115 may be arranged in a zigzag form along the y-direction. In this case, a distance between the openings 115 adjacent to each other may be equal to or less than the width of the opening 115.

A mask pattern (not shown) may be formed on the multi-layered structure 110, and then the multi-layered structure 110 may be anisotropically etched using the mask pattern (not shown) as an etch mask, thereby forming the openings 115. The top surface of the substrate 100 may be over-etched during the anisotropic etching process for the openings 115. Thus, portions of the substrate 100 exposed by the openings 115 may be recessed by a predetermined depth. In an implementation, a lower width of the opening 115 may be narrower than an upper width of the opening 115 by the anisotropic etching process.

Figure 24:
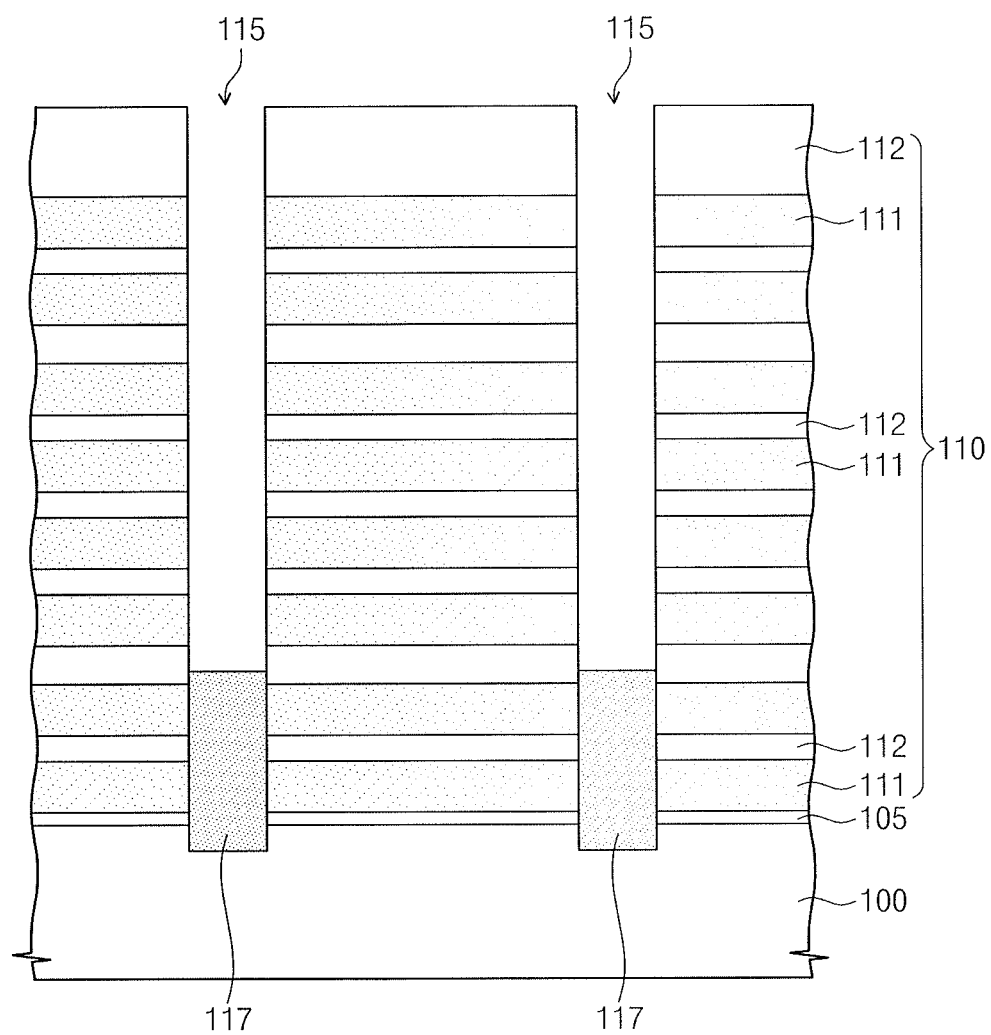

Referring to FIG. 24, a lower semiconductor layer 117 may be formed to fill a lower region of each opening 115.

The lower semiconductor layer 117 may be in direct contact with the sacrificial layers 111 and the insulating layers 112 disposed in a lower portion of the multi-layered structure 110. The lower semiconductor layer 117 may cover a sidewall of at least one sacrificial layer 111. A top surface of the lower semiconductor layer 117 may be disposed at a level between the sacrificial layers 111 vertically adjacent to each other.

For example, the lower semiconductor layer 117 may be formed by a selective epitaxial growth (SEG) process using the substrate 100 exposed by each opening 115 as a seed. Thus, the lower semiconductor layer 117 may have a pillar-shape filling the lower region of each opening 115 and an etched region of the substrate 100. In this case, the lower semiconductor layer 117 may have a single-crystalline structure, or a polycrystalline structure having a grain size greater than that of a semiconductor layer formed by a chemical vapor deposition (CVD) technique. On the other hand, the lower semiconductor layer 117 may be formed of silicon. However, the embodiments are not limited thereto. In other embodiments, carbon nano structures, organic semiconductor materials, and/or compound semiconductors may be used for the lower semiconductor layer 117. In still other embodiments, the lower semiconductor layer 117 may be formed of a semiconductor material having a polycrystalline structure, e.g., polycrystalline silicon.

In an embodiment, the lower semiconductor layer 117 may be formed by a SEG process using a single-crystalline silicon substrate 100 having one of <100> directions as a seed. In this case, the top surface of the lower semiconductor layer 117 may have the <100> direction.

Additionally, the lower semiconductor layer 117 may have the same conductivity type as the substrate 100. The lower semiconductor layer 117 may be doped with dopants in-situ during the SEG process. Alternatively, after the lower semiconductor layer 117 is formed, dopant ions may be implanted into the lower semiconductor layer 117.

Figure 25:
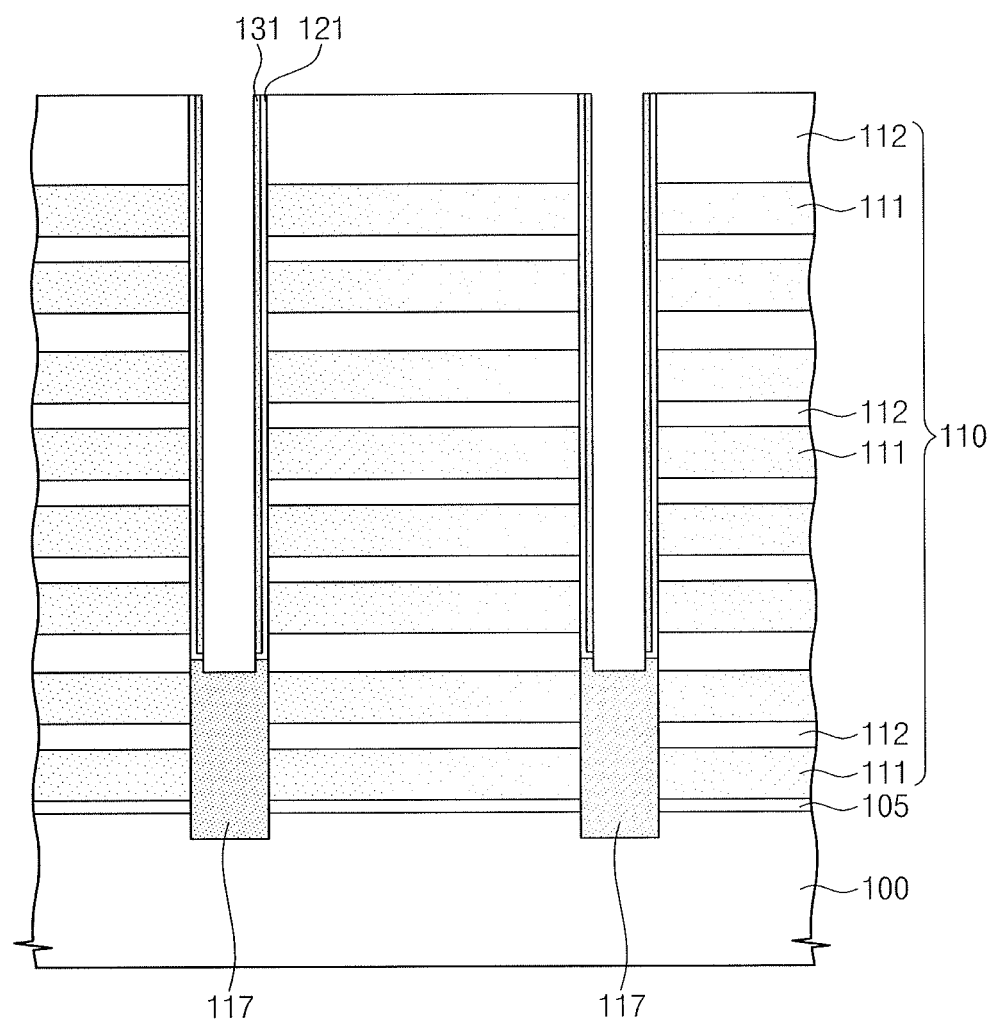
Figure 31:
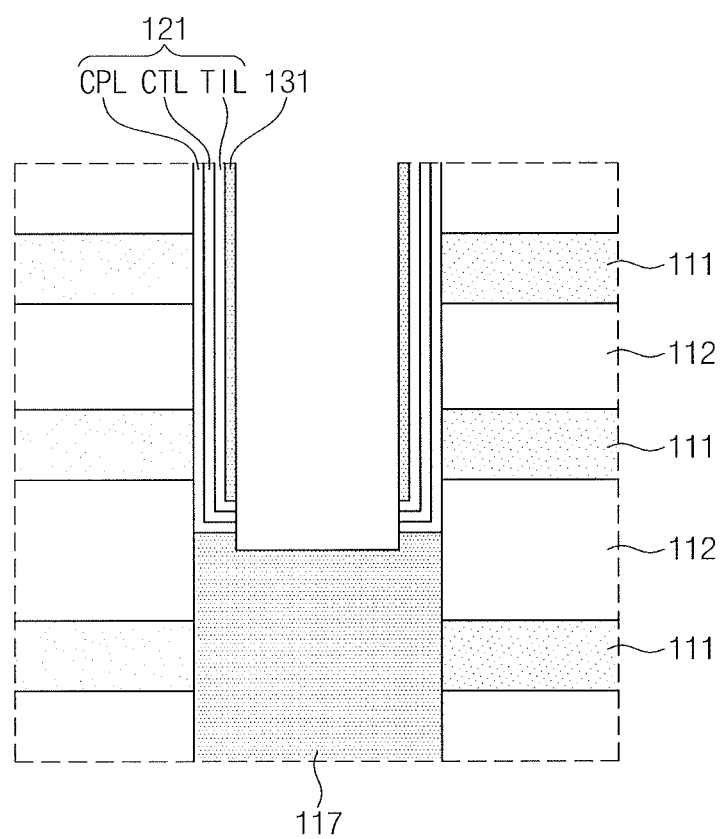
FIGS. 31 to 35 illustrate partial cross-sectional views of stages in a method for fabricating a 3D semiconductor memory device according to an embodiment.

Referring to FIGS. 25 and 31, a vertical insulator 121 and a first semiconductor pattern 131 may be formed in each of the openings 115. The vertical insulator 121 and the first semiconductor pattern 131 may cover an inner sidewall of the opening 115 and may expose the top surface of the lower semiconductor layer 117.

For example, a vertical insulating layer and a first semiconductor layer may be sequentially formed to cover inner sidewalls of the openings 115 having the lower semiconductor layers 117. The vertical insulating layer and the first semiconductor layer may partially fill the opening s 115. A sum of deposition thicknesses of the vertical insulating layer and the first semiconductor layer may be less than a half of the width of the opening 115. Thus, the openings 115 may not be completely filled with the vertical insulating layer and the first semiconductor layer. Additionally, the vertical insulating layer may cover the top surfaces of the lower semiconductor layers 117 exposed by the openings 115. The vertical insulating layer may include a plurality of thin layers. The vertical insulating layer may be deposited by a PE-CVD technique, a physical CVD technique, and/or an ALD technique.

The vertical insulating layer may include a charge storage layer used as a memory element of a flash memory device. For example, the charge storage layer may be a trap insulating layer, or an insulating layer including conductive nano dots. Alternatively, the vertical insulating layer may include a thin layer for a phase change memory element or a thin layer for a variable resistance memory element.

In an embodiment, as illustrated in FIG. 31, the vertical insulating layer may include a capping layer CPL, a charge storage layer CTL, and a tunnel insulating layer TIL, which are sequentially stacked. The capping layer CPL may cover sidewalls of the sacrificial layers 111 and the insulating layer 112 and the top surface of the lower semiconductor layer 117, which are exposed by the opening. The capping layer CPL may be formed of a material having an etch selectivity with respect to the sacrificial layer 111 and the charge storage layer CTL. For example, the capping layer CPL may be formed of a high-k dielectric layer such as a tantalum oxide ($Ta_2O_5$) layer, a titanium oxide ($TiO_2$) layer, a hafnium oxide ($HfO_2$) layer, and/or a zirconium oxide ($ZrO_2$) layer. The charge storage layer CTL may be a trap insulating layer, or an insulating layer including conductive nano dots. For example, the charge storage layer CTL may include at least one of a silicon nitride layer, a silicon oxynitride layer, a silicon-rich nitride layer, a nano-crystalline silicon layer, and a laminated trap layer. The tunnel insulating layer TIL may include materials having energy band gaps greater than that of the charge storage layer CTL. For example, the tunnel insulating layer TIL may include a silicon oxide layer.

The first semiconductor layer may be conformally formed on the vertical insulating layer. In an embodiment, the first semiconductor layer may be formed by an ALD technique or a CVD technique. For example, the first semiconductor layer may be a polycrystalline silicon layer, a single-crystalline silicon layer, or an amorphous silicon layer.

After the vertical insulating layer and the first semiconductor layer are sequentially formed, the first semiconductor layer and the vertical insulating layer on the top surface of the lower semiconductor layer 117 may be anisotropically etched to expose the top surface of the lower semiconductor layer 117. Thus, the vertical insulator 121 and the first semiconductor pattern 131 may be formed on the inner sidewall of the opening 115. For example, each of the vertical insulator 121 and the first semiconductor pattern 131 may have a cylindrical shape having opened top and bottom ends. Additionally, the top surface of the lower semiconductor layer 117 (exposed by the first semiconductor pattern 131) may be recessed by over-etching during the anisotropic etching process of the first semiconductor layer and the vertical insulating layer.

Meanwhile, a portion of the vertical insulating layer under the first semiconductor pattern 131 may not be etched during the anisotropic etching process. In this case, the vertical insulator 121 may have a bottom part disposed between a bottom surface of the first semiconductor pattern 131 and the top surface of the lower semiconductor layer 117.

Additionally, a top surface of the multi-layered structure 110 may be exposed by the anisotropic etching process performed on the first semiconductor layer and the vertical insulating layer. Thus, the vertical insulator 121 and the first semiconductor pattern 131 may be confinedly formed in each of the openings 115. For example, the vertical insulators 121 and the first semiconductor patterns 131 in the openings 115 may be two-dimensionally arranged in a plan view.

Figure 42:
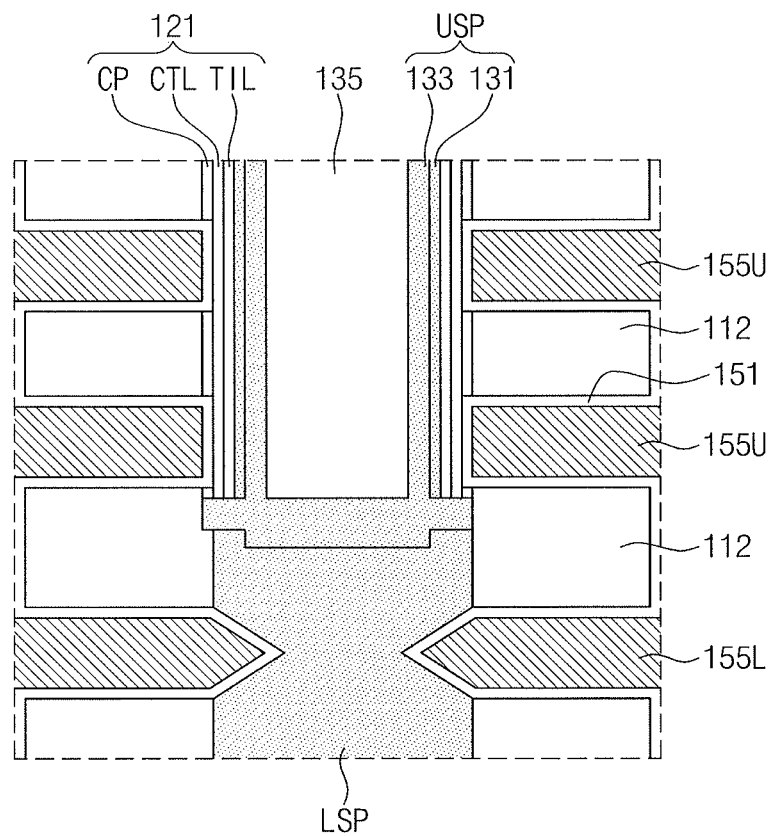

On the other hand, after the vertical insulator 121 is formed, the bottom part of the vertical insulator 121 may be removed according to an embodiment illustrated in FIG. 42. For example, the bottom part of the vertical insulator 121 (disposed between the first semiconductor pattern 131 and the lower semiconductor layer 117) may be isotropically etched to form an undercut region. Thus, a vertical length of the vertical insulator 121 may be reduced, and the vertical insulator 121 may be spaced apart from the lower semiconductor layer 117, as illustrated in FIG. 42. The undercut region may be filled with a second semiconductor pattern 133 formed in a subsequent process.

Figure 26:
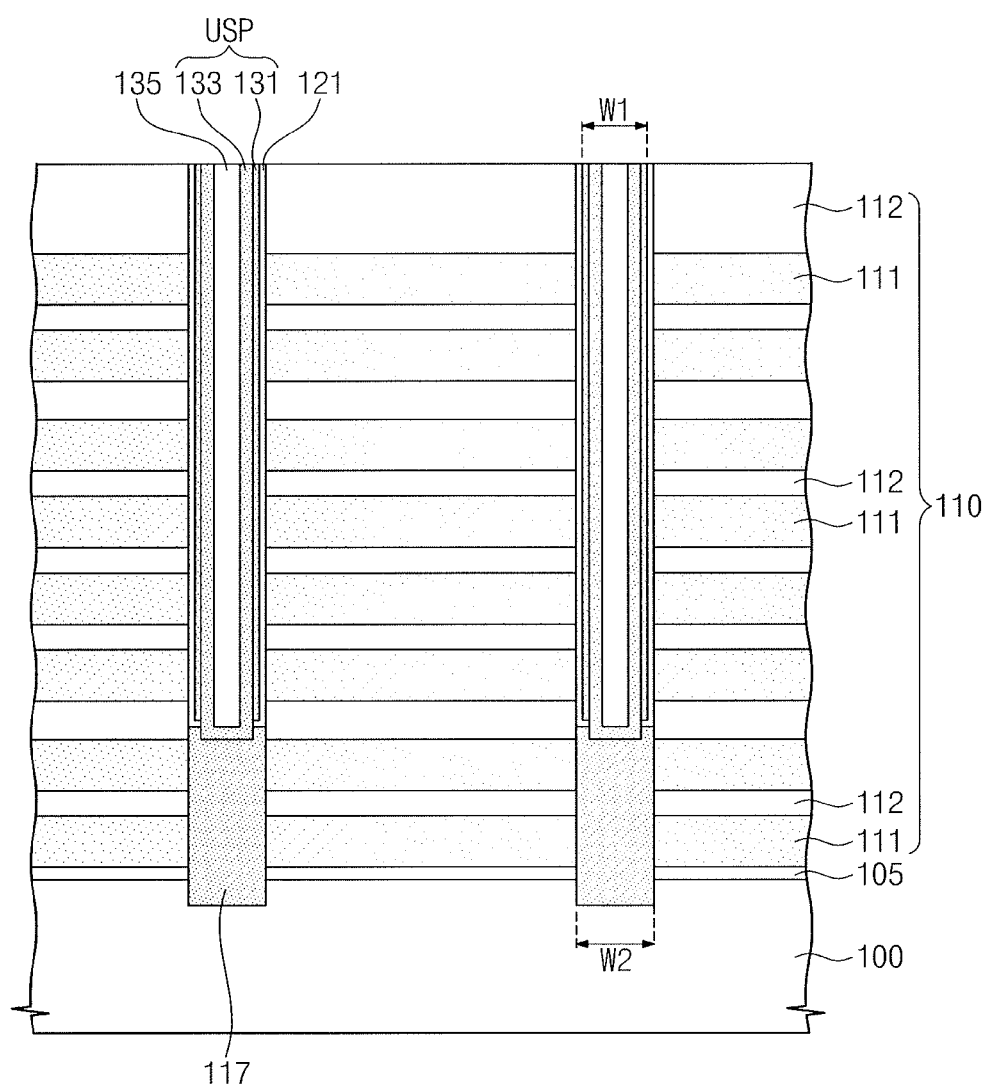
Figure 32:
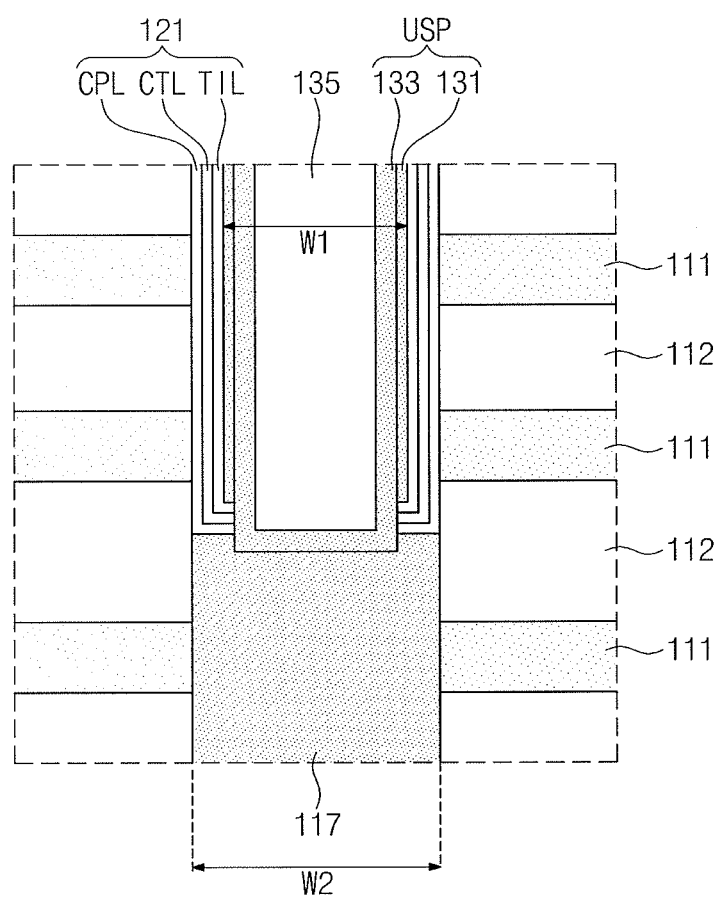

Referring to FIGS. 26 and 32, a second semiconductor pattern 133 and a filling insulating pattern 134 may be formed on the substrate 100 having the vertical insulator 121 and the first semiconductor pattern 131.

For example, a second semiconductor layer and a filling insulation layer may be sequentially formed to fill the openings 115 having the vertical insulators 121 and the first semiconductor patterns 131 therein. Subsequently, the second semiconductor layer and the filling insulation layer may be planarized until the top surface of the multi-layered structure 110 is exposed, thereby forming the second semiconductor pattern 133 and the filling insulation pattern 135.

The second semiconductor layer may be conformally formed in the openings 115. The second semiconductor layer may electrically connect the lower semiconductor layer 117 to the first semiconductor pattern 131. The second semiconductor layer may be formed by an ALD technique or a CVD technique. The second semiconductor layer may be a polycrystalline silicon layer, a single-crystalline silicon layer, or an amorphous silicon layer.

The second semiconductor pattern 133 may be formed to have a pipe-shape, a hollow cylindrical shape, or a cup shape, in each of the openings 115. In another embodiment, the second semiconductor pattern 133 may be formed to have a pillar-shape filling the opening 115.

The filling insulation pattern 135 may fill the opening 115 in which the second semiconductor pattern 133 is formed. The filling insulation pattern 135 may include at least one of silicon oxide and insulating materials formed using a spin-on glass (SOG) technique.

The first and second semiconductor patterns 131 and 133 may constitute an upper semiconductor pattern USP disposed on the lower semiconductor layer 117. The upper semiconductor pattern USP is formed in the opening 115 having the vertical insulator 121. Thus, the maximum width W1 (i.e., an upper width) of the upper semiconductor pattern USP may be less than the maximum width W2 of the lower semiconductor layer 117.

Figure 27:
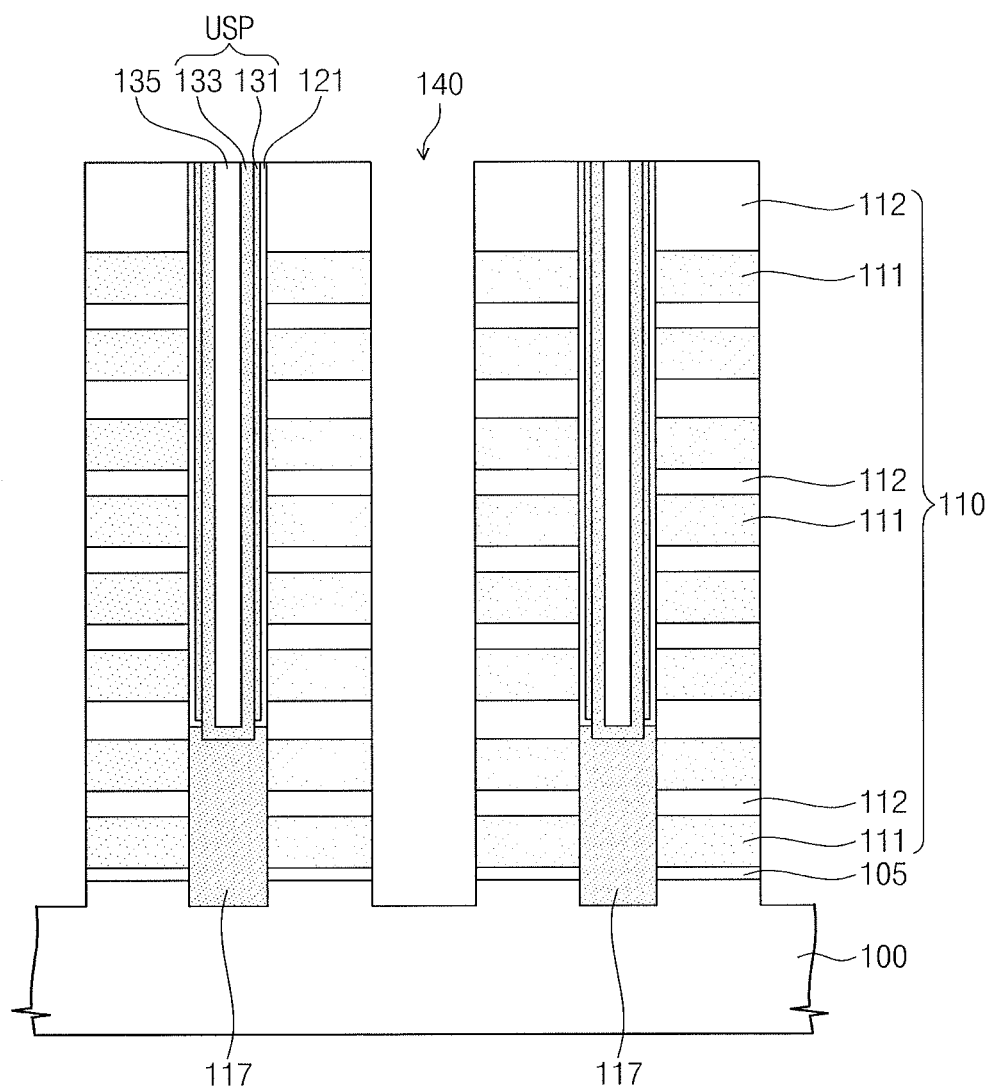

Referring to FIG. 27, the multi-layered structure 110 may be patterned to form trenches 140 exposing the substrate 100 between the openings 115.

For example, a mask pattern (not shown) defining the trenches 140 may be formed on the multi-layered structure 110, and then the multi-layered structure 110 may be anisotropically etched using the mask pattern as an etch mask to form the trenches 140.

The trenches 140 may be spaced apart from the first and second semiconductor patterns 131 and 133, and may expose sidewalls of the sacrificial layers 111 and the insulating layers 112. Each of the trenches 140 may have a linear shape or a rectangular shape in a plan view. The trenches 140 may expose a surface, e.g., a top surface, of the substrate 100 in a cross-sectional view. The surface of the substrate 100 exposed by the trenches 130 may be recessed by over-etching during the formation of the trenches 140. Additionally, the trench 140 may have different widths from each other according to a distance from the substrate 100 by the anisotropic etching process.

The multi-layered structure 110 may have a linear shape extending in one direction when viewed from a plan view due to the presence of the trenches 140. A plurality of the upper semiconductor patterns USP may penetrate one multi-layered structure 110 having the linear shape.

Figure 28:
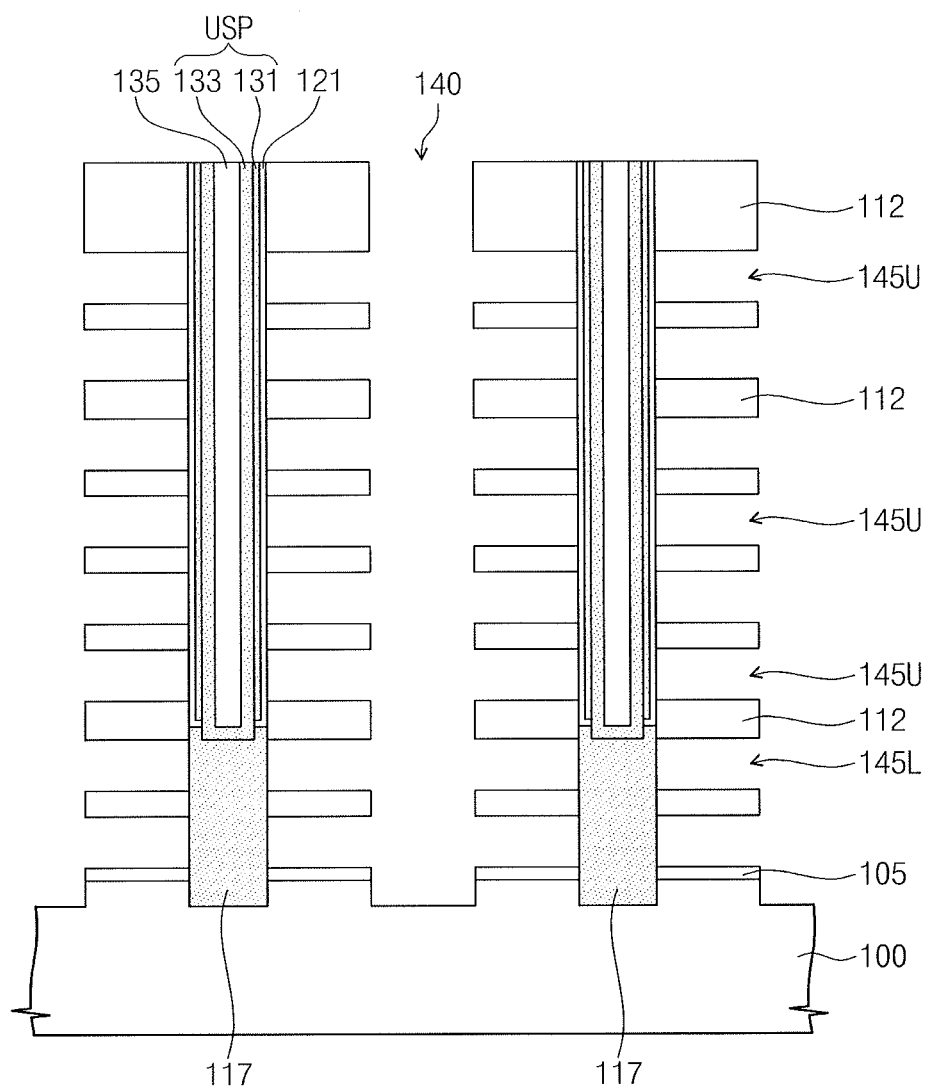
Figure 33:
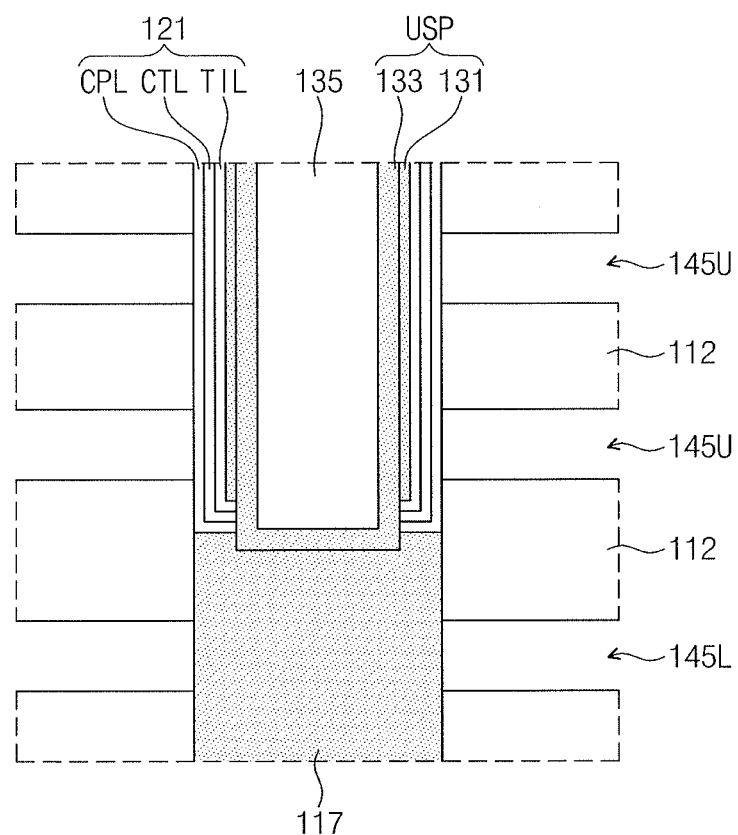

Referring to FIGS. 28 and 33, the sacrificial layers 111 exposed by the trenches 140 may be removed to form lower and upper gate regions 145L and 145U between the insulating layers 112.

For example, the sacrificial layers 111 may be isotropically etched using an etch-recipe or etchant having an etch selectivity with respect to the insulating layers 112, the vertical insulators 121, the lower semiconductor layers 117, and the substrate 100, thereby forming the lower and upper gate regions 145L and 145U. At this time, the sacrificial layers 111 may be completely removed by the isotropic etching process. For example, if the sacrificial layers 111 are silicon nitride layers and the insulating layers 112 are silicon oxide layers, the isotropic etching process for the removal of the sacrificial layers 112 may be performed using an etching solution including phosphoric acid.

The lower gate regions 145L may horizontally extend from the trench 140 between the insulating layers 112 and may expose portions of a sidewall of the lower semiconductor layer 117, respectively. The upper gate regions 145U may horizontally extend from the trench 140 between the insulating layers 112 and may expose portions of a sidewall of the vertical insulator 121, respectively. For example, each of the lower gate regions 145L may be defined by the insulating layers 112 vertically adjacent to each other and the sidewall of the lower semiconductor layer 117. Each of the upper gate regions 145U may be defined by the insulating layers 112 vertically adjacent to each other and the sidewall of the vertical insulator 121. Additionally, according to the embodiment illustrated in FIG. 33, the capping layer CPL may be used as an etch stop layer during the isotropic etching process for the formation of the upper gate regions 145U. Thus, the capping layer CPL may help prevent the charge storage layer CTL from being damaged by the etching solution used in the isotropic etching process. For example, the upper gate regions 145U may expose the capping layer CPL of the vertical insulator 121.

In an embodiment, a vertical height of each of the lower and upper gate regions 145L and 145U may be less than a maximum width of the lower semiconductor layer 117. The vertical heights of the lower and upper gate regions 145L and 145U may be substantially equal to the thicknesses of the sacrificial layers 111, respectively. The vertical heights of the lower and upper gate regions 145L and 145U may be substantially equal to each other. In another embodiment, the vertical height of the lower gate region 145L may be greater than the vertical height of the upper gate region 145U.

Figure 29:
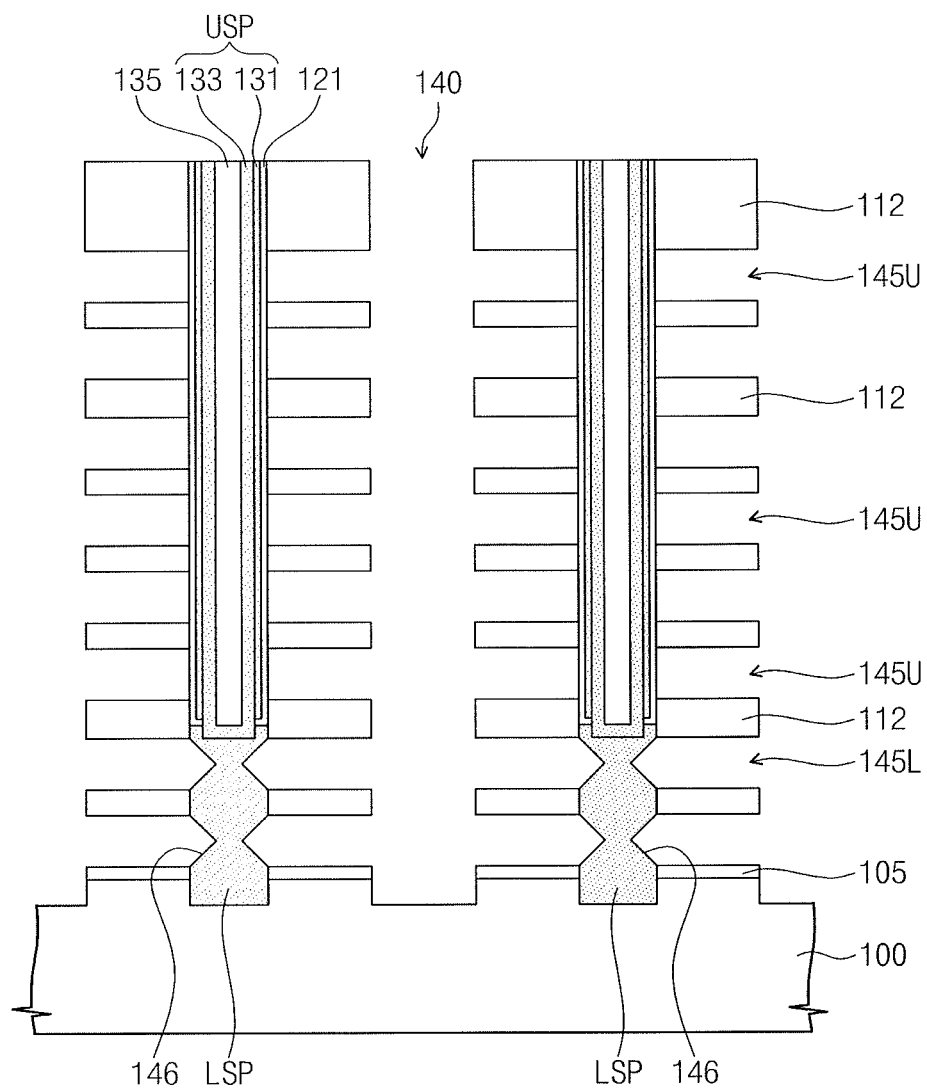
Figure 34:
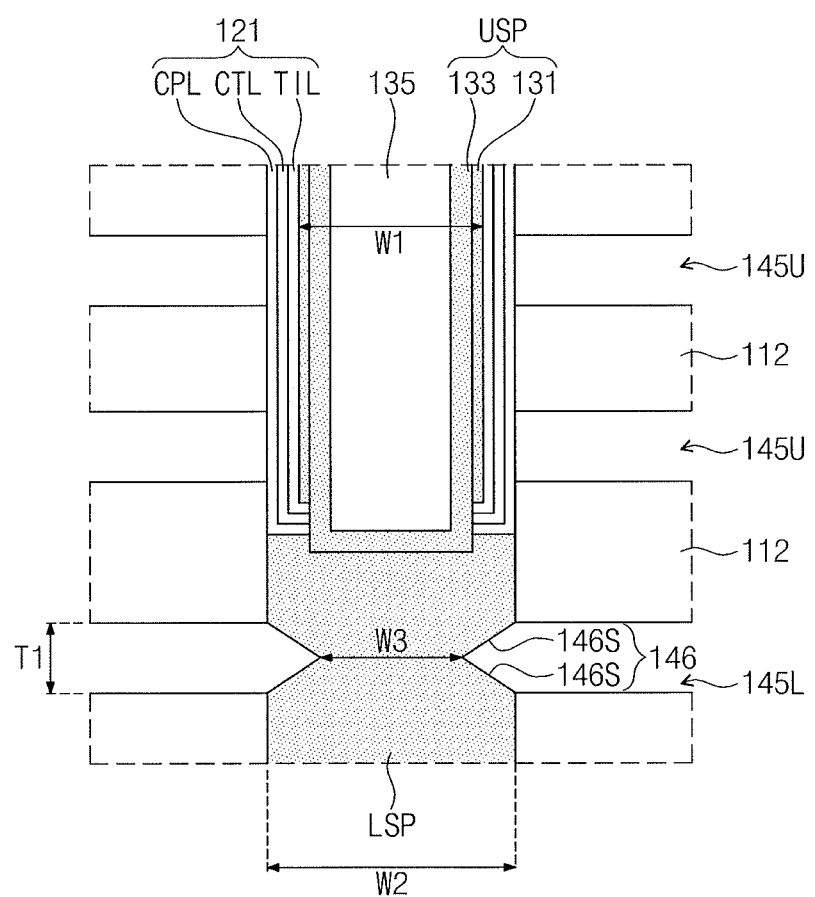

Referring to FIGS. 29 and 34, the sidewall of the lower semiconductor layer 117 exposed by the lower gate regions 145L may be recessed to form a lower semiconductor pattern LSP having recessed regions 146.

In an embodiment, forming the recess regions 146 at the lower semiconductor layer 117 may include selectively etching the sidewall of the lower semiconductor layer 117 exposed by the lower gate regions 145L. Here, the etching process for the formation of the recessed region 146 may use an etch-recipe or etchant having an etch rate varied according to a crystal direction of a semiconductor material. Thus, the recessed region 146 may be defined by incline-surfaces 146S inclined with respect to the top surface of the substrate 100. The recessed region 146 may have a tapered wedge-shape due to the incline-surfaces 146S. In an embodiment, the incline-surfaces 146S defining the recessed region 146 may be {111} crystal planes of silicon. Additionally, a horizontal section of the lower semiconductor pattern LSP (at which the recessed region 146 is formed) may have a quadrilateral shape whose sides are parallel to the <110> directions crossing each other, as illustrated in FIG. 20.

For example, the recessed region 146 may be formed by a gas phase etching process or chemical dry etching process using an etchant including a halogen containing reaction gas. The halogen containing reaction gas may include at least one of HCl, $Cl_2$, $NF_3$, $ClF_3$, and $F_2$. Alternatively, the recessed region 146 may be formed by a wet anisotropic etching process using an etching solution such as an organic alkali etchant (e.g., tetramethyl ammonium hydroxide (TMAH)) or ammonium hydroxide ($NH_4OH$).

When the lower semiconductor layer 117 formed of silicon is selectively etched, the etch rate of the lower semiconductor layer 117 may be varied according to a crystal plane and a crystal direction of silicon. In an embodiment, when the exposed sidewall of the lower semiconductor layer 117 is etched using the halogen containing reaction gas, the etch rate in <111> directions may be greater than the etch rate in <110> directions. In this case, the etching process may be stopped at the {111} crystal planes. Thus, the {111} crystal planes of the lower semiconductor pattern LSP may be exposed. For example, the recessed region 146 may be defined by the {111} crystal planes and may have the tapered wedge-shape by two incline-surfaces 146S having the {111} crystal planes.

In another embodiment, when the lower semiconductor layer 117 formed of silicon is isotropically etched using ammonium hydroxide ($NH_4OH$), the etch rate of the lower semiconductor layer 117 may be the minimum at the {111} crystal planes and the etch rate of the lower semiconductor layer 117 may be the maximum at {100} crystal planes. Thus, inner surfaces of the recessed region 146 may have the {111} crystal planes at which the each rate is the minimum. Additionally, the recessed region 146 may have the tapered wedge-shape by two inner surfaces of the {111} crystal planes.

The inner surfaces of the recessed region 146 may have defects by the etching process. Thus, after the recessed region 146 is formed, a cleaning process using $O_3$ and HF may be performed to remove the defects of the inner surfaces of the recessed region 146.

As noted above, the lower semiconductor pattern LSP is formed to have the recessed region 146. Thus, the minimum width W3 of the lower semiconductor pattern LSP may be less than the upper width W1 of the upper semiconductor pattern USP. In an embodiment, a depth (i.e., a lateral depth) of the recessed region 146 may be determined depending on a distance T1 between the vertically adjacent insulating layers 112 (i.e., a height T1 of the lower gate region 145L) and the maximum width W2 of the lower semiconductor pattern LSP. For example, the depth of the recessed region 146 may correspond to about a half of the height T1 of the lower gate region 145L. For example, the minimum width W3 of the lower semiconductor pattern LSP may correspond to or equal a difference between the maximum width W2 of the lower semiconductor pattern LSP and the height T1 of the lower gate region 145L.

Figure 30:
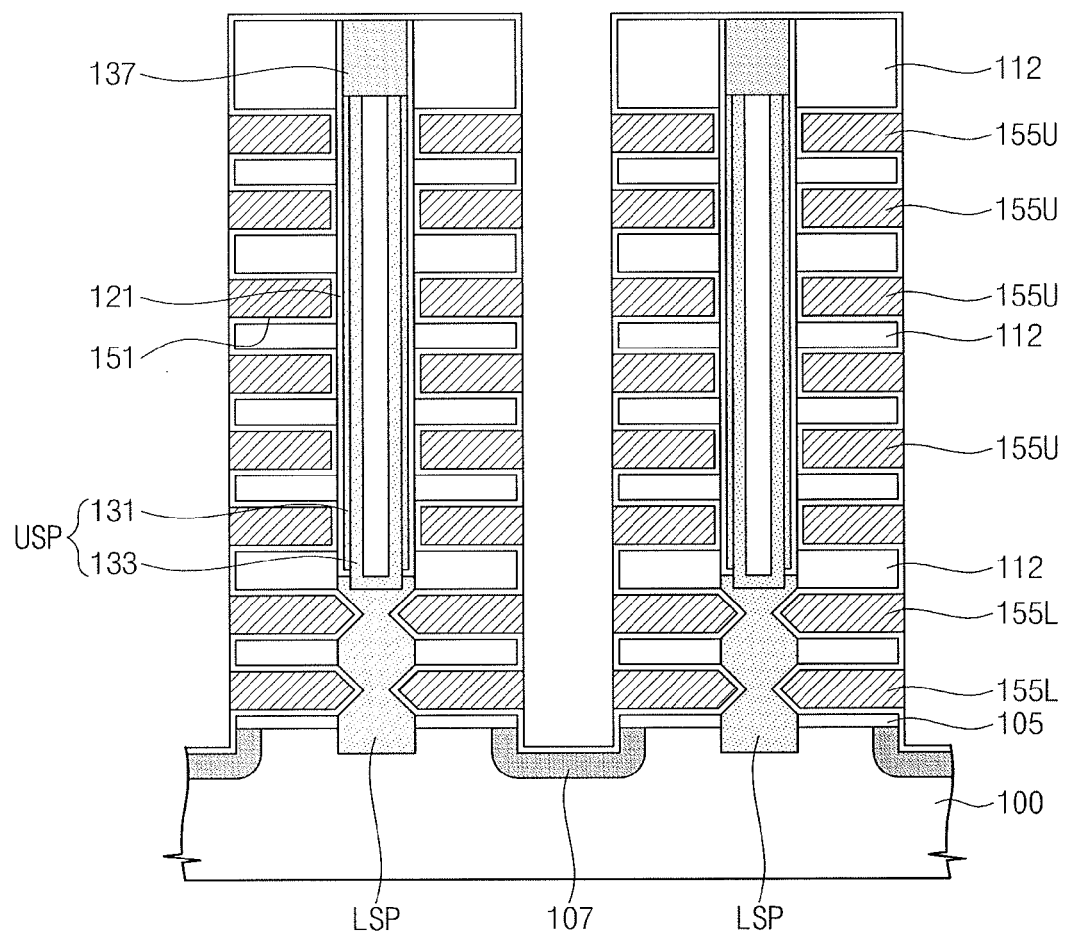

Referring to FIGS. 30 and 35, a horizontal insulating layer 151 may be formed to cover inner surfaces of the lower and upper gate regions 145L and 145U, and lower and upper gate patterns 155L and 155U may be formed to fill remaining spaces of the lower and upper gate regions 145L and 145U, respectively.

For example, a horizontal insulating layer 151 and a conductive layer may be sequentially formed to cover the inner surfaces of the lower and upper gate regions 145L and 145U. Then, the conductive layer outside the lower and upper gate regions 145L and 145U may be removed to confinedly form the lower and upper gate patterns 155L and 155U in the lower and upper gate regions 145L and 145U, respectively.

In an embodiment, the horizontal insulating layer 151 may be in direct contact with the vertical insulator 121 in the upper gate regions 145U. In an embodiment, as illustrated in FIG. 35, the horizontal insulating layer 151 may be in direct contact with the capping layer CPL of the vertical insulator 121. The horizontal insulating layer 151 may be in direct contact with the lower semiconductor pattern LSP in the lower gate regions 145L. For example, the horizontal insulating layer 151 may conformally cover the recessed regions 145 of the lower semiconductor pattern LSP in the lower gate regions 145L. The horizontal insulating layer 151 may include a single thin layer or a plurality of thin layers, similarly to the vertical insulating layer. In an embodiment, the horizontal insulating layer 151 may include a blocking insulating layer BIL of a charge trap type flash memory element. The blocking insulating layer BIL may include a material having an energy band gap less than that of the tunnel insulating layer TIL and greater than that of the charge storage layer CTL. For example, the blocking insulating layer BIL may include at least one of high-k dielectric layers such as an aluminum oxide layer and a hafnium oxide layer.

In an embodiment, the conductive layer may fill the lower and upper gate regions 145L and 145U and may conformally cover an inner surface of the trench 140. In this case, the conductive layer in the trenches 140 may be isotropically etched to form the lower and upper gate patterns 155L and 155U. In another embodiment, the conductive layer may also fill the trenches 140. In this case, the conductive layer in the trenches 140 may be anisotropically etched to form the lower and upper gate patterns 155L and 155U. According to an embodiment, the upper gate patterns 155U may be formed in the upper gate regions 145U, respectively, and the lower gate patterns 155L may be formed in the lower gate regions 145L, respectively. Here, the lower gate patterns 155L may fill the recessed regions 146 of the lower semiconductor pattern LSP. Thus, the lower gate patterns 155L may have sidewalls tapered toward the lower semiconductor pattern LSP, respectively. For example, the lower gate pattern 155L may have sidewalls which are parallel to the incline-surfaces 146S, respectively. Thus, a horizontal width of the lower gate pattern 155L may be greater than a horizontal width of the upper gate pattern 155U. In an embodiment, forming the conductive layer may include sequentially depositing a barrier metal layer and a metal layer. For example, the barrier metal layer may include a metal nitride layer such as a titanium nitride layer, a tantalum nitride layer, or a tungsten nitride layer. For example, the metal layer may include a metal such as tungsten, aluminum, titanium, tantalum, cobalt, or copper.

Referring to FIG. 30, after the lower and upper gate patterns 155L and 155U are formed, dopant regions 107 may be formed in the substrate 100. The dopant regions 107 may be formed in the substrate 100 under the trenches 140 by an ion implantation process. The dopant regions 107 may have a conductivity type different from that of the lower semiconductor pattern LSP. The dopant regions 107 and the substrate 100 may constitute PN-junctions. On the other hand, a portion of the substrate 100, which is in contact with the lower semiconductor pattern LSP, may have the same conductivity type as the lower semiconductor pattern LSP. In an embodiment, the dopant regions 107 may be connected to each other to be in an equipotential state. In another embodiment, the dopant regions 107 may be electrically separated from each other in order to have potentials different from each other, respectively. In still another embodiment, the dopant regions 107 may be classified into a plurality of source groups. Each of the source groups may include a plurality of dopant regions 107. The plurality of source groups may be electrically separated from each other in order to have potentials different from each other, respectively.

Referring again to FIG. 18, an electrode isolation pattern 160 may be formed on the dopant regions 107 to fill the trenches 140. The electrode isolation pattern 160 may include at least one of a silicon oxide layer, a silicon nitride layer, and a silicon oxynitride layer.

Additionally, a conductive pad 137 may be formed to be connected to the first and second semiconductor patterns 131 and 133 of each upper semiconductor pattern USP. Upper portions of the first and second semiconductor patterns 131 and 133 may be recessed, and then the recessed space may be filled with a conductive material to form the conductive pad 137. The conductive pad 137 may be doped with dopants of a conductivity type different from those of the first and second semiconductor patterns 131 and 133 thereunder. Thus, the conductive pad 137 and the semiconductor patterns 131 and 133 may constitute a diode.

Subsequently, contact plugs 171 may be formed to be connected to the conductive pads 137, respectively, and then a bit line 175 may be formed to be connected to the contact plugs 171. The bit line 175 may be electrically connected to the first and second semiconductor patterns 131 and 133 through the contact plug 171. The bit line 175 may cross over the lower and upper gate patterns 155L and 155U and/or the trenches 140.

Figure 36:
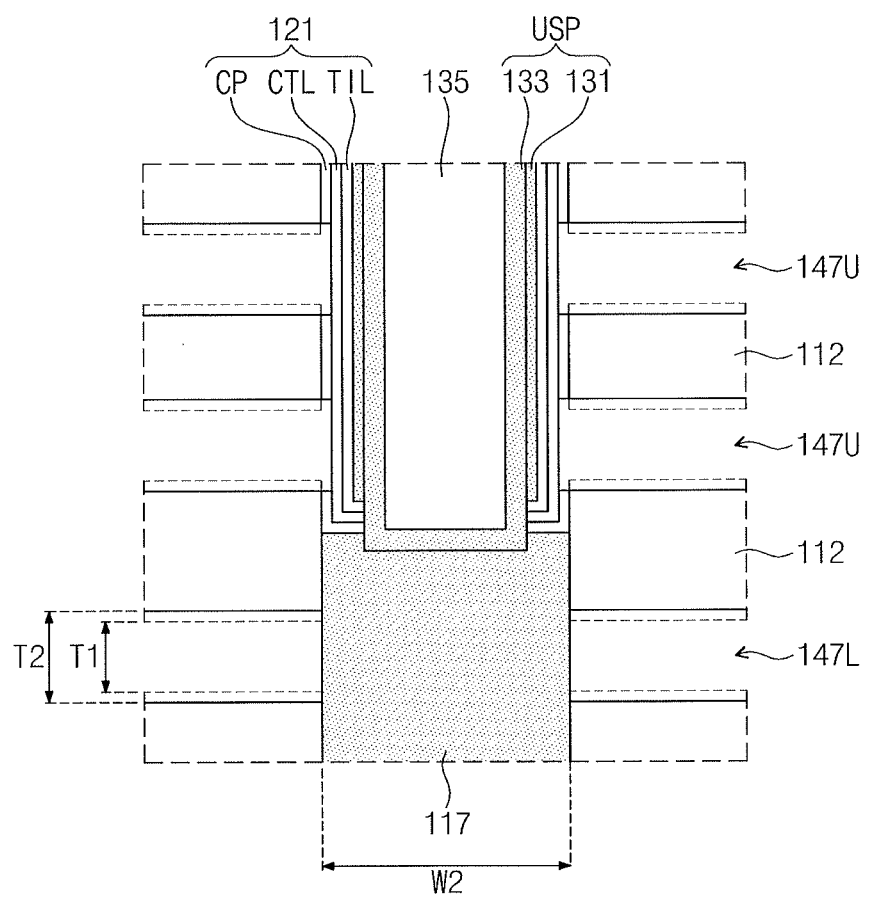
FIGS. 36 to 38 illustrate partial cross-sectional views of stages in a method for fabricating a 3D semiconductor memory device according to an embodiment.
Figure 37:
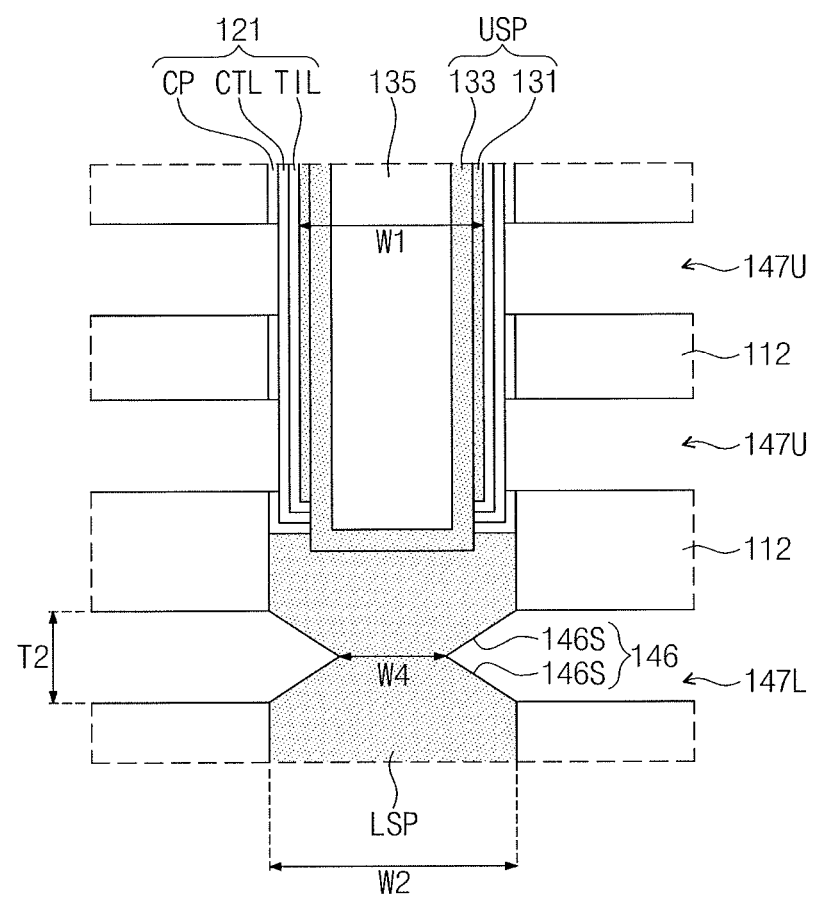

FIGS. 36 to 38 illustrate partial cross-sectional views of stages in a method for fabricating a 3D semiconductor memory device according to an embodiment. FIGS. 39 to 42 illustrate partial cross-sectional views of 3D semiconductor memory devices according to an embodiment.

In the present embodiment, horizontal widths and heights of the lower and upper gate regions 145L and 145U may increase after the lower and upper gate regions 145L and 145U are formed between the insulating layers 112, as described with reference to FIG. 34.

For example, referring to FIG. 36, portions of the capping layers CPL and insulating layers 112 exposed by the lower and upper gate regions 145L and 145U may be isotropically etched to form enlarged lower gate regions 147L, enlarged upper gate regions 147U, and capping layer patterns CP. A vertical height T2 of each of the enlarged lower and upper gate regions 147L and 147U may be greater than the vertical height T1 of each of the lower and upper gate regions 145L and 145U. Here, a difference between the vertical height T1 of each gate region before the formation of the capping layer pattern CP and the vertical height T2 of each gate region after the formation of the capping layer pattern CP may be about twice thickness of the capping layer CPL.

In an embodiment, if the vertical insulator 121 includes the capping layer CPL, the charge storage layer CTL, and the tunnel insulating layer TIL, portions of the capping layer CPL may be etched to expose portions of the charge storage layers CTL in the forming process of the enlarged lower and upper gate regions 147L and 147U. Thus, the capping layer patterns CP may be formed between the charge storage layer CTL and the insulating layers 112 when the enlarged upper gate regions 147U are formed.

Figure 40:
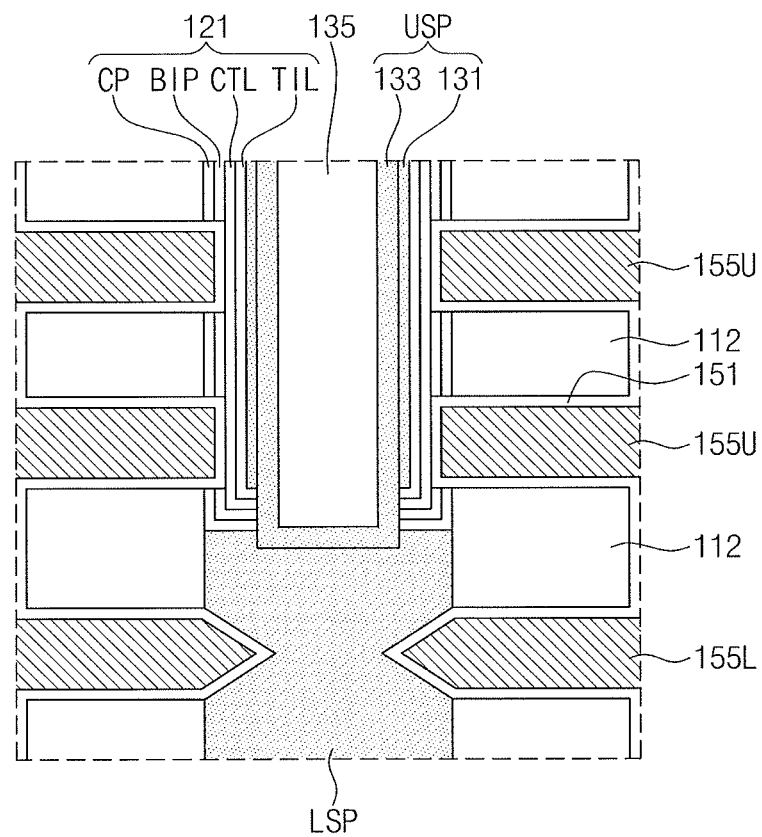

In another embodiment, if the vertical insulator 121 includes the capping layer CPL, the blocking insulating layer BIL, the charge storage layer CTL, and the tunnel insulating layer TIL, the portions of the capping layer CPL may be etched to form enlarged lower and upper gate regions 147L and 147U exposing portions of the blocking insulating layer BIL, as illustrated in FIG. 39. In this case, the capping layer patterns CP may be formed between the blocking insulating layer BIL and the insulating layers 112, respectively. In still another embodiment, the capping layer CPL and the blocking insulating layer BIL may be etched to enlarged lower and upper gate regions 147L and 147U exposing portions of the charge storage layer CTL, as illustrated in FIG. 40. In this case, the capping layer pattern CP and a blocking insulating layer pattern BIP may be formed between the charge storage layer CTL and each of the insulating layers 112.

Referring to FIG. 37, after the enlarged lower and upper gate regions 147L and 147U are formed, the lower semiconductor layer 117 exposed by the enlarged lower gate region 147L may be selectively etched to form a recessed region 146. The minimum width W4 of the lower semiconductor pattern LSP having the recessed region 146 may be less than the upper width W1 of the upper semiconductor pattern USP. As described with reference to FIG. 18, the recessed region 146 of the lower semiconductor pattern LSP may be formed using the etch-recipe or etchant having the etch rate varied according to the crystal direction of the semiconductor material. Thus, the recessed region 146 may be defined by incline-surfaces 146S inclined with respect to the top surface of the substrate 100. The recessed region 146 may have a tapered wedge-shape due to the incline-surfaces 146S. In an embodiment, the incline-surfaces 146S defining the recessed region 146 may be {111} crystal planes of silicon. Additionally, a horizontal section of the lower semiconductor pattern LSP at which the recessed region 146 is formed may have a quadrilateral shape of which sides are parallel to the <110> directions crossing each other.

According to the present embodiment, the vertical height T2 of the enlarged lower gate region 147L may increase, such that the lateral depth of the recessed region 146 of the lower semiconductor pattern LSP may increase. For example, the minimum width W4 of the lower semiconductor pattern LSP in FIG. 37 may be less than the minimum width W3 of the lower semiconductor pattern LSP in FIG. 18.

Figure 46:
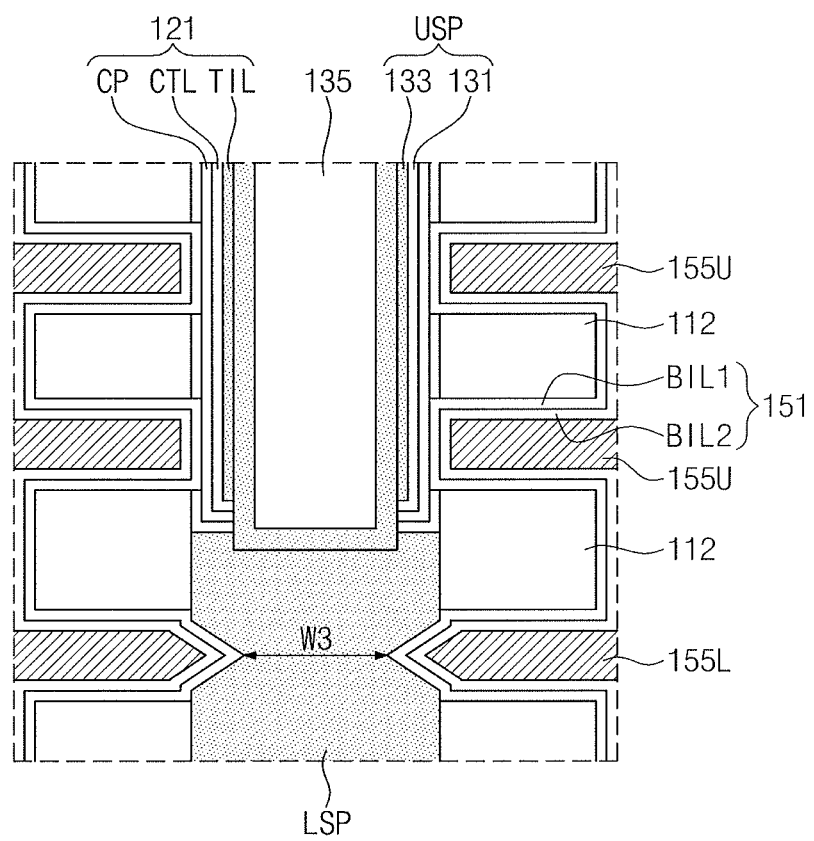

After the lower semiconductor pattern LSP having the recessed region 146 is formed, the horizontal insulating layer 151 and the lower and upper gate patterns 155L and 155U may be formed, as described with reference to FIG. 14. Forming the horizontal insulating layer 151 may include conformally depositing a first blocking insulating layer BIL1 and a second blocking insulating layer BIL2 in the enlarged lower and upper gate regions 147L and 147U, as illustrated in FIG. 46. The first and second blocking insulating layers BIL1 and BIL2 may be formed of materials different from each other, respectively. One of the first and second blocking insulating layers BIL1 and BIL2 may be formed of a material having an energy band gap less than that of the tunnel insulating layer TIL and greater than that of the charge storage layer CTL. In an embodiment, the first blocking insulating layer BIL1 may include at least one of high-k dielectric layers such as an aluminum oxide layer and a hafnium oxide layer, and the second blocking insulating layer BIL2 may include a material having a dielectric constant less than that of the first blocking insulating layer BIL1. In another embodiment, the second blocking insulating layer BIL2 may include at least one high-k dielectric layer, and the first blocking insulating layer BIL1 may include a material having a dielectric constant less than that of the second blocking insulating layer BIL2.

According to the embodiments illustrated in FIGS. 18 to 42, the minimum width of the lower semiconductor pattern (used as a channel of the selection transistor) may be less than the minimum width of the upper semiconductor pattern (used as a channel of the cell transistor). Thus, a margin between the lower gate patterns adjacent to the lower semiconductor pattern may increase or be secured.

A portion of the sidewall of the lower semiconductor pattern may be etched such that the width of the lower semiconductor pattern becomes less than the width of the upper semiconductor pattern. At this time, the etch-recipe or etchant having the etch rate varied according to the crystal planes and the crystal directions of silicon may be used. Thus, the etching process for reducing the width of the lower semiconductor pattern may be automatically controlled without monitoring of the width of the lower semiconductor pattern. For example, specific crystal planes of silicon may be used as etch stop planes when the lower semiconductor pattern is etched.

Hereinafter, methods for fabricating a 3D semiconductor memory device according to an embodiment will be described with reference to FIGS. 22 to 30 and 43 to 49.

FIGS. 43 to 46 illustrate partial cross-sectional views of stages in a method for fabricating a 3D semiconductor memory device according to an embodiment.

Figure 43:
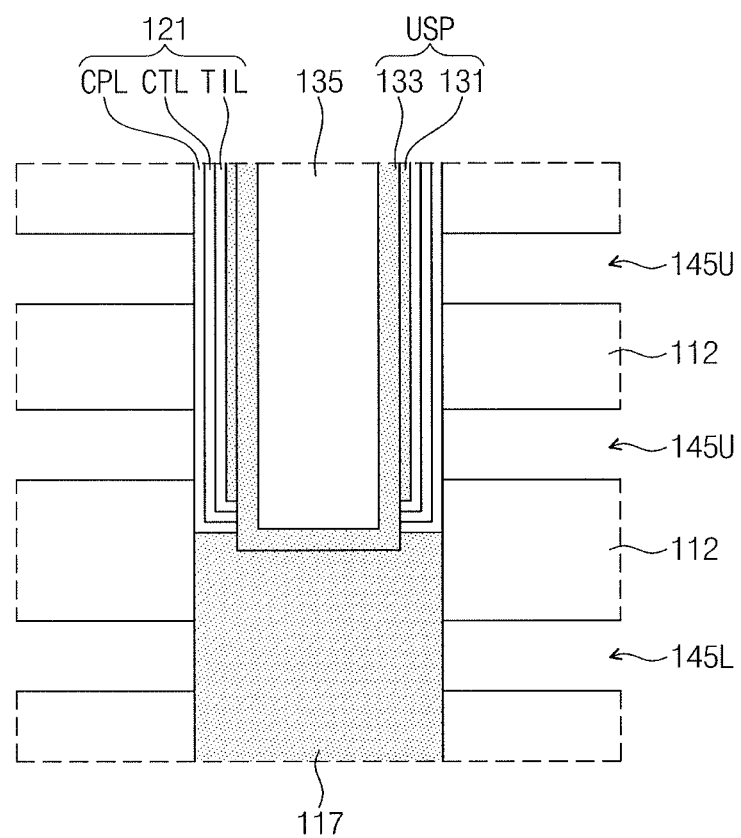
FIGS. 43 to 46 illustrate partial cross-sectional views of stages in a method for fabricating a 3D semiconductor memory device according to an embodiment.

In the present embodiment, the multi-layered structure 110 may be patterned to form the trenches 140 exposing the substrate 100 as illustrated in FIG. 27, and then the sacrificial layers 111 exposed by the trenches 140 may be removed to form the lower and upper gate regions 145L and 145U between the insulating layers 112, as illustrated in FIGS. 28 and 43.

For example, the sacrificial layers 111 may be isotropically etched using an etch-recipe or etchant having an etch selectivity with respect to the insulating layers 112, the vertical insulators 121, the lower semiconductor layers 117, and the substrate 100, thereby forming the lower and upper gate regions 145L and 145U. At this time, the sacrificial layers 111 may be completely removed by the isotropic etching process. For example, if the sacrificial layers 111 are silicon nitride layers and the insulating layers 112 are silicon oxide layers, the isotropic etching process may be performed using an etching solution including phosphoric acid.

The lower gate regions 145L may horizontally extend from the trench 140 between the insulating layers 112 and may expose portions of the sidewall of the lower semiconductor layer 117, respectively. The upper gate regions 145U may horizontally extend from the trench 140 between the insulating layers 112 and may expose portions of the sidewall of the vertical insulator 121, respectively. For example, each of the lower gate regions 145L may be defined by vertically adjacent insulating layers 112 and the sidewall of the lower semiconductor layer 117. Each of the upper gate regions 145U may be defined by vertically adjacent insulating layers 112 and the sidewall of the vertical insulator 121. Additionally, according to the embodiment illustrated in FIG. 43, the capping layer CPL may be used as an etch stop layer during the isotropic etching process for the formation of the upper gate regions 145U. Thus, the capping layer CPL may help prevent the charge storage layer CTL from being damaged by the etching solution used in the isotropic etching process. For example, the upper gate regions 145U may expose the capping layer CPL of the vertical insulator 121.

In an embodiment, a vertical height of each of the lower and upper gate regions 145L and 145U may be less the maximum width of the lower semiconductor layer 117, as illustrated in FIG. 43. The vertical heights of the lower and upper gate regions 145L and 145U may be substantially equal to the thicknesses of the sacrificial layers 111, respectively. The vertical heights of the lower and upper gate regions 145L and 145U may be substantially equal to each other. In another embodiment, the vertical height of the lower gate region 145L may be greater than the vertical height of the upper gate region 145U.

Figure 44:
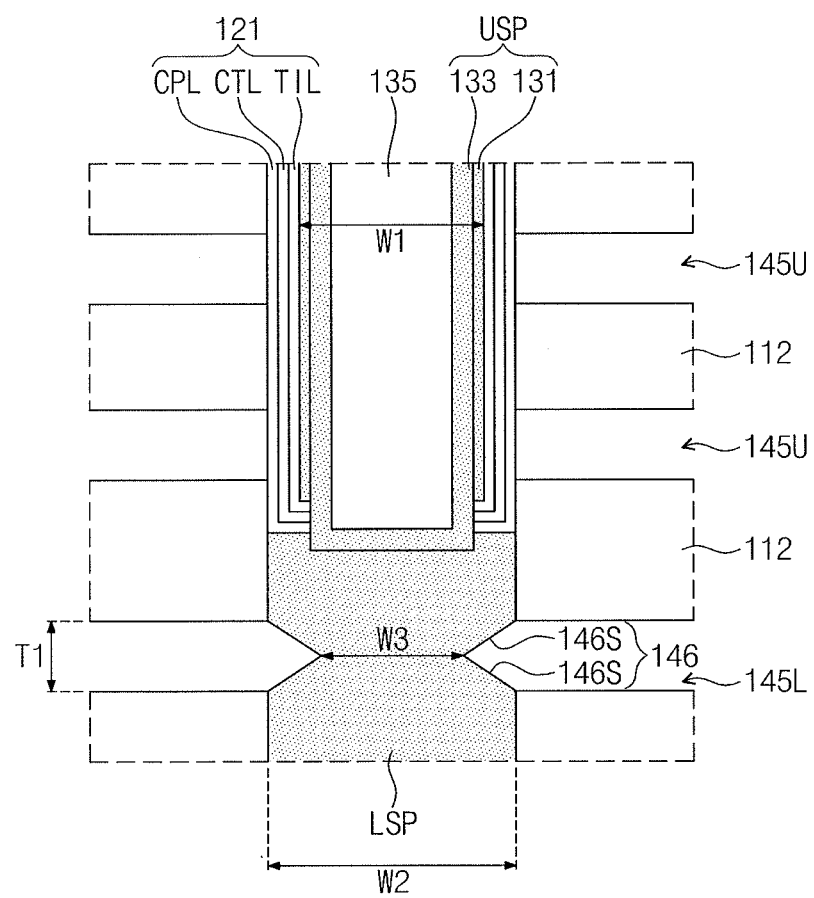

Referring to FIGS. 29 and 44, the sidewall of the lower semiconductor layer 117 exposed by the lower gate regions 145L may be recessed to form a lower semiconductor pattern LSP having recessed regions 146.

In an embodiment, forming the recess regions 146 at the lower semiconductor layer 117 may include selectively etching the sidewall of the lower semiconductor layer 117 exposed by the lower gate regions 145L. Here, the etching process for the formation of the recessed region 146 may use an etch-recipe or etchant having an etch rate varied according to a crystal direction of a semiconductor material. Thus, the recessed region 146 may be defined by incline-surfaces 146S inclined with respect to the top surface of the substrate 100. The recessed region 146 may have a tapered wedge-shape due to the incline-surfaces 146S. In an embodiment, the incline-surfaces 146S defining the recessed region 146 may be {111} crystal planes of silicon. Additionally, a horizontal section of the lower semiconductor pattern LSP at which the recessed region 146 is formed may have a quadrilateral shape of which sides are parallel to the <110> directions crossing each other, as illustrated in FIG. 20.

For example, the recessed region 146 may be formed by a gas phase etching process or chemical dry etching process using an etchant including a halogen containing reaction gas. The halogen containing reaction gas may include at least one of HCl, $Cl_2$, $NF_3$, $ClF_3$, and $F_2$. Alternatively, the recessed region 146 may be formed by a wet anisotropic etching process using an etching solution such as an organic alkali etchant (e.g., tetramethyl ammonium hydroxide (TMAH)) or ammonium hydroxide ($NH_4OH$).

When the lower semiconductor layer 117 formed of silicon is selectively etched, the etch rate of the lower semiconductor layer 117 may be varied according to a crystal plane and a crystal direction of silicon. In an embodiment, when the exposed sidewall of the lower semiconductor layer 117 is etched using the halogen containing reaction gas, the etch rate in <111> directions may be greater than the etch rate in <110> directions. In this case, the etching process may be stopped at the {111} crystal planes. Thus, the {111} crystal planes of the lower semiconductor pattern LSP may be exposed. For example, the recessed region 146 may be defined by the {111} crystal planes and may have the tapered wedge-shape by two incline-surfaces 146S having the {111} crystal planes.

In another embodiment, when the lower semiconductor layer 117 formed of silicon is isotropically etched using ammonium hydroxide ($NH_4OH$), the etch rate of the lower semiconductor layer 117 may be the minimum at the {111} crystal planes and the etch rate of the lower semiconductor layer 117 may be the maximum at {100} crystal planes. Thus, inner surfaces of the recessed region 146 may have the {111} crystal planes at which the each rate is the minimum. Additionally, the recessed region 146 may have the tapered wedge-shape by two inner surfaces of the {111} crystal planes.

The inner surfaces of the recessed region 146 may have defects by the etching process. Thus, after the recessed region 146 is formed, a cleaning process using $O_3$ and HF may be performed to remove the defects of the inner surfaces of the recessed region 146.

As noted above, the lower semiconductor pattern LSP may be formed to have the recessed region 146. Thus, the minimum width of the lower semiconductor pattern LSP may be less than an upper width and a lower width of the upper semiconductor pattern USP. In an embodiment, a depth (i.e., a lateral depth) of the recessed region 146 in a direction horizontal to the top surface of the substrate 100 may be determined depending on a vertical height of the lower gate region 145L and the maximum width of the lower semiconductor pattern LSP. For example, the depth of the recessed region 146 may correspond to about a half of the height of the lower gate region 145L. In an implementation, the minimum width of the lower semiconductor pattern LSP may correspond to or equal a difference between the maximum width of the lower semiconductor pattern LSP and the height of the lower gate region 145L.

Figure 45:
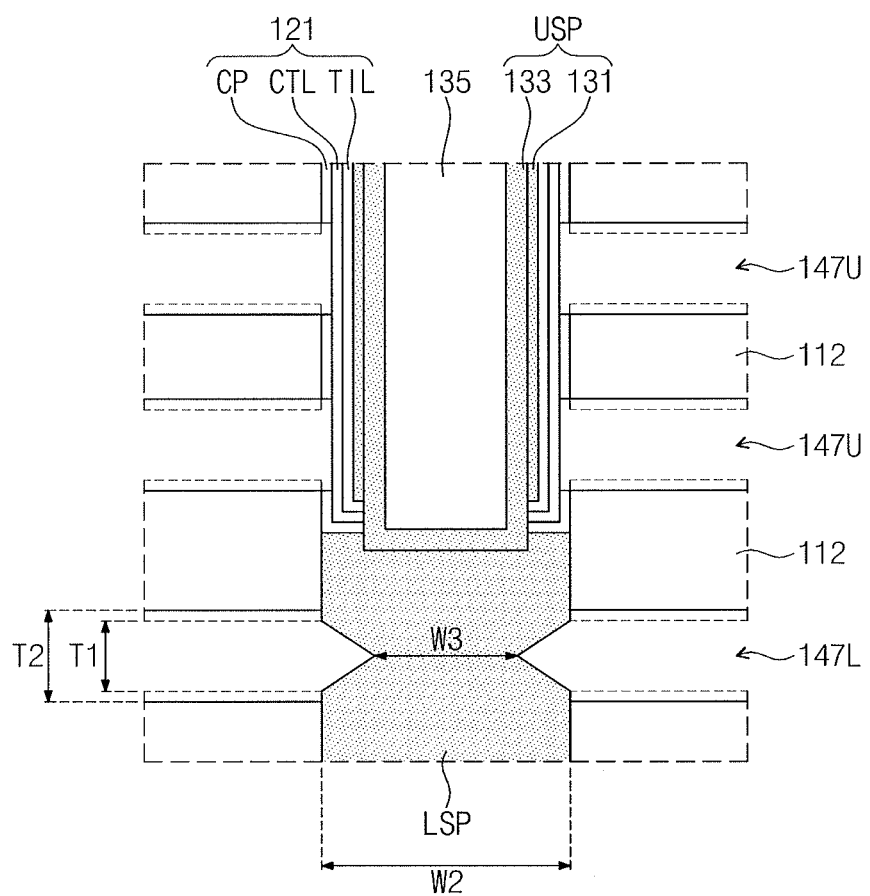

Referring to FIG. 45, after the lower semiconductor pattern LSP having the recessed region 146 is formed, the vertical heights of lower and upper gate regions 145L and 145U may be increased. For example, the insulating layers 112 exposed by the lower and upper gate regions 145L and 145U may be isotropically etched to form enlarged lower and upper gate regions 147L and 147U. Additionally, if the vertical insulator 121 includes the capping layer CPL, the charge storage layer CTL, and the tunnel insulating layer TIL, portions of the capping layer CPL may be etched to expose portions of the charge storage layer CTL in the process of forming the enlarged lower and upper gate regions 147L and 147U. Thus, capping layer patterns CP may be formed between the charge storage layer CTL and the insulating layers 112 when the enlarged upper gate regions 147U are formed.

For example, a vertical height T2 of each of the enlarged lower and upper gate regions 147L and 147U may be greater than the vertical height T1 of each of the lower and upper gate regions 145L and 145U in FIG. 44. Here, a difference between the vertical height T1 of each of the gate regions 145L and 145U and the vertical height T2 of each of the enlarged gate regions 147L and 147U may be about twice thickness of the capping layer CPL. Additionally, the enlarged lower gate region 147L may also expose a portion of the sidewall of the lower semiconductor pattern LSP which is substantially perpendicular to the top surface of the substrate 100.

In another embodiment, if the recessed region 146 of the lower semiconductor pattern LSP is formed after the enlarged lower and upper gate regions 145L and 145U are formed, the minimum width W3 of the lower semiconductor pattern LSP may be determined depending on the vertical height T2 of the enlarged lower gate region 147L, such that the minimum width W3 of the lower semiconductor pattern LSP may be less than the minimum width W3 of the lower semiconductor pattern LSP illustrated in FIG. 18. However, in the present embodiment, the enlarged lower and upper gate regions 147L and 147U may be formed after the recessed region 146 of the lower semiconductor pattern LSP is formed. As a result, the minimum width W3 of the lower semiconductor pattern LSP may be secured, and the vertical heights of the enlarged gate regions 147L and 147U may increase. For example, the minimum width W3 of the lower semiconductor pattern LSP may be controlled independently of the vertical heights T2 of the enlarged lower and upper gate regions 147L and 147U. In an implementation, the minimum width W3 of the lower semiconductor pattern LSP may be secured, and channel lengths of the selection and cell transistors GST, SST, and MCT in FIG. 1 may increase.

Referring to FIGS. 30 and 46, a horizontal insulating layer 151 may be formed to cover inner surfaces of the enlarged lower and the upper gate regions 147L and 147U, and lower and upper gate patterns 155L and 155U may be formed to fill remaining spaces of the enlarged lower and upper gate regions 147L and 147U, respectively.

For example, a horizontal insulating layer 151 and a conductive layer may be sequentially formed to cover the inner surfaces of the enlarged lower and upper gate regions 147L and 147U. Then, the conductive layer outside the enlarged lower and upper gate regions 147L and 147U may be removed to confinedly form the lower and upper gate patterns 155L and 155U in the enlarged lower and upper gate regions 147L and 147U, respectively.

The horizontal insulating layer 151 may be in direct contact with the vertical insulator 121 in the enlarged upper gate regions 147U and may be in direct contact with the lower semiconductor pattern LSP in the enlarged lower gate regions 147U. The horizontal insulating layer 151 may conformally cover the inner surface of the recessed region 146 in the enlarged lower gate region 147.

The horizontal insulating layer 151 may include a single thin layer or a plurality of thin layers, similarly to the vertical insulating layer. In an embodiment, the horizontal insulating layer 151 may include a first blocking insulating layer BIL1 and a second blocking insulating layer BIL2, which are sequentially stacked. One of the first and second blocking insulating layers BIL1 and BIL2 may be formed of a material having an energy band gap less than that of the tunnel insulating layer TIL and greater than that of the charge storage layer CTL. In an embodiment, the first blocking insulating layer BIL1 may include at least one of high-k dielectric layers such as an aluminum oxide layer and a hafnium oxide layer, and the second blocking insulating layer BIL2 may include a material having a dielectric constant less than that of the first blocking insulating layer BIL1. In another embodiment, the second blocking insulating layer BIL2 may include at least one high-k dielectric layer, and the first blocking insulating layer BIL1 may include a material having a dielectric constant less than that of the second blocking insulating layer BIL2.

In an embodiment, the conductive layer may fill the enlarged lower and upper gate regions 147L and 147U and may conformally cover an inner surface of the trench 140. In this case, the conductive layer in the trenches 140 may be isotropically etched to form the lower and upper gate patterns 155L and 155U. In another embodiment, the conductive layer may also fill the trenches 140. In this case, the conductive layer in the trenches 140 may be anisotropically etched to form the lower and upper gate patterns 155L and 155U. According to an embodiment, the upper gate patterns 155U may be formed in the upper gate regions 145U, respectively, and the lower gate patterns 155L may be formed in the lower gate regions 145L, respectively. Here, the lower gate patterns 155L may fill the recessed regions 146 of the lower semiconductor pattern LSP. Thus, the lower gate patterns 155L may have sidewalls tapered toward the lower semiconductor pattern LSP, respectively. For example, the lower gate pattern 155L may have sidewalls that are parallel to the incline-surfaces 146S, respectively. Thus, a horizontal width of the lower gate pattern 155L may be greater than a horizontal width of the upper gate pattern 155U. In an embodiment, forming the conductive layer may include sequentially depositing a barrier metal layer and a metal layer. For example, the barrier metal layer may include a metal nitride layer such as a titanium nitride layer, a tantalum nitride layer, or a tungsten nitride layer. In an implementation, the metal layer may include a metal such as tungsten, aluminum, titanium, tantalum, cobalt, or copper.

Subsequently, the dopant regions 107 may be formed in the substrate 100 as described with reference to FIG. 30. Next, the electrode isolation pattern 160 may be formed on the dopant regions 107 to fill the trenches 140 as illustrated in FIG. 18.

Figure 47:
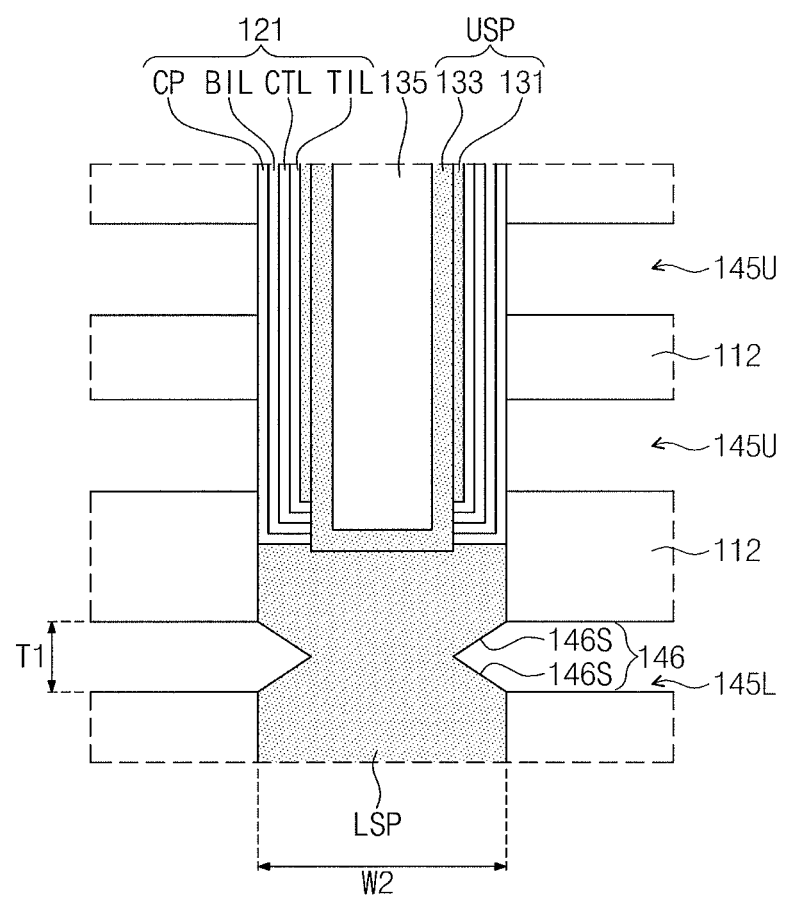
FIGS. 47 to 49 illustrate partial cross-sectional views of stages in a method for fabricating a 3D semiconductor memory device according to an embodiment.
Figure 48:
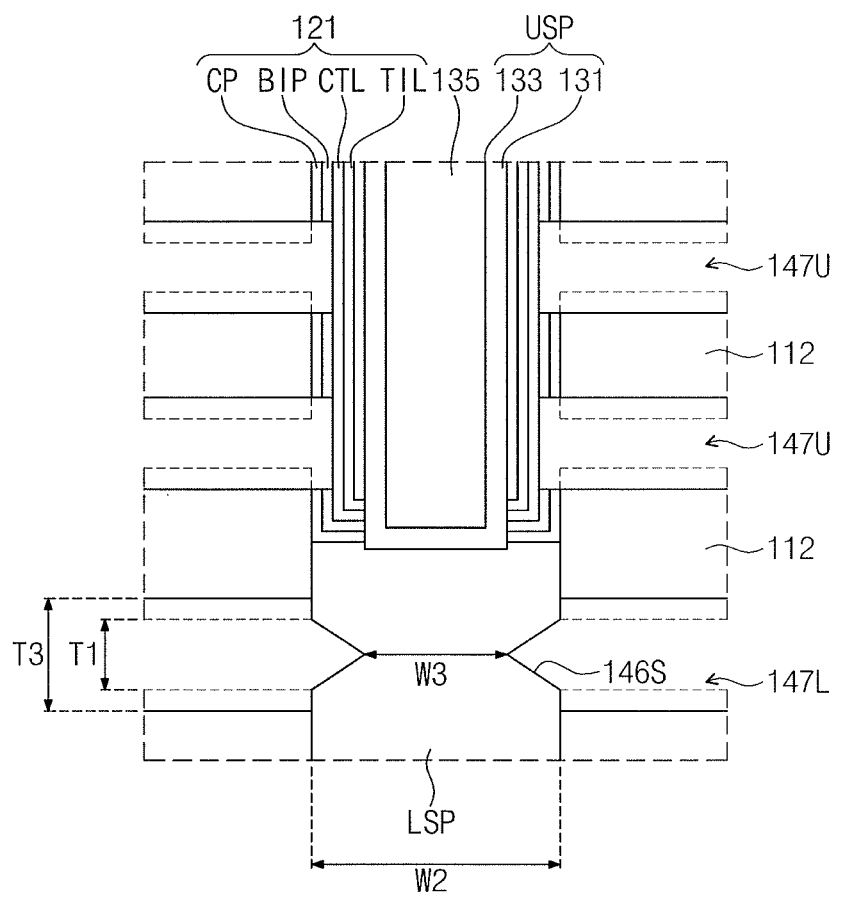
Figure 49:
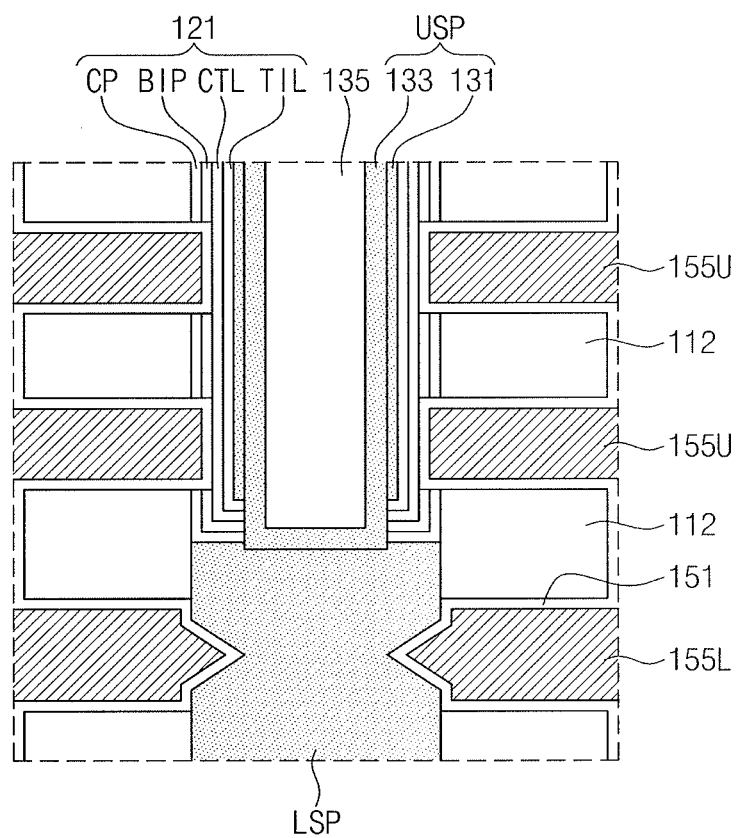

FIGS. 47 to 49 illustrate partial cross-sectional views of stages in a method for fabricating a 3D semiconductor memory device according to an embodiment.

In the present embodiment, the vertical insulator 121 may include the capping layer CPL, the blocking insulating layer BIL, the charge storage layer CTL, and the tunnel insulating layer TIL, as illustrated in FIG. 47. Thus, when the lower and upper gate regions 145L and 145U of FIG. 43 are formed, the upper gate regions 145U may expose portions of the capping layer CPL, respectively.

Referring to FIG. 48, the insulating layers exposed by the lower and upper gate regions 145L and 145U may be isotropically etched to form enlarged lower and upper gate regions 147L and 147U. In the present embodiment, when the enlarged lower and upper gate regions 147L and 147U are formed, portions of the capping layer CPL and blocking insulating layer BIL may be etched to expose portions of the charge storage layer CTL. Thus, the capping layer pattern CP and a blocking insulating layer pattern BIP may be formed between the charge storage layer CTL and each of the insulating layers 112. When the capping layer CPL and the blocking insulating layer BIL are successively etched, vertical thicknesses of the insulating layers 112 may be reduced. A vertical height T3 of each of the enlarged lower and upper gate regions 147L and 147U illustrated in FIG. 48 may be greater than the vertical height T2 of each of the enlarged lower and upper gate regions 147L and 147U illustrated in FIG. 44.

Subsequently, as illustrated in FIG. 49, a vertical insulating layer 151 and lower and upper gate patterns 155L and 155U may be formed in the enlarged lower and upper gate regions 147L and 147U. According to the present embodiment, the vertical insulating layer 151 may be in contact with the charge storage layer CTL, and the capping layer patterns CP may be vertically separated from each other by the upper gate patterns 155U. Additionally, the blocking insulating layer patterns BIP may be separated from each other by the upper gate patterns 155U.

According to the embodiments of FIGS. 43 to 49, a portion of the sidewall of the lower semiconductor pattern may be etched such that the width of the lower semiconductor pattern becomes less than the width of the upper semiconductor pattern. At this time, the etch-recipe or etchant having the etch rate varied according to the crystal planes and the crystal directions of silicon may be used. Thus, the etching process for reducing the width of the lower semiconductor pattern may be automatically controlled without monitoring of the width of the lower semiconductor pattern. For example, specific crystal planes of silicon may be used as etch stop planes when the lower semiconductor pattern is etched.

Additionally, according to embodiments, the minimum width of the lower semiconductor pattern may be controlled independently of channel lengths of the lower and upper gate patterns.

The 3D semiconductor memory devices in the aforementioned embodiments may be encapsulated using various packaging techniques. For example, the 3D semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the 3D semiconductor memory device according to the embodiments may be mounted may further include at least one semiconductor device (e.g., a controller and/or a logic device) that controls the 3D semiconductor memory device.

Figure 50:
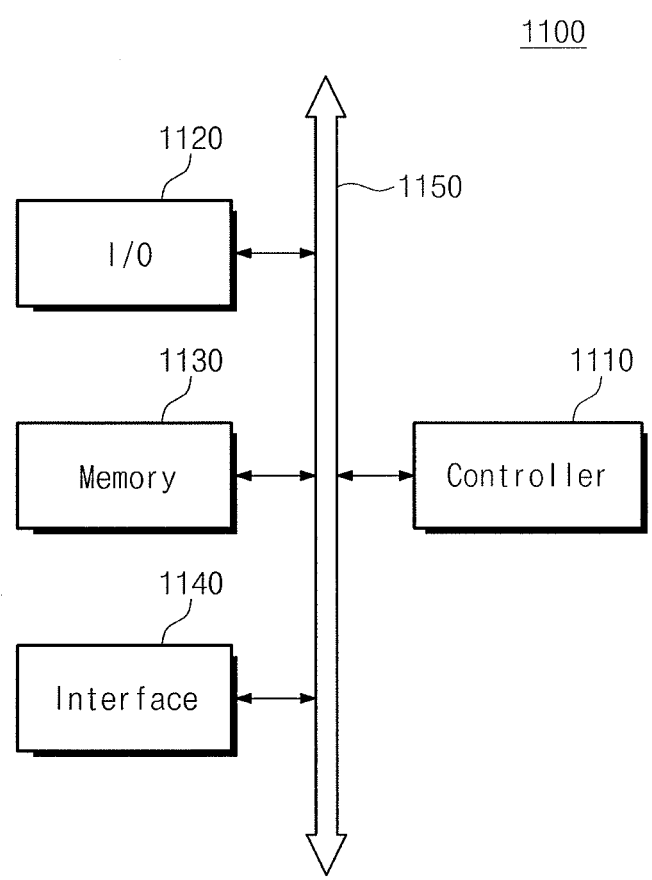
FIG. 50 illustrates a schematic block diagram of an example of electronic systems including 3D semiconductor memory devices according to an embodiment.

FIG. 50 illustrates a schematic block diagram of an example of electronic systems including 3D semiconductor memory devices according to an embodiment.

Referring to FIG. 50, an electronic system 1100 according to an embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device. The other logic device may have a similar function to any one of the microprocessor, the digital signal processor, and the microcontroller. The I/O unit 1120 may include a keypad, a keyboard, and/or a display unit. The memory device 1130 may store data and/or commands. The memory device 1130 may include at least one of the 3D semiconductor memory devices according to the embodiments described above. The memory device 1130 may further include another type of semiconductor memory devices (e.g., a non-volatile memory device and/or a static random access memory (SRAM) device) that are different from the 3D semiconductor memory devices described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products. The other electronic products may receive or transmit information data by wireless.

Figure 51:
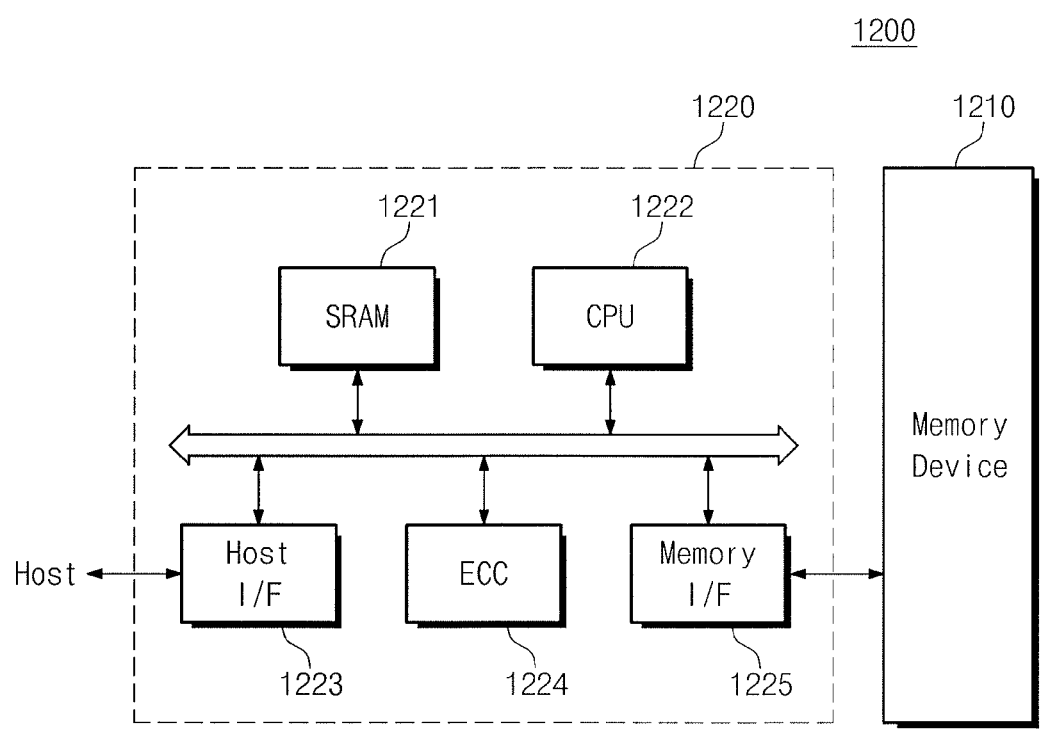
FIG. 51 illustrates a schematic block diagram of an example of memory cards including 3D semiconductor memory devices according to an embodiment.

FIG. 51 illustrates a schematic block diagram of an example of memory cards including 3D semiconductor memory devices according to an embodiment.

Referring to FIG. 51, a memory card 1200 according to an embodiment may include a memory device 1210. The memory device 1210 may include at least one of the 3D semiconductor memory devices according to the embodiments mentioned above. In other embodiments, the memory device 1210 may further include another type of semiconductor memory devices (e.g., a non-volatile memory device and/or a static random access memory (SRAM) device) which are different from the 3D semiconductor memory devices according to the embodiments described above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

Figure 52:
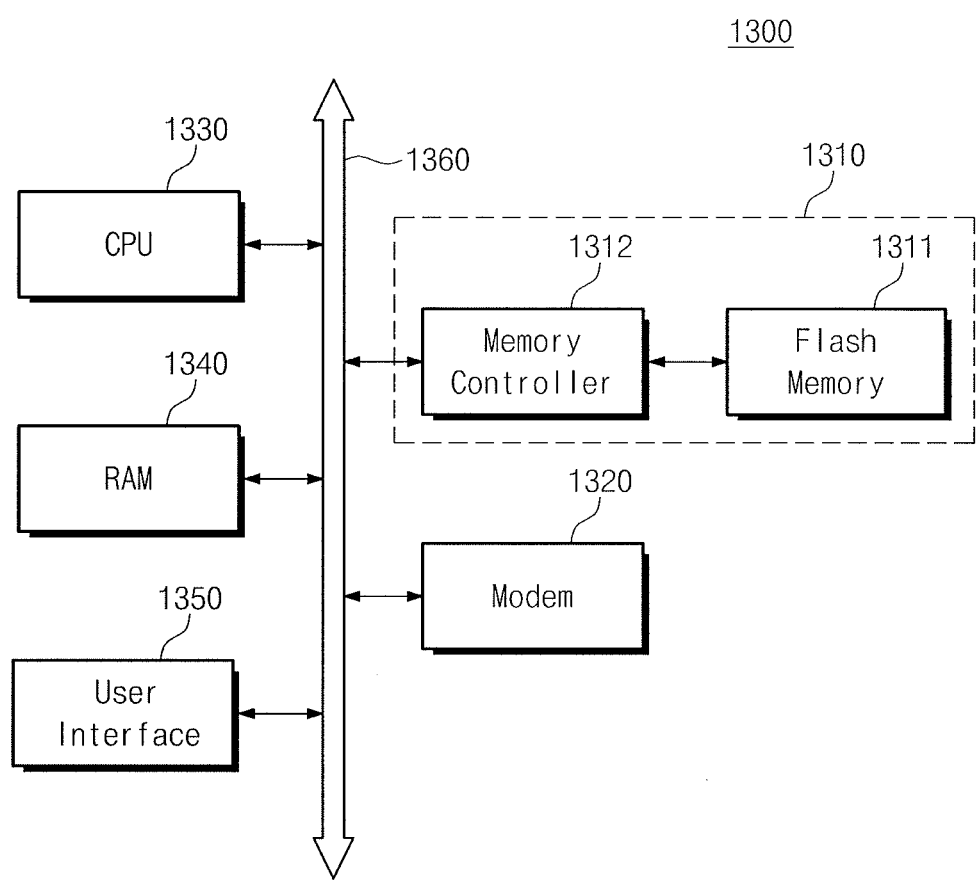
FIG. 52 illustrates a schematic block diagram of an example of information processing systems including 3D semiconductor memory devices according to an embodiment.

FIG. 52 illustrates a schematic block diagram of an example of information processing systems including 3D semiconductor memory devices according to an embodiment.

Referring to FIG. 52, a flash memory system 1310 may be installed in an information process system 1300 such as a mobile device or a desk top computer. The flash memory system 1310 may include at least one of the 3D semiconductor memory devices according to the aforementioned embodiments. The information processing system 1300 according to an embodiment may include a modem 1320, a central processing unit (CPU) 1330, a RAM 1340, and a user interface unit 1350 that are electrically connected to the flash memory system 1310 through a system bus 1360. The flash memory system 1300 may be constructed to be identical to the aforementioned memory card. The flash memory system 1310 may store data processed by the CPU 1330 or data inputted from an external device. The flash memory system 1310 may include a solid state disk (SSD). In this case, the information processing system 1310 can stably store large data in the flash memory system 1310. As the reliability of the flash memory system 1310 becomes improved, the flash memory system 1310 can reduce resources used to correct errors, thereby providing a high speed data exchange function to the information processing system 1300. Even though not depicted in the drawings, the information processing unit

1300 according to some embodiments may further include an application chipset, a camera image processor (CIS) and/or an input/output device.

According to embodiments, the epitaxial pattern (or the lower semiconductor pattern) between the substrate and the vertical structure (or the upper semiconductor pattern) may have the recessed sidewall (or the recessed region). Thus, the lowermost horizontal structure adjacent to the epitaxial pattern may have the convex portion toward the recessed sidewall, and the minimum width of the epitaxial pattern is less than the width of the vertical structure. As a result, the process margin of the process for forming the horizontal structure may be secured to realize the 3D semiconductor memory device having high reliability.

By way of summation and review, three-dimensional (3D) semiconductor memory devices may be used to increase integration density. Production of 3D semiconductor memory devices may be expensive when compared with 2D semiconductor memory devices and may have concerns regarding providing reliable product characteristics.

The embodiments provide three-dimensional semiconductor memory devices with high integration density and improved reliability.

The embodiments also provide methods for fabricating a three-dimensional semiconductor memory device capable of improving integration density and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional (3D) semiconductor memory device, comprising:
   insulating layers stacked on a substrate;
   horizontal structures between the insulating layers, the horizontal structures including gate electrodes, respectively;
   vertical structures penetrating the insulating layers and the horizontal structures, the vertical structures including semiconductor pillars and charge storage layers; and
   epitaxial patterns, each of the epitaxial patterns being between the substrate and each of the vertical structures,
   wherein a minimum width of the epitaxial pattern is less than a width of a corresponding one of the vertical structures.

2. The 3D semiconductor memory device as claimed in claim 1, wherein:
   a lowermost one of the horizontal structures is in contact with the epitaxial patterns;
   each of the epitaxial patterns has a recessed sidewall; and
   the lowermost horizontal structure has a convex portion along the recessed sidewall of each of the epitaxial patterns.

3. The 3D semiconductor memory device as claimed in claim 1, wherein each of the epitaxial patterns has a laterally recessed sidewall.

4. The 3D semiconductor memory device as claimed in claim 1, wherein:
   a lowermost one of the horizontal structures is thicker than others of the horizontal structures; and
   top surfaces of the epitaxial patterns are higher than a top surface of the lowermost horizontal structure.

5. The 3D semiconductor memory device as claimed in claim 1, wherein:
   thicknesses of the horizontal structures are substantially equal to each other; and
   the epitaxial patterns are in contact with at least two vertically adjacent horizontal structures that are closest to the substrate.

6. The 3D semiconductor memory device as claimed in claim 1, wherein:
   each of the horizontal structures further includes first and second blocking insulating layers between each of the gate electrode and the semiconductor pillars; and
   the first and second blocking insulating layers each include at least one of a silicon oxide layer and an aluminum oxide layer.

7. The 3D semiconductor memory device as claimed in claim 1, wherein:
   each of the vertical structures further includes a protecting layer, and a tunnel insulating layer; and
   horizontal structures adjacent to the vertical structures are in contact with the charge storage layers of the vertical structures.

8. A three-dimensional (3D) semiconductor memory device, comprising:
   a lower structure including a lower gate pattern and a lower semiconductor pattern penetrating the lower gate pattern, the lower semiconductor pattern being connected to a substrate; and
   an upper structure including upper gate patterns stacked on the lower structure, an upper semiconductor pattern penetrating the upper gate patterns, and a vertical insulator between the upper semiconductor pattern and the upper gate patterns, the upper semiconductor pattern being connected to the lower semiconductor pattern,
   wherein:
     the lower semiconductor pattern has a recessed region adjacent to the lower gate pattern; and
     the recessed region of the lower semiconductor pattern is defined by incline-surfaces inclined with respect to a top surface of the substrate.

9. The 3D semiconductor memory device as claimed in claim 8, wherein a minimum width of the lower semiconductor pattern is less than a lower width of the upper semiconductor pattern.

10. The 3D semiconductor memory device as claimed in claim 8, wherein a maximum width of the lower semiconductor pattern is greater than a maximum width of the upper semiconductor pattern.

11. The 3D semiconductor memory device as claimed in claim 8, wherein a vertical thickness of the lower gate pattern is less than a maximum width of the lower semiconductor pattern.

12. The 3D semiconductor memory device as claimed in claim 8, wherein:
   the lower structure includes a plurality of lower gate patterns stacked on the substrate and an insulating layer between the lower gate patterns;
   a horizontal section of the lower semiconductor pattern adjacent to the insulating layer has a substantially circular shape; and a horizontal section of the lower semiconductor pattern at the recessed region has a substantially quadrilateral shape.

13. The 3D semiconductor memory device as claimed in claim 8, wherein a minimum width of the lower semiconductor pattern is about equal to a difference between a maximum width of the lower semiconductor pattern and a vertical thickness of the lower gate pattern.

14. The 3D semiconductor memory device as claimed in claim 8, wherein:
the lower semiconductor pattern is formed of silicon; and
the incline-surfaces are {111} crystal planes of the silicon.

15. The 3D semiconductor memory device as claimed in claim 8, wherein a horizontal width of the lower gate pattern is greater than a horizontal width of each of the upper gate patterns.

16. The 3D semiconductor memory device as claimed in claim 8, further comprising a horizontal insulator between the lower gate pattern and the lower semiconductor pattern and between the vertical insulator and each of the upper gate patterns,
wherein:
the horizontal insulator between the lower gate pattern and the lower semiconductor pattern extends onto a top surface and a bottom surface of the lower gate pattern; and
the horizontal insulator between the vertical insulator and each of the upper gate patterns extends onto a top surface and a bottom surface of each of the upper gate patterns.

17. A three-dimensional (3D) semiconductor memory device, comprising:
a stack structure including:
insulating layers vertically stacked on a substrate, and
a lower gate pattern between the insulating layers; and
a lower semiconductor pattern penetrating the lower gate pattern and being connected to the substrate, the lower semiconductor pattern having a recessed region defined by incline-surfaces inclined with respect to a top surface of the substrate, and the recessed region being adjacent to the lower gate pattern,
wherein a maximum width of the recessed region in a direction vertical to the top surface of the substrate is less than a vertical distance between adjacent insulating layers.

18. The 3D semiconductor memory device as claimed in claim 17, wherein the vertical distance between the adjacent insulating layers is less than a maximum width of the lower semiconductor pattern.

19. The 3D semiconductor memory device as claimed in claim 17, wherein:
a horizontal section of the lower semiconductor pattern adjacent to each of the insulating layers has a substantially circular shape; and
a horizontal section of the lower semiconductor pattern at the recessed region has a substantially quadrilateral shape.

20. The 3D semiconductor memory device as claimed in claim 17, wherein:
the lower semiconductor pattern is formed of silicon; and
the incline-surfaces are {111} crystal planes of the silicon.

21. The 3D semiconductor memory device as claimed in claim 17, further comprising a horizontal insulator between the lower gate pattern and the lower semiconductor pattern, the horizontal insulator extending onto a top surface and a bottom surface of the lower gate pattern.

22. The 3D semiconductor memory device as claimed in claim 17, further comprising:
upper gate patterns stacked on the lower gate pattern;
an upper semiconductor pattern penetrating the upper gate patterns and being connected to the lower semiconductor pattern; and
a vertical insulator between the upper semiconductor pattern and the upper gate patterns.

23. The 3D semiconductor memory device as claimed in claim 22, wherein a minimum width of the lower semiconductor pattern is less than a lower width of the upper semiconductor pattern.

24. The 3D semiconductor memory device as claimed in claim 22, wherein a maximum width of the lower semiconductor pattern is greater than a maximum width of the upper semiconductor pattern.

25. The 3D semiconductor memory device as claimed in claim 22, wherein a horizontal width of the lower gate pattern is greater than a horizontal width of each of the upper gate patterns.

* * * * *